United States Patent
Ando et al.

(10) Patent No.: US 8,674,407 B2
(45) Date of Patent: Mar. 18, 2014

(54) SEMICONDUCTOR DEVICE USING A GROUP III NITRIDE-BASED SEMICONDUCTOR

(75) Inventors: Yuji Ando, Tokyo (JP); Yasuhiro Okamoto, Tokyo (JP); Kazuki Ota, Tokyo (JP); Takashi Inoue, Tokyo (JP); Tatsuo Nakayama, Tokyo (JP); Hironobu Miyamoto, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 242 days.

(21) Appl. No.: 12/919,640

(22) PCT Filed: Mar. 12, 2009

(86) PCT No.: PCT/JP2009/054755
§ 371 (c)(1),
(2), (4) Date: Oct. 4, 2010

(87) PCT Pub. No.: WO2009/113612
PCT Pub. Date: Sep. 17, 2009

(65) Prior Publication Data
US 2011/0006346 A1 Jan. 13, 2011

(30) Foreign Application Priority Data

Mar. 12, 2008 (JP) ................................. 2008-062510

(51) Int. Cl.
*H01L 29/66* (2006.01)
(52) U.S. Cl.
USPC ........... 257/192; 257/190; 257/191; 257/194; 257/288; 257/289; 257/E21.403; 257/E21.407; 257/E29.246; 257/E29.248; 257/E29.249
(58) Field of Classification Search
USPC ................ 257/192, 194, 288, 289, 190, 191, 257/E21.403, E21.407, E29.246, E29.248, 257/E29.249
See application file for complete search history.

(56) References Cited

U.S. PATENT DOCUMENTS 7,491,626 B2 * 2/2009 Gaska et al. .................. 438/483
7,948,011 B2 * 5/2011 Rajan et al. ................... 257/194
(Continued)

FOREIGN PATENT DOCUMENTS

JP 11-261052 A 9/1999
JP 2000252458 A 9/2000
(Continued)

OTHER PUBLICATIONS

Kuraguchi et al., "Normally-off GaN-MISFET with well-controlled threshold voltage", Phys. Stat. Sol. (a) 204 (2007) pp. 2010-2013.*

(Continued)

*Primary Examiner* — Jay C Kim
(74) *Attorney, Agent, or Firm* — McGinn IP Law Group, PLLC

(57) ABSTRACT

The present invention provides a semiconductor device having such a structure formed by sequentially laminating a lower barrier layer composed of lattice-relaxed $Al_xGa_{1-x}N$ ($0 \leq x \leq 1$), a channel layer composed of $In_yGa_{1-y}N$ ($0 \leq y \leq 1$) with compressive strain and a contact layer composed of $Al_zGa_{1-z}N$ ($0 \leq z \leq 1$), wherein a two-dimensional electron gas is produced in the vicinity of an interface of said $In_yGa_{1-y}N$ channel layer with said $Al_zGa_{1-z}N$ contact layer; a gate electrode is formed so as to be embedded in the recessed portion with intervention of an insulating film, which recessed portion is formed by removing a part of said $Al_zGa_{1-z}N$ contact layer by etching it away until said $In_yGa_{1-y}N$ channel layer is exposed; and, ohmic electrodes are formed on the $Al_zGa_{1-z}N$ contact layer. Thus, the semiconductor device has superior uniformity and reproducibility of the threshold voltage while maintaining a low gate leakage current, and is also applicable to the enhancement mode type.

12 Claims, 13 Drawing Sheets

65: SiN insulating film
62: n-type AlGaN lower barrier layer
61: Buffer layer
60: (0001) SiC substrate
63: GaN channel layer
64: n-type AlGaN contact layer
67: two-dimentional electron gas

(56) References Cited

U.S. PATENT DOCUMENTS

2007/0272945 A1 11/2007 Matsuo et al.
2009/0045438 A1* 2/2009 Inoue et al. .................. 257/192

FOREIGN PATENT DOCUMENTS

| JP | 2000294768 A | 10/2000 |
| JP | 2001085670 A | 3/2001 |
| JP | 2004335960 A | 11/2004 |
| JP | 2007165719 A | 6/2007 |
| JP | 2007311733 A | 11/2007 |
| JP | 2008010803 A | 1/2008 |

OTHER PUBLICATIONS

O. Aktas et al., "Microwave Performance of AlGaN/GaN Inverted MODFET's" IEEE Electron Device Letters, vol. 18, No. 6, Jun. 1997, pp. 293-295.

Ching-Ting Lee, et al., "GaN MOS Device Using $SiO_2$—$Ga_2O_3$ Insulator Grown by Photoelectrochemical Oxidation Method", IEEE Electron Device Letters, vol. 24, No. 2, Feb. 2003, pp. 54-56.

Chinese Office Action for CN200980108747.6 issued Oct. 10, 2011.

* cited by examiner

53: GaN channel layer
54: n-type AlGaN contact layer
57: two-dimensional electron gas 63: GaN channel layer
64: n-type AlGaN contact layer
67: two-dimentional electron gas 107: two-dimensional electron gas

US 8,674,407 B2

SEMICONDUCTOR DEVICE USING A GROUP III NITRIDE-BASED SEMICONDUCTOR

This application is the National Phase of PCT/JP2009/054755, filed Mar. 12, 2009, which claims the benefit of priority based on Japanese Patent Application No. 2008-62510 filed in Japan on Mar. 12, 2008, of which entirety is incorporated herein by reference.

TECHNICAL FIELD

The present invention relates to a semiconductor device comprising a group III nitride-based semiconductor as a main material. Among group III nitride-based semiconductor devices, the present invention, in particular, relates to a structure of a group III nitride-based field effect transistor that has superior uniformity and reproducibility of a threshold voltage while maintaining a low gate leakage current and high electron mobility, and is also capable of operation in enhancement mode.

BACKGROUND ART

FIG. 10 is a cross-sectional view schematically showing a structure of a field effect transistor type semiconductor device according to related art using a group III nitride-based semiconductor. Such a field effect transistor type semiconductor device has been reported, for example, by Imanaga et al. (see Patent Document 1).

The field effect transistor type semiconductor device shown in FIG. 10 comprises, for example, constitutions described below. A substrate 100 is a substrate having a (0001) plane, i.e. a C-plane, a buffer layer 101 is made of undoped gallium nitride (GaN) or aluminum gallium nitride (AlGaN), an electron supply layer 102 is made of N-type aluminum gallium nitride ($Al_{x10}Ga_{1-x10}N$), a channel layer 103 is made of gallium nitride (GaN), and an insulating layer 104 is made of undoped aluminum nitride (AlN). On the insulating layer 104, a source electrode 10S and a drain electrode 10D are formed, and are in ohmic contact therewith. On the insulating layer 104, a gate electrode 10G is formed in a region between the source electrode 10S and the drain electrode 10D, and is in schottky contact therewith. An interface between the channel layer 103 and the electron supply layer 102 is a heterojunction interface of GaN/AlGaN, and an interface between the insulating layer 104 and the channel layer 103 is also a heterojunction interface of AlN/GaN. A semiconductor device in which both an upper and lower interfaces of the channel layer 103 are formed of a heterojunction interface like that of such AlN/GaN/AlGaN is referred to as a semiconductor device having a double heterostructure.

FIG. 11 is a cross-sectional view schematically showing band diagram of a conduction band in the region directly beneath the gate electrode 10G, in the field effect transistor type semiconductor device having a double heterostructure illustrated in FIG. 10. There are differences (band discontinuities) ΔEc(AlGaN/GaN) and ΔEc(AlN/GaN) in conduction band edge energy Ec between GaN and AlGaN, and between GaN and AlN, respectively. Amounts of the band discontinuities are set as ΔEc(AlN/GaN)>ΔEc(AlGaN/GaN). In the double heterostructure, a two-dimensional electron gas 107 is produced in the vicinity of the interface of the GaN channel layer 103 with the AlGaN electron supply layer 102 and in the vicinity of the interface of the GaN channel layer 103 with the AlN insulating layer 104. In the structure shown in FIG. 10, a band gap Eg(AlN) of AlN composing the insulating layer 104 is large, compared with a band gap Eg(GaN) of GaN, and thereby, a schottky barrier $\Phi_B$ is increased. Accordingly, there is provided such advantage that the forward gate breakdown voltage of the field effect transistor type semiconductor device is improved thereby.

Examples of a field effect transistor type semiconductor device having a double heterostructure have been reported as described below.

Imanaga et al. also have reported such a field effect transistor type semiconductor device having a double heterostructure which adopts a laminated structure of an AlN layer and a silicon dioxide ($SiO_2$) layer as an insulating layer, instead of an AlN insulating layer (see Patent Document 2).

Yosida has reported a semiconductor device having a double heterostructure of AlGaN/GaN/AlGaN in which an AlN insulating layer is replaced with undoped AlGaN (see Patent Document 3). O. Aktas et al. also describe a semiconductor device having a double heterostructure of AlGaN/GaN/AlGaN in which an AlN insulating layer is replaced with undoped AlGaN (see Non-Patent Document 1).

Further, examples of a group III nitride-based semiconductor device employing a structure in which an insulating film is inserted between a gate electrode and a semiconductor layer have been reported as described below.

Matuo et al. have reported a semiconductor device in which a silicon nitride (SiN) insulating film is provided on a double heterostructure of GaN/N-type AlGaN/GaN (see Patent Document 4).

Further, Ching-Ting Lee et al. have reported a semiconductor device having a Metal-Insulator-Semiconductor (MIS) structure in which an insulating film having a laminated structure of gallium oxide ($Ga_2O_3$) and $SiO_2$ is formed on an n-type GaN channel layer (see Non-Patent Document 2).

Patent Document 1: JP2000-294768 A
Patent Document 2: JP2000-252458 A
Patent Document 3: JP11-261052 A
Patent Document 4: JP2004-335960 A
Non-Patent Document 1: O. Aktas et al., IEEE Electron Device Letters, Vol. 18, No. 6, pp. 293-295, June 1997
Non-Patent Document 2: Ching-Ting Lee et al., IEEE Electron Device Letters, Vol. 24, No. 2, pp. 54-56, February 2003

DISCLOSURE OF THE INVENTION

Problems to be Solved by the Invention

In the field effect transistor type semiconductor device using a group III nitride-based semiconductor illustrated in FIG. 10, employing the AlN insulating layer 104 provides a band diagram of a conduction band in the region directly beneath the gate electrode 10G as shown in FIG. 11. Due to polarization effect of AlN composing this insulating layer 104, polarization charges are produced in the interface between the GaN channel layer 103 and the AlN insulating layer 104. Due to the polarization charges produced in this interface, a large electric field is formed inside the AlN insulating layer 104. Further, in addition to supply of carriers (electrons) from the AlGaN electron supply layer 102, supply of carriers (electrons) from the AlN insulating layer 104 is also caused by the polarization effect of AlN. As a result, it is difficult to achieve a device operation in enhancement mode. In addition, uniformity and reproducibility of a threshold voltage $V_T$ is largely lowered because of dispersion of a film thickness of the AlN insulating layer 104. That is, the field effect transistor type semiconductor device employing the AlN insulating layer 104 illustrated in FIG. 10 has two structural limitations: it is difficult to achieve a device operation in enhancement mode, and uniformity and reproducibility of the threshold voltage $V_T$ is largely lowered because of dispersion of the film thickness of the AlN insulating layer 104.

Polarization effect of AlN composing the insulating layer 104, which causes the two structural limitations described above, will be described in detail below.

In the field effect transistor type semiconductor device illustrated in FIG. 10, on a (0001) plane, i.e. a C-plane of a substrate, a group III nitride-based semiconductor layer is C-axis ((0001) axis) grown. A buffer layer 101 is providers to make the AlGaN electron supply layer 102 grown on the (0001) plane in lattice-relaxed form. On the one hand, the GaN channel layer 103 and the AlN insulating layer 104 epitaxially grown on the AlGaN electron supply layer 102 are not lattice-relaxed because they have a thin film thickness. Therefore, their lattice constant a becomes substantially equal to a lattice constant a(AlGaN) of the underlying AlGaN electron supply layer 102. Each of the GaN channel layer 103 and the AlN insulating layer 104 is a layer with a strained lattice.

Accordingly, compressive strain $e_{ZZ}$ (GaN)≈{a(Al$_{x10}$Ga$_{1-x10}$N)–a(GaN)}/a(GaN) is produced in the GaN channel layer 103 because of a difference between a lattice constant a(GaN) of GaN and a lattice constant a(Al$_{x10}$Ga$_{1-x10}$N) of (Al$_{x10}$Ga$_{1-x10}$N). Tensile strain $e_{ZZ}$(AlN)≈{a(Al$_{x10}$Ga$_{1-x10}$N)–a(AlN)}/a(AlN) is produced in the AlN insulating layer 104 because of a difference between the lattice constant a(AlN) of AlN and the lattice constant a(Al$_{x10}$Ga$_{1-x10}$N) of (Al$_{x10}$Ga$_{1-x10}$N).

Piezo polarization $P_{pe102}$ is not produced ($P_{pe102}$=0) because stress causing strain does not exist in the AlGaN electron supply layer 102 C-axis grown, but spontaneous polarization $P_{sp102}$=$P_{sp}$(AlGaN) exists. Polarization $P_{102}$ in the AlGaN electron supply layer 102 is generally expressed by $P_{102}$=$P_{pe102}$+$P_{sp102}$, and $P_{pe102}$=0 results in $P_{102}$=$P_{sp102}$. The direction of this spontaneous polarization $P_{sp104}$ is oriented from the front surface toward the substrate.

Spontaneous polarization $P_{sp103}$=$P_{sp}$(GaN) exists also in the GaN channel layer 103 in the direction from the front surface toward the substrate. Further, in the GaN channel layer 103, piezo polarization $P_{pe102}$ is produced in the direction in which the spontaneous polarization $P_{sp103}$ is set off because compressive strain exists. Consequently, polarization $P_{103}$ in the GaN channel layer 103 is $P_{103}$=$P_{pe103}$+$P_{sp103}$<$P_{sp}$(GaN).

Spontaneous polarization $P_{sp104}$=$P_{sp}$(AlN) exists also in the AlN insulating layer 104 in the direction from the front surface toward the substrate. Further, in the AlN insulating layer 104, piezo polarization $P_{pe103}$ is produced in the same direction as that of the spontaneous polarization $P_{sp104}$ because compressive strain is produced. Consequently, polarization $P_{104}$ in the AlN insulating layer 104 is $P_{104}$=$P_{pe104}$+$P_{sp104}$>$P_{sp}$(AlN).

Accordingly, each of the polarization $P_{102}$ in the AlGaN electron supply layer 102, the polarization $P_{103}$ in the GaN channel layer 103 and the polarization $P_{104}$ in the AlN insulating layer 104 depends on an Al composition ($x_{10}$) of Al$_{x10}$Ga$_{1-x10}$N composing the electron supply layer 102. For example, in the case of $x_{10}$=0.1, estimated by calculation is $P_{102}$/q=2.13×10$^{13}$ cm$^{-2}$, $P_{103}$/q=1.61×10$^{13}$ cm$^{-2}$ and $P_{104}$/q=7.90×10$^{13}$ cm$^{-2}$, where q=1.6×10$^{-19}$ C is the elementary charge.

In a heterojunction interface between the GaN channel layer 103 and the AlGaN electron supply layer 102, polarization P changes from $P_{103}$ to $P_{102}$ in the discontinuous manner ($P_{103}$–$P_{102}$). Consequently, in this interface, interfacial charges $\sigma_{103}$ are produced due to polarization effect. Density of the interfacial charges $\sigma_{103}$/q is $\sigma_{103}$/q=($P_{103}$–$P_{102}$)/q.

Further, also in a heterojunction interface between the AlN insulating layer 104 and the GaN channel layer 103, polarization P changes from $P_{104}$ to $P_{103}$ in the discontinuous manner ($P_{104}$–$P_{103}$). Consequently, in this interface, interfacial charges $\sigma_{104}$ are produced due to polarization effect. Density of the interfacial charges $\sigma_{104}$/q is $\sigma_{104}$/q=($P_{104}$–$P_{103}$)/q.

For example, in the case of $x_{10}$=0.1, the density of the interfacial charges $\sigma_{103}$/q and the density of the interfacial charges $\sigma_{104}$/q are estimated as $\sigma_{103}$/q=($P_{103}$–$P_{102}$)/q=–5.28×10$^{12}$ cm$^{-2}$ and $\sigma_{104}$/q=($P_{104}$–$P_{103}$)/q=+6.29×10$^{13}$ cm$^{-2}$, respectively. In the interface between the GaN channel layer 103 and the AlGaN electron supply layer 102, negative interfacial charges $\sigma_{103}$ are produced, and in the interface between the AlN insulating layer 104 and the GaN channel layer 103, positive interfacial charges $\sigma_{104}$ are produced, respectively, and the sum ($\sigma_{103}$+$\sigma_{104}$) becomes ($\sigma_{103}$+$\sigma_{104}$)/q>0. Accordingly, even if the shallow n-type impurity (donor) is not doped in the AlGaN electron supply layer 102, electrons are supplied to the GaN channel layer 103 with sheet density corresponding to ($\sigma_{103}$+$\sigma_{104}$)/q. The supplied electrons are accumulated in the GaN channel layer 103 at least in the vicinity of the interface with the AlGaN electron supply layer 102, producing the two-dimensional electron gas 107. Consequently, the field effect transistor type semiconductor device functions as a semiconductor device of the depletion mode type.

For the field effect transistor type semiconductor device shown in FIG. 10, the Poisson equation is solved with a film thickness $t_{AlN}$ of the AlN insulating layer 104 being differently varied, thereby the threshold voltage $V_T$ is estimated at each film thickness $t_{AlN}$. FIG. 12 is a graph showing the threshold voltage $V_T$ estimated at each film thickness $t_{AlN}$ of the AlN insulating layer 104. The result of estimation by calculation about dependency of the threshold voltage $V_T$ on the film thickness $t_{AlN}$ of the AlN insulating layer 104 is shown in FIG. 12 for such a case where concentration $N_{SD102}$ of the shallow n-type impurity (donor) is selected at $N_{SD102}$0 cm$^{-3}$, and $N_{SD102}$=2×10$^{18}$ cm$^{-3}$, respectively. Note that for the estimation by calculation shown in FIG. 12, the following conditions (parameters) shown in Table 1-1 are used.

TABLE 1-1

| | |
|---|---:|
| schottky barrier $\Phi_B$ in AlN insulating layer 104 | 2.14 eV |
| band discontinuity $\Delta E_C$ (AlGaN/GaN) | 0.196 eV |
| band discontinuity $\Delta E_C$ (AlN/GaN) | 1.96 eV |
| film thickness of undoped Al$_{0.1}$Ga$_{0.9}$N buffer layer 101 | 1 µm |
| film thickness of Al$_{0.1}$Ga$_{0.9}$N electron supply layer 102 | 50 nm |
| film thickness of undoped GaN channel layer 103 | 30 nm |
| film thickness of undoped AlN insulating layer 104 | 0.1 to 10 nm |

Referring to FIG. 12, an internal electric field of the AlN insulating layer 104 reaches 10 MV/cm. Consequently, the threshold voltage $V_T$ shifts by 1 V according to a change of 1 nm in the film thickness $t_{AlN}$ of the AlN insulating layer 104. That is, it is confirmed that uniformity and reproducibility of the threshold voltage $V_T$ is largely lowered due to dispersion of the film thickness $t_{AlN}$ of the AlN insulating layer 104.

Further, to set the threshold voltage $V_T$ to be $V_T$≥0 V, it is estimated that the film thickness $t_{AlN}$ of the AlN insulating layer 104 has to be selected within the range of $t_{AlN}$≤1 nm. Taking into consideration uniformity and reproducibility of the film thickness $t_{AlN}$ of the AlN insulating layer 104, it is concluded that it is technically difficult to accurately control the film thickness $t_{AlN}$ within the range of $t_{AlN}$≤1 nm. On the one hand, in terms of the advantage of using the AlN insulating layer 104, such as improvement of gate breakdown voltage, it is concluded that it is difficult to secure the advantage within the range of $t_{AlN} \leq 1$ nm. There is also assumed such a problem that in the case when selected within the range of $t_{AlN} \leq 1$ nm, because the internal electric field of the AlN insulating layer 104 is large, a tunnel current component may be increased when reverse bias is applied thereto, resulting in an increased gate leakage current.

In addition, a problem also arises that because the structure shown in FIG. 10 is a planar structure, carriers to be present in the regions between a source and a gate, and between a gate and a channel will be depleted, resulting in increased access resistance, even if operation in enhancement mode is achieved, Regarding a field effect transistor type semiconductor device having a double heterostructure, examples have been reported as follows.

Imanaga et al. have reported also a field effect transistor type semiconductor device having a double heterostructure which employs a laminated structure of an AlN layer and a silicon dioxide ($SiO_2$) layer as an insulating layer, instead of an AlN insulating layer (sec Patent Document 2).

In particular, instead of the structure of AlN insulating layer/GaN channel layer/N-type AlGaN electron supply layer, a structure of $SiO_2$ insulating layer/AlN insulating layer/GaN channel layer/N-type AlGaN electron supply layer is employed. Also in this structure, because the AlN insulating layer has polarization effect, positive interfacial charges are produced in an interface of AlN insulating layer/GaN channel layer, and negative interfacial charges are produced in an interface of GaN channel layer/N-type AlGaN electron supply layer. Accordingly, an internal electric field present in a region of $SiO_2$ insulating layer/AlN insulating layer is similarly large. In such a case, similarly, uniformity and reproducibility of the threshold voltage $V_T$ is largely lowered due to dispersion of the film thickness $t_{SiO2}$ of the $SiO_2$ insulating layer and the film thickness $t_{AlN}$ of the AlN insulating layer. After all, in the case if the operation in enhancement mode is achieved, because of the planar structure, channel resistance between a source and a gate, and between a gate and a channel will be similarly increased.

Regarding a gate leakage current at the reverse bias, a tunnel current component is suppressed by using the $SiO_2$ insulating layer and the AlN insulating layer, in comparison with that of the devise using the AlN insulating layer.

Yosida has reported a semiconductor device having a double heterostructure of AlGaN/GaN/AlGaN in which an AlN insulating layer is replaced with undoped AlGaN (see Patent Document 3).

In particular, instead of the structure of AlN insulating layer/GaN channel layer/N-type AlGaN electron supply layer, a structure of AlGaN insulating layer/GaN channel layer/N-type AlGaN electron supply layer is employed. Also in this structure, because the AlGaN insulating layer has polarization effect, positive interfacial charges are produced in an interface of AlGaN insulating layer/GaN channel layer, and negative interfacial charges are produced in an interface of GaN channel layer/N-type AlGaN electron supply layer. An internal electric field present in the AlGaN insulating layer is lowered, compared with an internal electric field present in the AlN insulating layer. However, when an Al composition of AlGaN composing the AlGaN insulating layer is large, its internal electric field still remains at a high level. In such a case, uniformity and reproducibility of the threshold voltage $V_T$ is, similarly, largely lowered due to dispersion of a film thickness $t_{AlGaN}$ of the AlGaN insulating layer. After all, in the case if the operation in enhancement mode is achieved, channel resistance between a source and a gate, and between a gate and a channel will be similarly increased. Note that an N-type contact layer is provided thereon to lower contact resistance between the ohmic electrode and the channel layer.

O. Aktas et al. also have reported a semiconductor device having a double heterostructure of AlGaN/GaN/AlGaN in which an AlN insulating layer is replaced with undoped AlGaN (see Non-Patent Document 1).

In particular, instead of the structure of AlN insulating layer/GaN channel layer/N-type AlGaN electron supply layer, a structure of AlGaN insulating layer/GaN channel layer/AlGaN spacer layer/N-type AlGaN electron supply layer is employed. Also in this structure, because the AlGaN insulating layer has polarization effect, positive interfacial charges are produced in an interface of AlGaN insulating layer/GaN channel layer, and negative interfacial charges are produced in an interface of GaN channel layer/N-type AlGaN electron supply layer. An internal electric field present in the AlGaN insulating layer is lowered, compared with an internal electric field present in the AlN insulating layer. However, when an Al composition of AlGaN composing the AlGaN insulating layer is large, its internal electric field still remains at a high level. In such a case, similarly, uniformity and reproducibility of the threshold voltage $V_T$ is largely lowered due to dispersion of a film thickness $t_{AlGaN}$ of the AlGaN insulating layer. After all, in the case if the operation in enhancement mode is achieved, channel resistance between a source and a gate, and between a gate and a channel will be similarly increased.

Further, examples of a group III nitride-based semiconductor device employing a structure in which an insulating film is inserted between a gate electrode and a semiconductor layer have been reported as following.

Matuo et al. have reported a semiconductor device in which a silicon nitride (SiN) insulating layer is provided on a double heterostructure of GaN/N-type AlGaN/GaN (see Patent Document 4).

In particular, a structure of GaN stress-relaxed layer/N-type AlGaN channel layer/GaN buffer layer is employed. In this structure, such a condition that positive interfacial charges produced in an interface of N-type AlGaN channel layer/GaN buffer layer and negative interfacial charges produced in an interface of GaN stress-relaxed layer/N-type AlGaN channel layer are set off with each other. With use of the setoff effect, a field effect transistor of the enhancement mode type is constructed.

FIG. 13 shows, in the semiconductor device employing this structure of GaN stress-relaxed layer/N-type AlGaN channel layer/GaN buffer layer, the result of estimating the threshold voltage $V_T$ at each film thickness $t_{SiN}$ of the SiN insulating layer by solving the Poisson equation with the film thickness $t_{SiN}$ being differently varied. Also, the result of estimation by calculation about dependency of the threshold voltage $V_T$ on the film thickness $t_{SiN}$ of the SiN insulating layer is shown in FIG. 13 for such a case where concentration $N_d$ of a shallow n-type impurity (donor) in the N-type AlGaN channel layer and its film thickness t are varied. Note that for the estimation by calculation shown in FIG. 13, the following conditions (parameters) shown in Table 1-2 are used.

TABLE 1-2

| | |
|---|---|
| barrier $\Phi_B$ on the front surface of SiN insulating layer | 2.9 eV |
| band discontinuity $\Delta E_C$ (AlGaN/GaN) | 0.392 eV |

TABLE 1-2-continued

| | |
|---|---|
| $\Delta E_C$ (SiN/GaN) in interface of SiN/GaN | 2.5 eV |
| film thickness of undoped GaN buffer layer | 1 µm |
| film thickness of $Al_{0.2}Ga_{0.8}N$ channel layer | 2 nm or 10 nm |
| film thickness of undoped GaN stress-relaxed layer | 10 nm |
| film thickness of SiN insulating layer | 0.1 to 100 nm |

Referring to FIG. 13, the dependency of the threshold voltage $V_T$ on the SiN film thickness is relatively small, and degradation in uniformity and reproducibility of the threshold voltage $V_T$ due to dispersion of the film thickness of the SiN insulating layer is significantly improved. The range $(t \times N_d)$ of the concentration $N_d$ of the shallow n-type impurity (donor) in the N-type AlGaN channel layer and its film thickness t in which the threshold voltage $V_T$ becomes positive ($V_T \geq 0$ V) is as very narrow as $(t \times N_d) \leq (2 \text{ nm}) \times (5 \times 10^{17} \text{ cm}^{-3})$. That is, said limitation has to be met because at least a portion of GaN stress-relaxed layer/N-type AlGaN channel layer needs to be depleted.

In epitaxial growth, even under an undoped condition, there is not a rare case where residual donor concentration of about $1 \times 10^{17}$ cm$^{-1}$ may exist. Taking this point into consideration, a problem arises that a process margin is insufficient to stably produce a field effect transistor of the enhancement mode type.

In addition, in the case when operation in the enhancement mode is achieved, sheet density of carriers present in a region of GaN stress-relaxed layer/N-type AlGaN channel layer/GaN buffer layer between a source and a gate, and between a gate and a channel is as low as $(t \times N_d)$. Accordingly, because $(t \times N_d)$ is set within a relatively narrow range mentioned above, parasitic resistance for operation in the enhancement mode will be in the range of a relatively high level.

Further, Ching-Ting Lee et al. have reported a semiconductor device having a Metal-Insulator-Semiconductor (MIS) structure in which an insulating film having a laminated structure of gallium oxide ($Ga_2O_3$) and $SiO_2$ is formed on an n-type GaN channel layer (see Non-Patent Document 2).

In particular, a structure of $SiO_2$ insulating film/$Ga_2O_3$ photochemical oxide film/n-type GaN layer is employed. The $Ga_2O_3$ photochemical oxide film is formed by photochemical oxidation treatment for a front surface of the n-type GaN layer. $SiO_2$ and $Ga_2O_3$ do not have polarization effect. Accordingly, a gate portion similar to the MOS structure is made up.

This MOS structure has such advantage that band gaps of $SiO_2$ and $Ga_2O_3$ composing the insulating film are large, thereby a schottky barrier height is increased, resulting in improved gate breakdown voltage at forward bias condition. Also, the insulating film does not produce polarization, and uniformity and reproducibility of the threshold voltage $V_T$ is good.

However, in the MOS structure, a channel region is made of the n-type GaN layer, and its electron mobility depends on scattering of an ionized impurity (donor) present in the n-type GaN layer. For example, if concentration of electrons in the n-type GaN layer is $3.22 \times 10^{17}$ cm$^{-3}$, hall mobility of electrons is reported as 350 cm$^2$/V$_s$. On the one hand, when using a heterojunction of N-type AlGaN/GaN, a so-called selective doped structure is formed, and then a typical value of electron mobility is 1000-2000 cm$^2$/V$_s$ in a two-dimensional electron gas produced in this heterojunction interface. Accordingly, in the MOS structure of $SiO_2$ insulating film/$Ga_2O_3$ photochemical oxide film/n-type GaN layer, the electron mobility is decreased to a considerably lower value than that in the two-dimensional electron gas in the selective doped structure because of scattering of the ionized impurity (donor) present in the n-type GaN layer.

In the MOS structure of $SiO_2$ insulating film/$Ga_2O_3$ photochemical oxide film/n-type GaN layer, it is thought that for a film thickness t of the n-type GaN layer and the concentration $N_d$ of a shallow n-type impurity (donor), the operation in enhancement mode can be achieved by reducing $(t \times N_d)$. On the one hand, in the case if $(t \times N_d)$ is reduced, there arises a problem that access resistance is increased at the operation in enhancement mode.

Further, if at the operation in enhancement mode, a large forward bias is applied to a gate electrode, thereby electrons are accumulated in the interface of $Ga_2O_3$ photochemical oxide film/n-type GaN layer, then electron mobility in this interface is affected by the following scattering mechanism. That is, in addition to the impurity scattering of an ionized impurity (donor) present in the n-type GaN layer, interface scattering due to roughness on the interface of $Ga_2O_3$ photochemical oxide film/n-type GaN layer will be a factor of limiting the electron mobility in this interface.

When the structure capable of the enhancement operation is selected for the conventional field effect transistor type semiconductor devices using the group III nitride-based semiconductor described above, the resulted device by no means satisfies all performances such that uniformity and reproducibility of the threshold voltage $V_T$ can be increased, simultaneously the electron mobility can be made high in the channel region, the schottky barrier can be heightened, and the forward gate breakdown voltage can be improved.

The present invention aims to solve the problems mentioned above. An object of the present invention is to provide a semiconductor device that has a high schottky barrier, improved forward gate breakdown voltage, high electron mobility in a channel region, and superior uniformity and reproducibility of the threshold voltage $V_T$ when the present invention is applied to a field effect transistor type semiconductor device using a group III nitride-based semiconductor. Particularly, an object of the present invention is to provide a semiconductor device using a group III nitride-based semiconductor which can be applied to a field effect transistor type semiconductor device capable of operation in the enhancement mode and in which a more stable operation in the enhancement mode can be achieved and increase in channel resistance between a source and a gate, and between a gate and a drain can be suppressed in the case when the operation in the enhancement mode is achieved.

Means for Solving the Problems

To achieve said objects, in the present invention, a semiconductor device using a group III nitride-based semiconductor employs the following structure. For instance, when the present invention is applied to a field effect transistor type semiconductor device using a group III nitride-based semiconductor, the following constitutions are employed to achieve said objects.

First, in a channel region directly beneath a gate electrode, such a structure that the gate electrode is provided on a front surface of a channel layer composed of $In_yGa_{1-y}N$ (0≤y≤1) with intervention of an insulating film composed of polycrystalline or amorphous substances is employed to heighten a schottky barrier, and thereby, its forward gate breakdown voltage is improved. Also, a lower barrier layer composed of lattice-relaxed $Al_xGa_{1-x}N$ (0≤y≤1) is provided under the $In_yGa_{1-y}N$ channel layer as its underlying layer, whereby, such a condition is achieved in which an interface between the In$_y$Ga$_{1-y}$N channel layer and the Al$_x$Ga$_{1-x}$N lower barrier layer is set to function as a barrier against carriers (electrons).

On the one hand, in a region located between a source and a gate, and between a gate and a drain, with the exception of the channel region directly beneath the gate electrode, a contact layer composed of Al$_z$Ga$_{1-z}$N (0≤z≤1) is provided as an upper layer of the In$_y$Ga$_{1-y}$N channel layer. In such a case, such a condition that a heterojunction interface between the Al$_z$Ga$_{1-z}$N contact layer and the In$_y$Ga$_{1-y}$N channel layer is set to also function as a barrier against carriers (electrons) is attained. Ohmic electrodes used as a source electrode and a drain electrode are formed on the Al$_z$Ga$_{1-z}$N contact layer. As a result, in the region located between the source and the gate, and between the gate and the drain, a double heterostructure of Al$_z$Ga$_{1-z}$N contact layer/In$_y$Ga$_{1-y}$N channel layer/Al$_x$Ga$_{1-x}$N lower barrier layer is constructed, and thus, carriers (electrons) are accumulated in the In$_y$Ga$_{1-y}$N channel layer. In such a case, carriers (electrons) accumulated at least in the vicinity of the heterojunction interface of the Al$_z$Ga$_{1-z}$N contact layer and the In$_y$Ga$_{1-y}$N channel layer are set to produce a two-dimensional electron gas.

On the one hand, by appropriately selecting a film thickness of the In$_y$Ga$_{1-y}$N channel layer, a film thickness of the Al$_x$Ga$_{1-x}$N lower barrier layer and concentration of a shallow n-type impurity (donor) doped therein, such a condition that carriers (electrons) are not accumulated in the In$_y$Ga$_{1-y}$N channel layer in the channel region directly beneath the gate electrode when a gate voltage $V_G$ is set at $V_G=0$ can be achieved. That is, a threshold voltage $V_T$ can be set within the range of $V_T>0$, and thus, the operation in enhancement mode can be achieved.

Therefore, the semiconductor device according to the present invention is:

a semiconductor device using a group III nitride-based semiconductor, characterized in that:

the semiconductor device comprising a double heterostructure which is constructed by sequentially laminating an Al$_x$Ga$_{1-x}$N lower barrier layer composed of lattice-relaxed Al$_x$Ga$_{1-x}$N (0≤y≤1), an In$_y$Ga$_{1-y}$N channel layer composed of In$_y$Ga$_{1-y}$N (0≤y≤1) with compressive strain, and an Al$_z$Ga$_{1-z}$N contact layer composed of Al$_z$Ga$_{1-z}$N (0≤z≤1), wherein a two-dimensional electron gas is produced in the vicinity of an interface of the In$_y$Ga$_{1-y}$N channel layer with the Al$_z$Ga$_{1-z}$N contact layer, at least two ohmic electrodes are formed as a source electrode and a drain electrode on the Al$_z$Ga$_{1-z}$N contact layer, a gate electrode is provided in a region located between the source electrode and the drain electrode, and thereby, the semiconductor device comprises a structure composed of the gate electrode, the source electrode and the drain electrode, which can constitute a field effect transistor, a recessed portion is provided in the region located between the source electrode and the drain electrode by removing a part of said Al$_z$Ga$_{1-z}$N contact layer by etching it away until said In$_y$Ga$_{1-y}$N channel layer is exposed, and said gate electrode is formed so as to be embedded in the recessed portion with intervention of an insulating film made of polycrystalline or amorphous substances.

Effects of the Invention

In the semiconductor device according to the present invention, as negative interfacial charges are produced in a heterojunction interface of the Al$_x$Ga$_{1-x}$N lower barrier layer and the In$_y$Ga$_{1-y}$N channel layer due to polarization effect, the range of a controllable threshold voltage $V_T$ is expanded by varying a film thickness of a insulating film and concentration of a shallow n-type impurity (donor) doped in the Al$_x$Ga$_{1-x}$N lower barrier layer. That is, by varying the film thickness of the insulating film and the concentration of the shallow n-type impurity (donor) doped in the Al$_x$Ga$_{1-x}$N lower barrier layer, either of a depiction mode with the threshold voltage $V_T$ of $V_T\leq0$ or an enhancement mode with the threshold voltage $V_T$ of $V_T>0$ can be selected as the operational mode of a field effect transistor to be fabricated.

In such a case, as, in a region other than the recessed portion, the two-dimensional electron is produced in a heterojunction interface of the Al$_z$Ga$_{1-z}$N contact layer and the In$_y$Ga$_{1-y}$N channel layer, increase in resistance between a source and a gate, and resistance between a gate and a drain is also largely suppressed. That is, such remarked increase in resistance between a source and a gate, and resistance between a gate and a drain, which is observed particularly in the case if the operation in enhancement mode is selected in the conventional device, can be avoided.

On the one hand, even though, in the channel region directly beneath the gate electrode, an MIS structure of gate electrode/insulating film/In$_y$Ga$_{1-y}$N channel layer is constructed, dependency of the threshold voltage $V_T$ on the film thickness of the insulating film is relatively small because any polarization electric field is not created in the insulating film itself. Accordingly, dispersion of the threshold voltage $V_T$ due to dispersion of the film thickness of the insulating film is suppressed, and thus, uniformity and reproducibility of the threshold voltage $V_T$ is improved. Also, by employing the MIS structure of gate electrode/insulating film/In$_y$Ga$_{1-y}$N channel layer, a contact potential difference (barrier height) of gate electrode/insulating film is increased, and a gate leakage current is also decreased. When a field effect transistor is constructed in such structure, in the channel region directly beneath the gate electrode, carriers (electrons) are accumulated at the ON state in the heterojunction interface of the Al$_x$Ga$_{1-x}$N lower barrier layer and the In$_y$Ga$_{1-y}$N channel layer, and thereby, the two-dimensional electron gas is produced. In such a case, the heterojunction interface of the Al$_x$Ga$_{1-x}$N lower barrier layer and the In$_y$Ga$_{1-y}$N channel layer may be constructed as a flat interface at the atomic level, and the In$_y$Ga$_{1-y}$N channel layer itself may be also undoped. Consequently, at the ON state, mobility of the two-dimensional electron gas produced in the channel region directly beneath the gate electrode can be improved.

The effects described above largely contribute to attainment of higher breakdown voltage and a lower loss in a semiconductor device.

Figure 1:
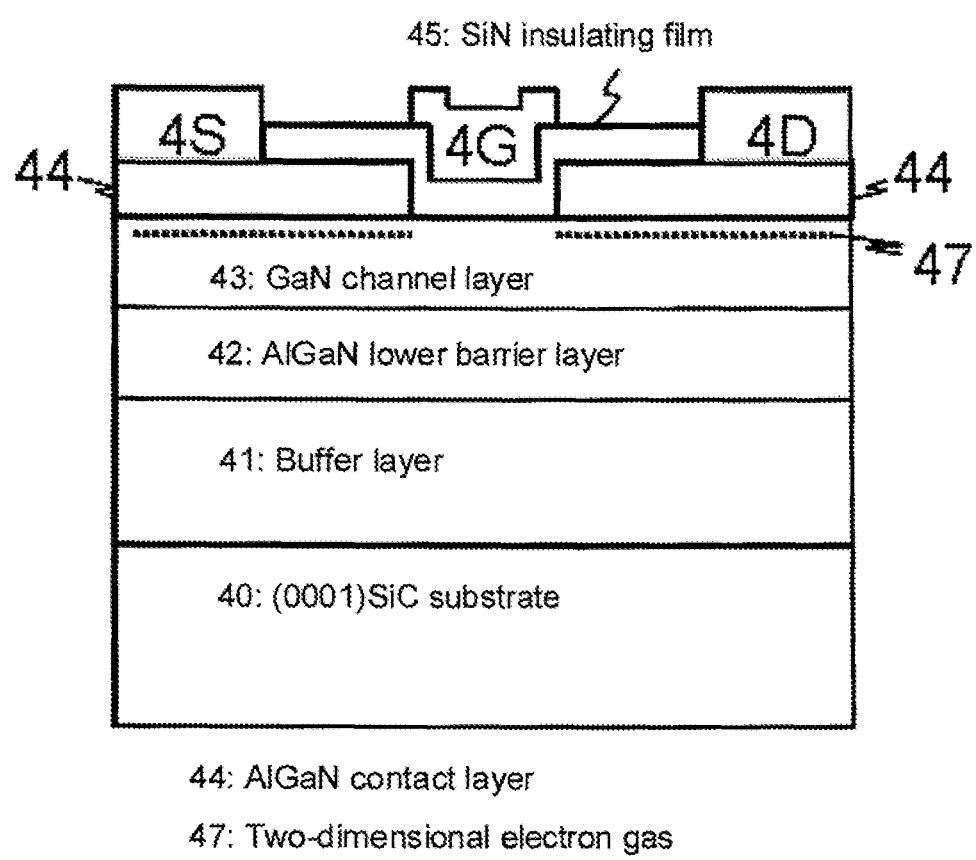
FIG. 1 is a cross-sectional view schematically showing a structure of a semiconductor device according to the first exemplary embodiment.

| Description of Symbols | |
|---|---|
| 40, 50, 60, 100 | substrate |
| 41, 51, 61, 101 | buffer layer |
| 42, 52, 62, 102 | AlGaN lower barrier layer |
| 43, 53, 63, 103 | GaN channel layer |
| 44, 54, 64 | AlGaN contact layer |
| 45, 55, 65 | SiN film |
| 47, 57, 67, 107 | two-dimensional electron gas |
| 4S, 5S, 6S, 10S | source electrode |
| 4D, 5D, 6D, 10D | drain electrode |
| 4G, 5G, 6G, 10G | gate electrode |
| 104 | AlN insulating layer |

BEST MODE FOR CARRYING OUT THE INVENTION

Hereafter, the semiconductor device according to the present invention will be explained in more detail.

The semiconductor device according to the present invention is:

a semiconductor device using a group III nitride-based semiconductor, characterized in that:

the semiconductor device comprising a double heterostructure which is constructed by sequentially laminating an $Al_xGa_{1-x}N$ lower barrier layer composed of lattice-relaxed $Al_xGa_{1-x}N$ ($0 \leq x \leq 1$), an $In_yGa_{1-y}N$ channel layer composed of $In_yGa_{1-y}N$ ($0 \leq y \leq 1$) with compressive strain, and an $Al_zGa_{1-z}N$ contact layer composed of $Al_zGa_{1-z}N$ ($0 \leq z \leq 1$), wherein a two-dimensional electron gas is produced in the vicinity of an interface of the $In_yGa_{1-y}N$ channel layer with the $Al_zGa_{1-z}N$ contact layer, at least two ohmic electrodes are formed as a source electrode and a drain electrode on the $Al_zGa_{1-z}N$ contact layer, a gate electrode is provided in a region located between the source electrode and the drain electrode, and thereby, the semiconductor device comprises a structure composed of the gate electrode, the source electrode and the drain electrode, which can constitute a field effect transistor, a recessed portion is provided in the region located between the source electrode and the drain electrode by removing a part of said $Al_zGa_{1-z}N$ contact layer by etching it away until said $In_yGa_{1-y}N$ channel layer is exposed, and said gate electrode is formed so as to be embedded in the recessed portion with intervention of an insulating film made of polycrystalline or amorphous substances.

In such a case, preferably, said insulating film is a single layer film made of a polycrystalline or amorphous insulating material, which is selected from the group consisting of $Si_3N_4$, $SiO_2$, $SiON$, $Al_2O_3$, $Ga_2O_3$, $ZnO$, $MgO$ and $HfO_2$, or a multilayer film comprising a laminated structure that is composed of a plurality of said single layer film.

In the semiconductor device according to the present invention, the following three types of embodiment can be adopted.

In the first embodiment, an Al composition z of said $Al_zGa_{1-z}N$ contact layer is selected larger than an Al composition x of said $Al_xGa_{1-x}N$ lower barrier layer.

In the second embodiment, selected is such a structure in which said $Al_xGa_{1-x}N$ lower barrier layer is doped with a shallow n-type impurity, and when said gate electrode, said source electrode and said drain electrode are set at an equal potential, then a two-dimensional electron gas is produced in the vicinity of an interface between said $In_yGa_{1-y}N$ channel layer and said $Al_xGa_{1-x}N$ lower barrier layer.

In the third embodiment, selected is such a structure in which said $Al_zGa_{1-z}N$ contact layer is doped with a shallow n-type impurity.

For instance, when either the first embodiment or the third embodiment is adopted, it is possible to achieve such a mode in which a threshold voltage $V_T$ of the field effect transistor to be fabricated is positive.

In general, in the semiconductor device according to the present invention, the following structures are preferably selected.

Preferably, a structure is selected in which said $In_yGa_{1-y}N$ channel layer is made of $In_yGa_{1-y}N$ ($0 \leq y \leq 1$) which is undoped, or doped with a shallow n-type impurity.

Preferably, a structure is selected in which each of said $Al_xGa_{1-x}N$ lower barrier layer, said $In_yGa_{1-y}N$ channel layer and said $Al_zGa_{1-z}N$ contact layer is an epitaxial film grown by C-axis growth.

Preferably, a structure is selected in which band discontinuity $\Delta Ec$ $(Al_zGa_{1-z}N/In_yGa_{1-y}N)$ due to a conduction band energy difference between said $Al_zGa_{1-z}N$ and said $In_yGa_{1-y}N$ at a heterojunction interface between said $Al_zGa_{1-z}N$ contact layer and said $In_yGa_{1-y}N$ channel layer is selected within the range of equal to or larger than 50 meV.

Preferably, a structure is selected in which band discontinuity $\Delta Ec$ $(Al_xGa_{1-x}N/In_yGa_{1-y}N)$ due to a conduction band energy difference between said $Al_xGa_{1-x}N$ and said $In_yGa_{1-y}N$ at a heterojunction interface between said $Al_xGa_{1-x}N$ lower barrier layer and said $In_yGa_{1-y}N$ channel layer is selected within the range of equal to or larger than 50 meV.

Preferably, a structure is selected in which said $Al_xGa_{1-x}N$ lower barrier layer is formed on a buffer layer comprising $Al_uGa_{1-u}N$ ($0 \leq u \leq 1$) grown in the C-axis. For example, a structure is preferably selected in which said $Al_xGa_{1-x}N$ lower barrier layer is formed on a buffer layer composed of a undoped AlGaN having gradient composition, which is formed on a substrate and. As the buffer layer, instead of said undoped AlGaN having gradient composition, a layer described below may be also used. For example, it is possible to use, as the buffer layer, an undoped AlGaN layer whose Al composition is changed in the stepwise manner in the thickness direction. Similarly, an undoped AlGaN/GaN superlattice layer in which a ratio of a film thickness of an AlGaN layer and that of a GaN layer is changed in the thickness direction may be also used as the buffer layer. Alternatively, an undoped AlN/GaN superlattice layer in which a ratio of a film thickness of an AlN layer and that of a GaN layer is changed in the thickness direction may be also used as the buffer layer.

Preferably, a structure is selected in which the film thickness of said insulating film is selected within the range of 50 nm-500 nm.

Preferable embodiments in the semiconductor device according to the present invention mentioned above will be further explained below.

First, for said $Al_xGa_{1-x}N$ lower barrier layer, said $In_yGa_{1-y}N$ channel layer and said $Al_zGa_{1-z}N$ contact layer, epitaxial layers sequentially laminated are used.

In the semiconductor device according to the present invention, said $Al_xGa_{1-x}N$ lower barrier layer, said $In_yGa_{1-y}N$ channel layer and said $Al_zGa_{1-z}N$ contact layer are epitaxially grown in sequence on a substrate to compose the layered structure. In such a case, first, the buffer layer is formed on the substrate by epitaxial growth, subsequently said $Al_xGa_{1-x}N$ lower barrier layer, said $In_yGa_{1-y}N$ channel layer and said $Al_zGa_{1-z}N$ contact layer are sequentially laminated.

In the step of forming the buffer layer on the substrate by epitaxial growth, preferably, first, an undoped AlN thin film is grown as an underlying layer, and it is used as a nucleation layer. The undoped AlN thin film itself is formed in the form of an insulating thin film. Next, using the nucleation layer as an underlying layer, a buffer layer composed of a group III nitride-based semiconductor is formed by epitaxial growth.

The undoped AlN thin film used as a nucleation layer has a film thickness: $t_{nuclear}$ selected within the range of 10 nm-500 nm. For the buffer layer, $Al_uGa_{1-u}N$ ($0 \leq u \leq 1$) is used. The $Al_uGa_{1-u}N$ buffer layer has a film thickness $t_{buffer}$ selected within the range of 0.5 μm-3 μm. In this $Al_uGa_{1-u}N$ buffer layer, its Al composition u is matched to an Al composition x of the $Al_xGa_{1-x}N$ lower barrier layer at the interface with the $Al_xGa_{1-x}N$ lower barrier layer.

Accordingly, a structure is preferably selected in which a lattice constant in the $Al_uGa_{1-u}N$ buffer layer is changed from a lattice constant a(AlN) of AlN used for the nucleation layer to a lattice constant $a(Al_xGa_{1-x}N)$ of $Al_xGa_{1-x}N$ ($0 \leq x \leq 1$) used for the $Al_xGa_{1-x}N$ lower barrier layer in the film thickness direction.

The lattice constant a(AlN) of AlN used for the nucleation layer differs from the lattice constant $a(Al_xGa_{1-x}N)$ of $Al_xGa_{1-x}N$ ($0 \leq x \leq 1$) used for the $Al_xGa_{1-x}N$ lower barrier layer. Therefore, for the buffer layer composed of a group III nitride-based semiconductor, a buffer layer is preferably employed that is composed of a undoped AlGaN with gradient composition which changes from the substrate side toward the front surface side. In the buffer layer composed of such AlGaN having gradient composition, an Al composition (xb): $Al_{xb}Ga_{1-xb}N$ on the side of the substrate and an Al composition (xt): $Al_{x1}Ga_{1-x1}N$ on the front surface side are set at xb>xt. In particular, the Al composition (xt): $Al_{x1}Ga_{1-x1}N$ on the front surface side is set equal to the Al composition (x) of $Al_xGa_{1-x}N$ ($0 \leq x \leq 1$) used for the $Al_xGa_{1-x}N$ lower barrier layer. The lattice constant $a(Al_{x1}Ga_{1-x1}N)$ of $Al_{x1}Ga_{1-x1}N$ on the front surface side of the buffer layer, which is composed of the AlGaN having gradient composition, is larger than the lattice constant a(AlN) of AlN used for the nucleation layer, but the gradient of Al composition is provided therein to attain lattice-relaxation. That is, on the front surface of the buffer layer composed of the AlGaN having gradient composition, its lattice constant becomes equal to the lattice constant $a(Al_{x1}Ga_{1-x1}N)$ of $Al_{x1}Ga_{1-x1}N$. Accordingly, $Al_xGa_{1-x}N$ ($0 \leq x \leq 1$) that is epitaxially grown on the front surface of the buffer layer composed of the AlGaN having gradient composition is formed in the lattice-relaxed state.

A structure may be also employed in which the undoped AlN thin film used as the nucleation layer and the $Al_uGa_{1-u}N$ buffer layer are integrated with each other, and the Al composition u is gradually decreased from 1 to x.

Concentration ($N_{SD\text{-}buffer}$) of a residual impurity contained in the $Al_uGa_{1-u}N$ buffer layer is set to be not larger than about $1 \times 10^{17}$ cm$^{-3}$. However, to make the influence of the residual impurity less than that of polarization effect, the concentration ($N_{SD\text{-}buffer}$) of the residual impurity is desirably not larger than $1 \times 10^{16}$ cm$^{-3}$. For example, the product ($t_{buffer} \cdot N_{SD\text{-}buffer}$) desirably falls within the range of not larger than $1 \times 10^{12}$ cm$^{-3}$.

In general, the Al composition x of the $Al_xGa_{1-x}N$ lower barrier layer is selected within the range of $0.05 \leq x \leq 0.5$. However, in terms of increase in concentration of carriers supplied to the $In_yGa_{1-y}N$ channel layer and suppression of induced dislocations, the Al composition x of the $Al_xGa_{1-x}N$ lower barrier layer is desirably selected within the range of $0.1 \leq x \leq 0.35$. The film thickness: $t_{barrier}$ of this $Al_xGa_{1-x}N$ lower barrier layer itself is usually set within the range of $t_{barrier} \leq 100$ nm.

The $Al_xGa_{1-x}N$ lower barrier layer may be undoped or N-type doped. When concentration: $N_{SD\text{-}barrier}$ of the shallow n-type impurity (donor) doped in the $Al_xGa_{1-x}N$ lower barrier layer is within the range of $N_{SD\text{-}barrier} \leq 1 \times 10^{17}$ cm$^{-3}$, the product ($t_{barrier} \cdot N_{SD\text{-}barrier}$) is ($t_{barrier} \cdot N_{SD\text{-}barrier}$) $\leq 1 \times 10^{12}$ cm$^{-3}$. Accordingly, supply of carriers to the $In_yGa_{1-y}N$ channel layer due to the shallow n-type impurity (donor) doped in the $Al_xGa_{1-x}N$ lower barrier layer is insufficient. In such a case, the $Al_zGa_{1-z}N$ contact layer is doped with an N-type impurity, so that carriers are supplied to the $In_yGa_{1-y}N$ channel layer. Alternatively, an Al composition z of the $Al_zGa_{1-z}N$ contact layer is set to be larger than the Al composition x of the $Al_xGa_{1-x}N$ lower barrier layer by 0.05 or more (z>x+

0.05), thereby polarization charges are produced to supply the carriers to the $In_yGa_{1-y}N$ channel layer.

Also, the $Al_xGa_{1-x}N$ lower barrier layer itself may be doped with an N-type impurity so that carriers are supplied to the $In_yGa_{1-y}N$ channel layer therefrom. In such a case, doping level of the N-type impurity in the $Al_xGa_{1-x}N$ lower barrier layer is selected so that the product $(t_{barrier} \cdot N_{SD-barrier})$ is set within the range of $1 \times 10^{14}$ cm$^{-3} \geq (t_{barrier} \cdot N_{SD-barrier}) \geq 1 \times 10^{12}$ cm$^{-3}$.

An In composition y of the $In_yGa_{1-y}N$ channel layer is selected within the range of $0.01 \leq y \leq 1$. However, in terms of increase in concentration of carriers and suppression of induced dislocations, the In composition y of the $In_yGa_{1-y}N$ channel layer is desirably selected within the range of $0.01 \leq y \leq 0.05$. A film thickness: $t_{channel}$ of the $In_yGa_{1-y}N$ channel layer is set equal to or less than the critical film thickness for induced dislocations when it is epitaxially grown on the $Al_xGa_{1-x}N$ lower barrier layer. However, in terms of increase in concentration of carriers and suppression of induced dislocations, the film thickness: $t_{channel}$ of the $In_yGa_{1-y}N$ channel layer is desirably selected within the range of 5 nm $\leq t_{channel} \leq 20$ nm.

The $In_yGa_{1-y}N$ channel layer may be undoped or N-type doped. When undoped, concentration: $N_{SD-channel}$ of a shallow n-type impurity (donor) contained in the $In_yGa_{1-y}N$ channel layer is set within the range of $N_{SD-channel} \leq 1 \times 10^{17}$ cm$^{-3}$. In such a case, the product $(t_{channel} \cdot N_{SD-channel})$ is $(t_{channel} \cdot N_{SD-channel}) \leq 1 \times 10^{12}$ cm$^{-3}$ for the range of 5 nm $\leq t_{channel} \leq 20$ nm. However, to make the effect of carrier production due to a residual impurity in the $In_yGa_{1-y}N$ channel layer less than that of polarization effect, the concentration $N_{SD-channel}$ is set within the range of $N_{SD-channel} \leq 1 \times 10^{16}$ cm$^{-3}$. In such a case, the product $(t_{channel} \cdot N_{SD-channel})$ is $(t_{channel} \cdot N_{SD-channel}) < 1 \times 10^{11}$ cm$^{-3}$ for the range of 5 nm $\leq t_{channel} \leq 20$ nm.

In general, An Al composition z of the $Al_zGa_{1-z}N$ contact layer is selected within the range of $0.05 \leq z \leq 0.5$. However, in terms of increase in concentration of carriers and suppression of induced dislocations, an Al composition z of the $Al_zGa_{1-z}N$ contact layer is desirably selected within the range of $0.05 \leq z \leq 0.35$. A film thickness: $t_{contact}$ of the $Al_zGa_{1-z}N$ contact layer is set equal to or less than the critical film thickness for induced dislocations when it is epitaxially grown on the $Al_xGa_{1-x}N$ lower barrier layer. However, in terms of increase in concentration of carriers and suppression of induced dislocations, the film thickness: $t_{contact}$ of the $Al_zGa_{1-z}N$ contact layer is desirably selected within the range of 5 nm $\leq t_{contact} \leq 100$ nm.

The $Al_zGa_{1-z}N$ contact layer may be either undoped or N-type doped. When undoped, or when concentration: $N_{SD-contact}$ of a shallow n-type impurity (donor) contained in the N-type doped $Al_zGa_{1-z}N$ contact layer is within the range of $N_{SD-contact} \leq 1 \times 10^{17}$ cm$^{-3}$, an Al composition z of the $Al_zGa_{1-z}N$ contact layer is set to be larger than the Al composition x of the $Al_xGa_{1-x}N$ lower barrier layer by 0.05 or more (z>x+0.05). By selecting such a composition, polarization charges are produced to supply the carriers to the $In_yGa_{1-y}N$ channel layer, and thereby a two-dimensional electron gas is produced in the interface between the $Al_zGa_{1-z}N$ contact layer and the $In_yGa_{1-y}N$ channel layer.

In the case when N-type doped at a high concentration, the concentration: $N_{SD-contact}$ of the shallow n-type impurity (donor) doped in the $Al_zGa_{1-z}N$ contact layer is selected so that the product $(t_{contact} \cdot N_{SD-contact})$ is set within the range of $1 \times 10^{14}$ cm$^{-3} \geq (t_{contact} \cdot N_{SD-contact}) \geq 1 \times 10^{12}$ cm$^{-3}$.

Said $Al_xGa_{1-x}N$ lower barrier layer, $In_yGa_{1-y}N$ channel layer and $Al_zGa_{1-z}N$ contact layer as well as $Al_uGa_{1-u}N$ buffer layer and AlN nucleation layer are formed of an epitaxial film having a hexagonal crystal system (wurtzite structure). A part of structural constants and physical constants of group III nitride-based semiconductors having a hexagonal crystal system: AlN, GaN and InN is summarized in Table 2.

TABLE 2

Structural constants and physical constants (wurtzite-type crystal)

|  | AlN | GaN | InN |
|---|---|---|---|
| lattice constant a (Å) | 3.112 | 3.189 | 3.540 |
| c (Å) | 4.982 | 5.185 | 5.760 |
| coefficient of linear thermal expansion (10$^{-6}$/K) | a//5.27 | a//5.59 | a//5.7 |
|  | c//4.15 | c//3.17 | c//3.7 |
| spontaneous polarization $P_{SP}$ [C/m$^2$] | −0.081 | −0.029 | −0.032 |
| piezoelectric constant $e_{31}$ [C/m$^2$] | −0.60 | −0.49 | −0.57 |
| piezoelectric constant $e_{33}$ [C/m$^2$] | 1.46 | 0.73 | 0.97 |
| elastic constant $C_{13}$ [GPa] | 120 | 70 | 121 |
| elastic constant $C_{33}$ [GPa] | 395 | 379 | 182 |
| band gap [eV] | 6.2 | 3.39 | 1.89 |

The substrates listed in Table 3-1 are generally known as substrates which may be used for epitaxial growth of a group III nitride-based semiconductor. Thermal, electric properties of the substrate materials are listed in Table 3-2.

TABLE 3-1

Crystal structural parameters of substrate materials for epitaxial growth of group III nitride-based semiconductor

| substrate material | crystal system | lattice constant (Å) | coefficient of linear thermal expansion (K$^{-1}$) |
|---|---|---|---|
| 6H-SiC | hexagonal crystal | a = 3.08<br>c = 15.12 | a//4.2 × 10$^{-6}$<br>c//4.8 × 10$^{-6}$ |
| 4H-SiC | hexagonal crystal | a = 3.09<br>c = 10.08 | a//4.2 × 10$^{-6}$<br>c//4.7 × 10$^{-6}$ |
| 3C-SiC | cubical crystal | a = 4.36 | a//4.7 × 10$^{-6}$ |
| α-Al$_2$O$_3$ | hexagonal crystal | a = 4.758<br>c = 12.991 | a//7.5 × 10$^{-6}$<br>c//8.5 × 10$^{-6}$ |
| Si | diamond structure | a = 5.431 | a//4.08 × 10$^{-6}$ |
| ZnO | hexagonal crystal | a = 3.240<br>c = 5.195 | a//2.9 × 10$^{-6}$<br>c//4.75 × 10$^{-6}$ |
| AlN | hexagonal crystal | a = 3.112<br>c = 4.982 | a//2.9 × 10$^{-6}$<br>c//3.4 × 10$^{-6}$ |

TABLE 3-2

Thermal and electric properties of substrate materials for epitaxial growth of group III nitride-based semiconductor

| substrate material | coefficient of thermal conductivity (W/mK) | specific permittivity $\epsilon_r$ | resistivity (Ω · cm) |
|---|---|---|---|
| 6H-SiC | 4.9 × 10$^{-2}$ | c//10.2<br>c⊥ 9.7 | semiconductor: the order of 10$^6$ |
| 4H-SiC | 4.9 × 10$^{-2}$ | c//10.2<br>c⊥ 9.7 | semiconductor: the order of 10$^6$ |
| 3C-SiC | 4.9 × 10$^{-2}$ | 9.72 | semiconductor: the order of 10$^6$ |
| α-Al$_2$O$_3$ | 0.2 × 10$^{-2}$ | c//9.34<br>a//11.54 | insulator: >10$^{14}$ |
| Si | 1.5 × 10$^{-2}$ | 3.75(100) | semiconductor: ≤2.3 × 10$^5$ |
| ZnO | 0.234 × 10$^{-2}$ | 8.5 | semiconductor: the order of 10$^6$ |
| AlN | 2.2 × 10$^{-2}$ | 10.7 | insulator: the order of 10$^{10}$ |

Note that when on the surface of various substrates, the AlN layer is grown for the nucleation layer, the relation between their crystal orientations is reported as shown in Table 3-3.

TABLE 3-3

Relation between crystal orientation of hexagonal crystal AlN C-axis grown on the surface of various substrates and the surface of the substrates

| orientation of the surface of substrate | crystal orientation of hexagonal crystal AlN//crystal orientation of substrate |
|---|---|
| SiC c(0001) | (0001)[2$\bar{1}\bar{1}$0]//(0001)[2$\bar{1}\bar{1}$0] |
| α-Al$_2$O$_3$ c(0001) | (0001)[1$\bar{1}$00]//(0001)[2$\bar{1}\bar{1}$0] |
| α-Al$_2$O$_3$ r(01$\bar{1}$2) | (2$\bar{1}\bar{1}$0)[0001]//(01$\bar{1}$2)[0$\bar{1}$11] |
| α-Al$_2$O$_3$ a(2$\bar{1}\bar{1}$0) | (0001)[1$\bar{1}$00]//(2$\bar{1}\bar{1}$0)[0001] |
| Si o(111) | (0001)[2$\bar{1}\bar{1}$0]//(111)[1$\bar{1}$0] |
| Si a(100) | (0001)[2$\bar{1}\bar{1}$0]//(100)[01$\bar{1}$] |

In the semiconductor device according to the present invention, each of said Al$_x$Ga$_{1-x}$N lower barrier layer, In$_y$Ga$_{1-y}$N channel layer and Al$_z$Ga$_{1-z}$N contact layer, as well as buffer layer composed of the AlGaN having gradient composition is preferably an epitaxial film that is C-axis grown. Thus, for the AlN nucleation layer formed on the substrate, a substrate capable of C-plane growth is preferably used. Accordingly, for the substrate, a substrate having a C-plane ((0001) plane) of SiC, a substrate having a C-plane ((0001) plane) of sapphire (α-Al$_2$O$_3$), a substrate having a(111) plane of Si, and a substrate having a C-plane ((0001) plane) of AlN or GaN are preferably used. The SiC substrate is suitable for a basal substrate used for high-temperature growth, also the SiC substrate having a large diameter is easily available, so that it is one of best suitable substrates for forming the multilayer epitaxial film described above.

In the semiconductor device according to the present invention, at least two ohmic electrodes are formed as a source electrode and a drain electrode on the Al$_z$Ga$_{1-z}$N contact layer. For forming the ohmic electrodes, for example, metal such as titanium (Ti), aluminum (Al), nickel (Ni), gold (Au) or the like, is deposited on the front surface of the Al$_z$Ga$_{1-z}$N contact layer, and then is patterned. Then, metal is subjected to alloying treatment, for example, for 30 sec at the temperature of 850° C. in the atmosphere of nitrogen gas to form ohmic contact therewith.

Regarding conditions for forming the ohmic electrodes on the Al$_z$Ga$_{1-z}$N contact layer, for example, any of the following conditions may be employed: Ti (15 nm)/Al (60 nm)/Nb (35 nm)/Au (50 nm), sintering temperature: 850° C.; Ti (25 nm)/Al (200 nm)/Ni (40 nm)/Au (15 nm), sintering temperature: 900° C.; Ti (15 nm)/Al (60 nm)/Mo (35 nm)/Au (59 nm), sintering temperature: 850° C.; Ti (20 nm)/Al (120 nm)/Ti (40 nm)/Au (10 nm), sintering temperature: 900° C.

In a region located between the source electrode and the drain electrode, a gate electrode is provided. A structure which is capable of constructing a field effect transistor is provided by the gate electrode, the source electrode and the drain electrode.

In the semiconductor device according to the present invention, in a channel region directly beneath the gate electrode, an MIS structure of gate electrode/insulating film/In$_y$Ga$_{1-y}$N channel layer is constructed. In particular, a part of the Al$_z$Ga$_{1-z}$N contact layer is etched away until the In$_y$Ga$_{1-y}$N channel layer is exposed, thereby a recessed portion is formed. In this recessed portion, the gate electrode is formed so as to be embedded with intervention of an insulating film composed of polycrystalline or amorphous substances.

In forming the recessed portion, a part of the Al$_z$Ga$_{1-z}$N contact layer is selectively etched away, thereby a front surface of the In$_y$Ga$_{1-y}$N channel layer is exposed. When the Al$_z$Ga$_{1-z}$N contact layer is selectively etched away, the reactive ion etching method and the like may be used in which, for example, a Cl$_2$-based gas is used as a selective etching gas.

In the step of recess-etching of the Al$_z$Ga$_{1-z}$N layer. Inductively Coupled Plasma (ICP) etching method and Reactive Ion Etching (RIE) method may be employed. In such a case, BCl$_3$, Cl$_2$, CCl$_4$ and the like may be employed as a reactive gas.

When said vapor phase etching method is used, anisotropy in etching rate depending on crystal orientation may be successfully used to incline a surface of a side wall of the recessed portion. Note that if bias power is set smaller than a predetermined value, the anisotropy in etching rate depending on crystal orientation can be suppressed, and thereby, a smaller angle of tilt can be also obtained. That is, a structure may be also employed in which the angle of tilt of the surface of the side wall of the recessed portion is set equal to or smaller than 90 degrees.

A depth $d_{recess}$ of the recessed portion to be formed is set to be $d_{recess} \geq t_{contact}$ with reference to the film thickness $t_{contact}$ of the Al$_z$Ga$_{1-z}$N contact layer. Note that a difference ($d_{recess} - t_{contact}$) between the depth $d_{recess}$ of the recessed portion and the film thickness $t_{contact}$ of the Al$_z$Ga$_{1-z}$N contact layer is preferably set larger than several nm to secure in-plane uniformity.

Of course, ($d_{recess} - t_{contact}$) is selected within the range of ($d_{recess} - t_{contact}$)<$t_{channel}$ with reference to the film thickness $t_{channel}$ of the In$_y$Ga$_{1-y}$N channel layer.

Within the range which satisfies the essential condition described above, for example, ($d_{recess} - t_{contact}$) may be selected within the range of $2 \cdot t_{contact} \geq (d_{recess} - t_{contact}) \geq 1/10 \cdot t_{contact}$ with reference to the film thickness $t_{contact}$ of the Al$_z$Ga$_{1-z}$N contact layer. For example, if the condition ($d_{recess} - t_{contact}$) ≈ $1/2 \cdot t_{contact}$ is selected, a bottom surface of the recessed portion can be planarized even if there is in-plane dispersion of etching rate.

On the one hand, a difference ($W_{recess} - W_{opening}$) between a width $W_{opening}$ of a mask opening used for forming the recessed portion and a width $W_{recess}$ is of an actually formed recessed portion arises from the amount of side etching $\Delta W_{side-etch}$. That is, ($W_{recess} - W_{opening}$)=$2 \cdot \Delta W_{side-etch}$ is provided. Generally, as the amount of etching in the depth direction increases, that is, as the depth $d_{recess}$ of the recessed portion increases, the amount of side etching $\Delta W_{side-etch}$ also increases.

Therefore, to reduce a channel length, the amount of overetching ($d_{recess} - t_{contact}$) is preferably decreased sufficiently, compared with the width $W_{recess}$ of the recessed portion.

For example, if the amount of overetching ($d_{recess} - t_{contact}$) is larger than a film thickness $t_{insulator}$ of the insulating film on the bottom surface of the recessed portion: ($d_{recess} - t_{contact}$) >$t_{insulator}$, a lower end of the gate electrode is located lower than the interface of Al$_z$Ga$_{1-z}$N contact layer/In$_y$Ga$_{1-y}$N channel layer. In such a case, on the surface of the side wall of the recessed portion, the gate electrode is brought close to the interface of Al$_z$Ga$_{1-z}$N contact layer/In$_y$Ga$_{1-y}$N channel layer with intervention of the insulating film. That is, with intervention of the insulating film formed on the surface of the side wall of the recessed portion, an MIS structure of gate electrode/insulating film/(interface of Al$_z$Ga$_{1-z}$N contact layer/In$_y$Ga$_{1-y}$N channel layer) is constructed. Particularly, even when a structure is selected in which a shallow n-type impurity is doped in the $Al_zGa_{1-z}N$ contact layer, then a leakage current in said MIS structure portion is by no means in the level leading to a problem, regardless of a film thickness $t_{insulator-well}$ of the insulating film formed on the surface of the side wall of the recessed portion.

Note that when an etching mask is formed by using the photolithographic process employing light exposure, a width $W_{opening}$ of its opening is selected within the range of $W_{opening} \geq 500$ nm. On the one hand, when an etching mask is formed by using the electron beam exposure process, the width $W_{opening}$ of its opening may be also set equal to or less than 500 nm.

The width $W_{recess}$ of the actually formed recessed portion defines a length $L_{channel}$ of the channel region between the source and the drain. That is, $L_{channel} \approx W_{recess}$ is provided. The length $L_{channel}$ of the channel region is selected dependent on an application mode of the device (operating voltage $V_{SD}$, operation frequency $f_T$). For example, for the RF front-end application ($V_{SD}=1$ V-100 V, $f_T=1$ GHz-100 GHz), the length $L_{channel}$ is selected within the range of $L_{channel} \approx W_{recess}=0.05-1$ μm, and for the power control application ($V_{SD}=10$ V-1000 V, $f_T=100$ Hz-1 MHz), it is selected within the range of $L_{channel} \approx W_{recess} 1-100$ μm.

An insulating film used for forming the gate electrode is formed so as to coat the bottom surface of the recessed portion and the surface of its side wall. Also, in the region located between the source electrode and the drain electrode, the front surface of the $Al_zGa_{1-z}N$ contact layer existing on a flat region except the recessed portion is also coated with the insulating film.

When a film thickness $t_{insulator}$ of the insulating film on the bottom surface of the recessed portion is selected within the range of $t_{insulator} < d_{recess}$ with reference to the depth $d_{recess}$ of the recessed portion, the lower end of the gate electrode is brought lower than an upper surface of the $Al_zGa_{1-z}N$ contact layer. Accordingly, the gate electrode is formed so as to be completely embedded in the recessed portion with intervention of the insulating film.

When the film thickness $t_{insulator}$ of the insulating film on the bottom surface of the recessed portion is selected within the range of $t_{insulator} > d_{recess}$ with reference to the depth $d_{recess}$ of the recessed portion, the lower end of the gate electrode is brought higher than the upper surface of the $Al_zGa_{1-z}N$ contact layer. Also in such a case, the gate electrode is formed in the recessed portion so as to be embedded in a concave portion on the front surface of the insulating film corresponding to the shape of the recessed portion.

The gate electrode formed so as to be embedded in the recessed portion with intervention of this insulating film is preferably shaped to be integrated with a so-called field plate electrode to be fabricated on the insulating film which also coats the upper surface of the $Al_zGa_{1-z}N$ contact layer. A portion functioning as the field plate electrode is shaped to extend from the side wall portion of the recessed portion toward the drain side at least by 0.2 μm or more. For example, for the shape of extension from the side wall portion of the recessed portion, in addition to the extension toward the drain side, the extension provided also toward the source side may be selected.

The portion functioning as the field plate electrode overlaps the upper surface of the $Al_zGa_{1-z}N$ contact layer with intervention of the insulating film, which constructs an MIS structure. This field plate electrode portion is biased at the same potential as that of the gate electrode and has relaxation effect on electric field concentration. The overlap lengths $L_{FD-D}$ and $L_{FP-S}$ of the $Al_zGa_{1-z}N$ contact layer and the field plate electrode portion are set to be, for example, $L_{FP-D}=L_{FP-S} \geq 0.2$ μm both on the drain side and on the source side. Therefore, the length $L_{G-TOP}$ on the upper surface side of the gate electrode where the field plate electrode portion and the gate electrode are integrated with each other is selected within the range of $L_{G-TOP}=L_{channel}+(L_{FP-D}+L_{FP-S}) \leq L_{channel}+0.4$ μm.

Of course, a distance: $\Delta L_{GD}$ between the upper surface of the gate electrode on the drain side and the drain electrode, and a distance: $\Delta L_{GS}$ between the upper surface of the gate electrode on the source side and the source electrode are set to be $\Delta L_{GD}$, $\Delta L_{GS} \geq 0.5$ μm to avoid insulation breakdown. In such a case, a distance: $W_{S-D}$ between the drain electrode and the source electrode is $W_{S-D}=L_{G.TOP}+(\Delta L_{GD}+\Delta L_{GS})= L_{channel}+(L_{FP-D}+L_{FP-S})+(\Delta L_{GD}+\Delta L_{GS})$. Accordingly, the length $L_{G-TOP}$ of the gate electrode on the upper surface side is selected within the range of $W_{S-D}-10$ μm $\geq L_{G-TOP} \geq L_{channel}+0.4$ μm.

Let the width of the recessed portion be $W_{recess}$, and let the film thickness of the insulating film formed on the surface of the side wall of the recessed portion be $t_{insulator-well}$, then an effective gate length $L_{G-effect}$ of the gate electrode formed so as to be embedded in the recessed portion with intervention of the insulating film is $L_{G-effect} \approx W_{recess}-2 \times t_{insulator-well}$.

Accordingly, a ratio: $L_{G-effect}/t_{insulator}$ of the effective gate length $L_{G-effect}$ of the gate electrode and the film thickness $t_{insulator}$ of the insulating film of the recessed portion on the bottom surface is $L_{G-effect}/t_{insulator} \approx (W_{recess}-2 \times t_{insulator-well})/t_{insulator}$. Generally, this ratio $L_{G-effect}/t_{insulator}$ is selected within the range of $(L_{G-effect}/t_{insulator}) \geq 3$, desirably selected within the range of $(L_{G-effect}/t_{insulator}) \geq 10$.

On the one hand, when the film thickness $t_{insulator}$ of the insulating film of the recessed portion on the bottom surface is selected within the range of $t_{insulator} \geq d_{recess}$ with reference to the depth $d_{recess}$ of the recessed portion, then the lower end of the gate electrode is brought higher than the upper surface of the $Al_zGa_{1-z}N$ contact layer. In such a case, there is a difference in height between the upper surface of the insulating film on the bottom surface of the recessed portion and the upper surface of the insulating film on the upper surface (flat portion) of the $Al_zGa_{1-z}N$ contact layer. Thus, there is a concave portion on the upper surface of the insulating film covering the recessed portion. Accordingly, the gate electrode is formed so as to be embedded in the concave portion of the upper surface of the insulating film existing in the recessed portion, with intervention of the insulating film.

In such a case, let a film thickness of the insulating film on the upper surface (flat portion) of the $Al_zGa_{1-z}N$ contact layer be $t_{insulator-flat}$, then a width $W_{dent}$ of the concave portion on the upper surface of the insulating film existing in the recessed portion is approximately $W_{dent} \approx W_{recess}-2 \times t_{insulator-flat}$. The effective gate length $L_{G-effects}$ of the gate electrode formed to be embedded in the concave portion on the upper surface of the insulating film is $L_{G-effect} \approx W_{dent} \approx W_{recess}-2 \times t_{insulator-flat}$.

Accordingly, the ratio: $L_{G-effect}/t_{insulator}$ of the effective gate length $L_{G-effect}$ of the gate electrode and the film thickness $t_{insulator}$ of the insulating film on the bottom surface of the recessed portion is $L_{G-effect}/t_{insulator} \approx (W_{recess}-2 \times t_{insulator-flat}/t_{insulator})$. Also when the film thickness $t_{insulator}$ of the insulating film on the bottom surface of the recessed portion is selected within the range of $t_{insulator} \geq d_{recess}$ with reference to the depth $d_{recess}$ of the recessed portion, then generally, the ratio $L_{G-effect}/t_{insulator}$ is selected within the range of $(L_{G-effect}/t_{insulator}) \geq 3$, preferably selected within the range of $(L_{G-effect}/t_{insulator}) \geq 10$.

Also when the film thickness $t_{insulator}$ of the insulating film on the bottom surface of the recessed portion is selected within the range of $t_{insulator} \geq d_{recess}$ with reference to the depth $d_{recess}$ of the recessed portion, then a ratio $L_{G\text{-}effect}/d_{recess}$ is selected at least within the range of $(L_{G\text{-}effect}/d_{recess}) \geq 3$, preferably selected within the range of $(L_{G\text{-}effect}/d_{recess}) > 10$.

In such a case, the film thickness $t_{insulator}$ of the insulating film is selected dependent on an application mode of the device (operating voltage $V_{SD}$, gate voltage $V_G$, gate breakdown voltage $V_{G\text{-}breakdown}$). For example, preferably, for the RF front-end application, the film thickness $t_{insulator}$ of the insulating film is selected within the range of $t_{insulator}=5\text{-}50$ nm, and for the power control application, it is selected within the range of $t_{insulator}=50\text{-}500$ nm.

For example, when the film thickness $t_{insulator}$ is selected within the range of $t_{insulator} >> d_{recess}$, the film thickness $t_{insulator\text{-}well}$ of the insulating film formed on the surface of the side wall of the recessed portion differs from the film thickness $t_{insulator}$ of the insulating film on the bottom surface. For example, when in the step of forming the insulating film, the vapor phase deposition method, for example, spattering, PE-CVD (Plasma-enhanced Chemical Vapor Phase Deposition) or the like, is used, there may be some cases in which anisotropy in film thickness arises. When anisotropy in film thickness arises, the ratio of $t_{insulator\text{-}well}$ to $t_{insulator}$ is $t_{insulator\text{-}well}/t_{insulator} < 1$. In such a case, to secure gate breakdown, $t_{insulator\text{-}well}$ is set to be equal to or larger than 2 nm even for the RF front-end application.

When the film thickness $t_{insulator}$ is selected within the range of $t_{insulator} > d_{recess}$, there are some cases in which the lower end of the gate electrode may be, for example, brought lower than the upper surface of the $Al_zGa_{1-z}N$ contact layer and higher than its lower surface. In such a case, on the surface of the side wall of the recessed portion, an MIS structure of gate electrode/insulating film/$Al_zGa_{1-z}N$ contact layer is constructed. Particularly, even when a structure is selected in which the shallow n-type impurity is doped in the $Al_zGa_{1-z}N$ contact layer, then a leakage current in said, MIS structure portion is by no means in the level leading to a problem as long as the film thickness $t_{insulator\text{-}well}$ of the insulating film formed on the surface of the side wall satisfies the condition $t_{insulator\text{-}well} \geq 2$ nm.

The effective gate length $L_{G\text{-}effect}$ of the gate electrode corresponds to $L_{G\text{-}effect} \approx (W_{recess} - 2 \times t_{insulator})$. When the gate length $L_{G\text{-}effect}$ is set within the range of $(L_{G\text{-}effect}/t_{insulator}) \geq 3$, then, for example, for the RF front-end application ($V_{SD}=1$ V-100 V, $f_T=1$ GHz-100 GHz), $L_{G\text{-}effect}$ is within the range of 0.03-1 μm if the length $L_{channel}$ is selected within the range of $L_{channel} \approx W_{recess} = 0.05\text{-}1$ μm. For the power control application ($V_{SD}=10$ V-1000 V, $f_T=100$ Hz-1 MHz), $L_{G\text{-}effect}$ is within the range of 1-100 μm if the length $L_{channel}$ is selected within the range of $L_{channel} \approx W_{recess} = 1\text{-}100$ μm.

This insulating film in the channel region directly beneath the gate electrode is used for constructing an MIS structure of gate electrode/insulating film/$In_yGa_{1-y}N$ channel layer. In the interface of gate electrode/insulating film, a barrier $\Phi_{M/1}$ (contact potential difference) is created that corresponds to a difference $(e_\chi(I_{front}) - c\phi(M_{gate}))$ eV between a work function $c\phi(M_{gate})$ eV of a metal material $M_{gate}$ in contact with the front surface of the insulating film in the gate electrode and electron affinity $e_\chi(I_{front})$ eV of an insulating material $I_{front}$ on the front surface of the insulating film. In the interface of insulating film/$In_yGa_{1-y}N$ channel layer, a barrier $\Phi_{I/S}$ (contact potential difference) is created that corresponds to a difference $(e_\chi(I_{rear}) - e_\chi(In_yGa_{1-y}N))$ eV between electron affinity $e_\chi(I_{rear})$ eV of an insulating material $I_{rear}$ on a rear surface of the insulating film and electron affinity $e_\chi(In_yGa_{1-y}N)$ eV of the $In_yGa_{1-y}N$ channel layer.

In the semiconductor device according to the present invention, an insulating material which does not exhibit polarization effect is used as the insulating material for composing the insulating film. For the insulating material which does not exhibit polarization effect, any of $Si_3N_4$, $SiO_2$, $Si_{1-x-y}O_xN_y$, $Ga_2O_3$, aluminum oxide ($Al_2O_3$), zinc oxide (ZnO), magnesium oxide (MgO) and hafnium oxide ($HfO_2$) may be used.

Further, in the semiconductor device according to the present invention, the barrier $\Phi_{M/I}$ is set within the range of $\Phi_{M1} \geq 1$ eV. To satisfy this requirement, combination of the metal material $M_{gate}$ in contact with the front surface of the insulating film and the insulating material $I_{front}$ of the front surface of the insulating film is selected. For example, when Ti is selected as the metal material $M_{gate}$ in contact with the front surface of the insulating film, then as the insulating material $I_{front}$ of the front surface of the insulating film, any of $Si_3N_4$, $SiO_2$, $Si_{1-x-y}O_xN_y$, $Ga_2O_3$, aluminum oxide ($Al_2O_3$), zinc oxide (ZnO), magnesium oxide (MgO) and hafnium oxide ($HfO_2$) may be used.

Also, the barrier $\Phi_{I/S}$ is set within the range of $\Phi_{I/S} \geq 1$ eV. To satisfy this requirement, the insulating material $I_{rear}$ of the rear surface of the insulating film is selected for $In_yGa_{1-y}N$ ($0 \leq y \leq 1$) having compressive strain of the $In_yGa_{1-y}N$ channel layer. For example, for GaN having compressive strain, as the insulating material $I_{rear}$ of the rear surface of the insulating film, any of $Si_3N_4$, $SiO_2$, $Si_{1-x-y}O_xN_y$, $Ga_2O_3$, aluminum oxide ($Al_2O_3$), zinc oxide (ZnO), magnesium oxide (MgO) and hafnium oxide ($HfO_2$) may be used.

A single layer film composed of one insulating material is used for the insulating film when the same insulating material is selected for the insulating material $I_{front}$ of the front surface of the insulating film and the insulating material $I_{rear}$ of the rear surface of the insulating film. The insulating film is constructed to have a laminated film structure in which films composed of different insulating materials from each other are laminated when different insulating materials are selected for the insulating material $I_{front}$ of the front surface of the insulating film and the insulating material $I_{rear}$ of the rear surface of the insulating film.

When the single layer film composed of one insulating material is used for the insulating film, any of $Si_3N_4$, $SiO_2$ and $Al_2O_3$ is preferably selected.

The insulating film including the portion thereof deposited on the surface of the side wall of the recessed portion is preferably formed to have a uniform film thickness. A method for depositing the insulating film is selected based on a target film thickness $t_{insulator}$ of the insulating film and allowable controllability of the film thickness. For example, the depositing method may be selected from among the plasma excitation (PE-) CVD method, the thermal CVD method, the radio frequency (RF-) CVD method, the atomic layer (AL-) CVD method, the DC spattering method, the RF spattering method and the electron cyclotron resonance (ECR-) spattering method, based on the insulating material used for forming the insulating film and its film thickness.

For the insulating material used for forming the insulating film, that is, the insulating material $I_{front}$ of the front surface of the insulating film and the insulating material $I_{rear}$ of the rear surface of the insulating film, a film having any of a polycrystalline form and an amorphous form may be used as long as the requirement for their electron affinities $e_\chi(I_{front})$ eV and $e_\chi(I_{rear})$ eV described above is satisfied.

The insulating material $I_{rear}$ of the rear surface of the insulating film contacts the front surface of the $In_yGa_{1-y}N$ channel layer. As the insulating material $I_{rear}$ of the rear surface of the insulating film is to be formed in the polycrystalline form or amorphous form on the front surface of the $In_yGa_{1-y}N$ channel layer, it is deposited under conditions in which it is not epitaxially grown on $In_yGa_{1-y}N$ (0≤y≤1) having compressive strain. As a result, in the interface between the $In_yGa_{1-y}N$ channel layer and the insulating material $I_{rear}$ of the rear surface of the insulating film, an interface state (electron trap level) is generated.

This interface state (electron trap level) is used to compensate all or any part of negative charges due to polarization (piezo, spontaneous) on the front surface of the $In_yGa_{1-y}N$ channel layer. To achieve this situation, in the interface between the $In_yGa_{1-y}N$ channel layer and the insulating film, a so-called donor-type interface state which becomes positively charged when electrons are emitted therefrom has to exist with sheet density of about $1\times10^{12}$ cm$^{-2}$. For example, the document (Y. Ohno et al., Appl. Phys. Lett., Vol. 84, p. 2184 (2004)) reports that in an interface between a GaN-based semiconductor and an insulating film such as $SiO_2$ and $Si_3O_4$, a donor-type interface state exists with sheet density $\sigma_{ss}$ of about $1\times10^{12}$ cm$^{-2}$. It is known that therefore, all or any part of negative charges due to polarization are compensated by the donor-type interface state.

In the semiconductor device according to the present invention, it is not a preferable state that when on the front surface of the $In_yGa_{1-y}N$ channel layer, a film composed of the insulating material $I_{rear}$ of the rear surface of the insulating film is formed, then a deep n-type impurity (deep donor) level due to an element composing this insulating material $I_{rear}$ is introduced in the vicinity of the front surface of the $In_yGa_{1-y}N$ channel layer. From this viewpoint, it is preferable to use $Si_3N_4$ as the insulating material $I_{rear}$ of the rear surface of the insulating film. When on the front surface of the $In_yGa_{1-y}N$ channel layer, an insulator film composed of $Si_3N_4$ is formed as a film composed of the insulating material $I_{rear}$ of the front surface of the insulating film, and simultaneously $Si_3N_4$ is selected for the insulating material $I_{front}$ of the front surface of the insulating film, then the entire insulating film is formed as a single layer film composed of $Si_3N_4$. When on the front surface of the $In_yGa_{1-y}N$ channel layer, an insulator film composed of $Si_3N_4$ is formed as a film composed of the insulating material $I_{rear}$ of the rear surface of the insulating film, while an insulating material other than $Si_3N_4$ is selected for the insulating material $I_{front}$ of the front surface of the insulating film, then the insulating film is formed as a multilayer film in which films composed of the other insulating materials are laminated on a film composed of $Si_3N_4$.

As the metal material $M_{gate}$ in contact with the insulating material $I_{front}$ of the front surface of the insulating film in the gate electrode, a metal having a high adhesiveness to the insulating material $I_{front}$ is preferably employed among metal materials which can meet the range of the barrier $\Phi_{M/I}$ described above. For example, as the metal material $M_{gate}$ in contact with the insulating material $I_{front}$ of the front surface of the insulating film, it is preferable to use a metal having a high adhesiveness to the insulating material $I_{front}$, such as Ti, Cr, Ni, Pt and Pd.

The gate electrode may have a structure in which on the metal material $M_{gate}$ in contact with the insulating material $I_{front}$ of the front surface of the insulating film, a layer of another metal material is laminated. This upper layer, i.e. the layer of another metal material is used to uniformly apply a gate voltage to the entire gate electrode, and functions as a main conducting metal layer. The metal material $M_{top}$ used for this main conducting metal layer (upper layer) is preferably a metal material having a high electric conductivity. For the metal material $M_{top}$, it is preferable to use a low-resistance metal, such as Au, Pt and Cu.

In general, a film thickness of the lower layer composed of the metal material $M_{gate}$ is thinned, compared with that of the upper layer composed of the metal material $M_{top}$. Accordingly, if diffusion of metal atoms occurs between both layers, alloy of both layers will be brought into contact with the insulating material $I_{front}$ of the front surface of the insulating film. To prevent this diffusion, it is preferable to provide a diffusion blocking metal layer between both layers. A metal material $M_{middle}$ used for the diffusion blocking metal layer is a metal material having a property that diffusion of metal atoms is suppressed therein. Accordingly, as the metal material $M_{middle}$ used for the diffusion blocking metal layer, generally, it is preferable to use a metal having a high melting point, such as Pt, Mo, Nb and W.

For example, when the insulating material $I_{front}$ of the front surface of the insulating film is same as the insulating material $I_{rear}$ of the rear surface of the insulating film, and the gate electrode and the source electrode and the drain electrode are set at an equal potential, such specific case where the film thickness $t_{insulator}$ of the insulating film is extremely thinned is considered. In such a case, an energy difference ($E_{C\text{-}front}-E_f$) between a conduction band edge $E_{C\text{-}front}$ of the $In_yGa_{1-y}N$ channel layer and a Fermi level $E_f$ in the interface with the insulating material $I_{rear}$ of the rear surface of the insulating film may be approximated by $(E_{C\text{-}front}-E_f) \approx (e_\chi(In_yGa_{1-y}N)-e\phi(M_{gate}))$ eV by using a difference $(e_\chi(In_yGa_{1-y}N)-c\phi(M_{gate}))$ eV between a work function $c\phi(M_{gate})$ eV of the metal material $M_{gate}$ in contact with the front surface of the insulating film and the electron affinity $e_\chi(In_yGa_{1-y}N)$ eV of the $In_yGa_{1-y}N$ channel layer. In such a case, it is more preferable to satisfy the condition $(e_\chi(In_yGa_{1-y}N)-c\phi(M_{gate}))$ eV≥1 eV.

The buffer layer composed of the AlGaN having gradient composition is an undoped layer. In such a case, concentration: $N_{SD\text{-}buffer}$ of a shallow n-type impurity (donor) present in the buffer layer composed of the undoped AlGaN having gradient composition more preferably lies within the range of $N_{SD\text{-}buffer} \leq 1\times10^{16}$ cm$^{-3}$.

An Al composition (xt) on the front surface side of the buffer layer composed of the AlGaN having gradient composition is matched to the Al composition (x) of lattice-relaxed $Al_xGa_{1-x}N$ (0≤x≤1) used for the $Al_xGa_{1-x}N$ lower barrier layer.

As the barrier layer comprising $Al_uGa_{1-u}N$ (0≤u≤1) grown in the C-axis, instead of the buffer layer composed of said undoped AlGaN having gradient composition, the following layers may be also used. For example, it is possible to use, as the buffer layer, an undoped AlGaN layer whose Al composition is changed in the stepwise manner in the thickness direction.

Similarly, an undoped AlGaN/GaN superlattice layer in which a ratio of a film thickness of an AlGaN layer and that of a GaN layer is changed in the thickness direction may be used for the buffer layer. Alternatively, an undoped AlN/GaN superlattice layer in which a ratio of a film thickness of an AlN layer and that of a GaN layer is changed in the thickness direction may be used for the buffer layer.

For example, in the case when such a lattice constant change equivalent to that is provided by the buffer layer composed of the AlGaN having gradient composition is attained by using a superlattice structure composed of combination of AlGaN/GaN, a film thickness ratio of each AlGaN/GaN pair is changed in the film thickness direction. In such a case, the film thickness sum (repetition period of superlattice) $d_{lattice}$ of each AlGaN/GaN pair is preferably selected within the range of 1 nm≤$d_{lattice}$≤10 nm.

For example, in the case when such a lattice constant change equivalent to that is provided by the buffer layer composed of the AlGaN having gradient composition is attained by using a superlattice structure composed of combination of AlN/GaN, a film thickness ratio u: (1−u) of each AlN/GaN pair is changed in the film thickness direction. In such a case, the film thickness sum (repetition period of superlattice) $d_{lattice}$ of each AlN/GaN pair is preferably selected within the range of 1 nm≤$d_{lattice}$≤10 nm.

When the undoped AlGaN layer whose Al composition is changed in the stepwise manner, or the undoped AlGaN/GaN superlattice layer changed similarly or the undoped AlN/GaN superlattice layer changed similarly is used, an effective lattice constant $a_{effect}$ of the buffer layer on the front surface side is matched to the lattice constant $a(Al_xGa_{1-x}N)$ of lattice-relaxed $(Al_xGa_{1-x}N)$ (0≤x≤1)) used for the $Al_xGa_{1-x}N$ lower barrier layer.

The interface between the $Al_xGa_{1-x}N$ lower barrier layer and the $In_yGa_{1-y}N$ channel layer forms a heterojunction interface. In the semiconductor device according to the present invention, when a field effect transistor is constructed, in the channel region directly beneath the gate electrode, carriers (electrons) are set to be accumulated at the "ON state" in the $In_yGa_{1-y}N$ channel layer, forming the two-dimensional electron gas. On the one hand, in the $Al_xGa_{1-x}N$ lower barrier layer, carriers (electrons) are set not to exist. At the "OFF state", carriers (electrons) are set not to exist in the $In_yGa_{1-y}N$ channel layer.

For the purpose, the heterojunction interface between the $Al_xGa_{1-x}N$ lower barrier layer and the $In_yGa_{1-y}N$ channel layer is used as a barrier. This barrier arises from band discontinuity ΔEc $(Al_xGa_{1-x}N/In_yGa_{1-y}N)$ due to a conduction band energy difference between $Al_xGa_{1-x}N$ and $In_yGa_{1-y}N$. At the room temperature (T=300 K), for effective functioning of this barrier, the band discontinuity ΔEc $(Al_xGa_{1-x}N/In_yGa_{1-y}N)$ has to be at least equal to or larger than 2 kT (k is the Boltzmann constant, and T expresses temperature).

On the one hand, in a region where the $Al_zGa_{1-z}N$ contact layer exists except the region where the recessed portion is formed, at any of the "ON state" and the "OFF state", carriers (electrons) are set to be accumulated in the $In_yGa_{1-y}N$ channel layer, forming the two-dimensional electron gas. Even in a region where the $Al_zGa_{1-z}N$ contact layer exists, carriers (electrons) are set not to exist in the $Al_xGa_{1-x}N$ lower barrier layer. Of course, carriers (electrons) are set not to exist also in the buffer layer.

On the one hand, the lattice constant of $In_yGa_{1-y}N$ composing the $In_yGa_{1-y}N$ channel layer is a $(In_yGa_{1-y}N)$ in the case without compressive strain, but when it is epitaxially grown on the $Al_xGa_{1-x}N$ lower barrier layer, the lattice constant of $In_yGa_{1-y}N$ becomes identical with the lattice constant a $(Al_xGa_{1-x}N)$ of the $Al_xGa_{1-x}N$. This compressive strain $e_{ZZ}$ $(In_yGa_{1-y}N/Al_xGa_{1-x}N)$ is $\{(a(In_yGa_{1-y}N)-a(Al_xGa_{1-x}N))/a(Al_xGa_{1-x}N)\}$.

A film thickness $t_{channel}$ of this $In_yGa_{1-y}N$ channel layer is selected to be equal to or less than the critical film thickness $t_{critical}$ $(In_yGa_{1-y}N/Al_xGa_{1-x}N)$ at lattice mismatch $(a(In_yGa_{1-y}N)-a(Al_xGa_{1-x}N)$. The film thickness $t_{channel}$ of the $In_yGa_{1-y}N$ channel layer is preferably selected within the range of 20 nm≥$t_{channel}$≥5 nm. Accordingly, the range of the compressive strain $e_{ZZ}$ $(In_yGa_{1-y}N/Al_xGa_{1-x}N)$ is selected so that the critical film thickness $t_{critical}$ $(In_yGa_{1-y}N/Al_xGa_{1-x}N)$ is $t_{critical}$ $(In_yGa_{1-y}N/Al_xGa_{1-x}N)$>$t_{channel}$≥5 nm.

For example, when the Al composition (x) of the $Al_xGa_{1-x}N$ lower barrier layer is set at x=0.1, the In composition (y) of the $In_yGa_{1-y}N$ channel layer is selected within the range of 0.2≥y≥0, particularly, preferably selected within the range of 0.05≥y≥0.01. In the case of the range of the In composition (y) of the $In_yGa_{1-y}N$ channel layer of 0.2≥y≥0, the critical film thickness $t_{critical}$ $(In_yGa_{1-y}N/Al_xGa_{1-x}N)$ is within the range of 5 nm-100 nm. Accordingly, the film thickness $t_{channel}$ of the $In_yGa_{1-y}N$ channel layer may be selected within the range of 100 nm≥$t_{channel}$≥5 nm. Further, the band discontinuity ΔEc $(Al_xGa_{1-x}N/In_yGa_{1-y}N)$ between the $Al_xGa_{1-x}N$ lower barrier layer and the $In_yGa_{1-y}N$ channel layer falls within the range of 200 meV-550 meV.

In the semiconductor device according to the present invention, when a field effect transistor is constructed, carriers (electrons) accumulated in the $In_yGa_{1-y}N$ channel layer form the two-dimensional electron gas at the "ON state". To increase mobility of the two-dimensional electron gas produced therein, it is preferable to suppress concentration of an ionized, shallow n-type impurity (donor) present in the $In_xGa_{1-x}N$ channel layer. Accordingly, the concentration $N_{SD-channel}$ of the shallow n-type impurity (donor) present in the $In_yGa_{1-y}N$ channel layer is set to be $1\times10^{17}$ cm$^{-3}$≥$N_{SD-channel}$≥0, preferably $1\times10^{16}$ cm$^{-3}$≥$N_{SD-channel}$≥0.

The shallow n-type impurity (donor) present in the $In_yGa_{1-y}$ N channel layer also is ionized at the "OFF state", and the $In_yGa_{1-y}N$ channel layer is depleted. Sheet density $Q_{SD-channel}$ of space charges due to the ionized, shallow n-type impurity (donor) contained in the $In_yGa_{1-y}N$ channel layer is $Q_{SC-channel}=q\cdot t_{channel}\cdot N_{SD-channel}$.

On the one hand, in the interface between the $Al_xGa_{1-x}N$ lower barrier layer and the $In_yGa_{1-y}N$ channel layer, negative interfacial charges σ$(In_yGa_{1-y}N/Al_xGa_{1-x}N)$ are produced due to polarization effect. At the "OFF state", in the region directly beneath the gate electrode, both the $Al_xGa_{1-x}N$ lower barrier layer and the $In_yGa_{1-y}N$ channel layer are depleted. Accordingly, the sum of the negative interfacial charges σ$(In_yGa_{1-y}N/Al_xGa_{1-x}N)$, sheet density $Q_{SC-barrier}$ of positive space charges in the $Al_xGa_{1-x}N$ lower barrier layer and sheet density $Q_{SC-channel}$ of positive space charges in the $In_yGa_{1-y}N$ channel layer is σ$(In_yGa_{1-y}N/Al_xGa_{1-x}N)+(Q_{SC-barrier}+Q_{SC-channel})\leq0$.

In other words, in the semiconductor device according to the present invention, when a field effect transistor is constructed, the "OFF state" is achieved even at $V_G$=0 V if the condition σ$(In_yGa_{1-y}N/Al_xGa_{1-x}N)+(Q_{SC-barrier}+Q_{SC-channel})\geq0$ is satisfied. That is, the "normally OFF" state is achieved, providing a field effect transistor of the enhancement mode type with $V_T\geq0$ V.

On the one hand, when σ$(In_yGa_{1-y}N/Al_xGa_{1-x}N)+(Q_{SC-barrier}+Q_{SC-channel})>0$, either the $Al_xGa_{1-x}N$ lower barrier layer or the $In_yGa_{1-y}N$ channel layer become undepleted at $V_G$=0 V. In such a case, in the thermal equilibrium state of $V_G$=0 V, an energy difference (Ec $(In_yGa_{1-y}N)_{front}-E_f$) between the conduction band edge energy Ec $(In_yGa_{1-y}N)_{front}$ of the $In_yGa_{1-y}N$ channel layer and the Fermi level $E_f$ in the interface between the insulating film and the $In_yGa_{1-y}N$ channel layer is (Ec $(In_yGa_{1-y}N)_{front}-E_f$)<0. That is, even in the thermal equilibrium state of $V_G$=0 V, carriers (electrons) exist in the interface between the insulating film and the $In_yGa_{1-y}N$ channel layer, and the "normally ON" state is achieved, providing a field effect transistor of the depletion mode type with $V_T$<0 V.

Note that when the $In_yGa_{1-y}N$ channel layer satisfies the condition $(e_\chi(In_yGa_{1-y}N)-e\phi(M_{gate}))$ eV≥50 meV, the concentration $N_{SD-channel}$ of its shallow n-type impurity (donor) is $N_{SD-channel}$=0 cm$^{-3}$, and σ$(In_yGa_{1-y}N/Al_xGa_{1-x}N)+(Q_{SC-barrier})$)>0, as an example shown in the third exemplary embodiment described below, then if the film thickness of the insulating film is increased, the band diagram of the conduction band of the channel region directly beneath the gate electrode becomes similar to that illustrated in FIG. 8, in the thermal equilibrium state of $V_G=0$ V. That is, if the film thickness of the insulating film is increased, the energy difference $(Ec(In_yGa_{1-y}N)_{front}-E_f)$ between the conduction band edge energy Ec $(In_yGa_{1-y}N)_{front}$ of the $In_yGa_{1-y}N$ channel layer and the Fermi level $E_f$ in the interface between the insulating film and the $In_yGa_{1-y}N$ channel layer becomes (Ec $(In_yGa_{1-y}N)_{front}-E_f)>0$. On the one hand, the energy difference (Ec $(In_yGa_{1-y}N)_{front}-E_f)$ between the conduction band edge energy Ec $(In_yGa_{1-y}N)_{rear}$ of the $In_yGa_{1-y}N$ channel layer and the Fermi level $E_f$ in the interface between the $Al_xGa_{1-x}N$ lower barrier layer and the $In_yGa_{1-y}N$ channel layer becomes (Ec $(In_yGa_{1-y}N)_{rear}-E_f)>0$.

In the semiconductor device according to the present invention, in the region where the $Al_zGa_{1-z}N$ contact layer exists with the exception of the region where the recessed portion is formed, at any of the "ON state" and the "OFF state", carriers (electrons) are set to be accumulated in the $In_yGa_{1-y}N$ channel layer, forming the two-dimensional electron gas. Even in the region where the $Al_zGa_{1-z}N$ contact layer exists, carriers (electrons) are set not to exist in the $Al_xGa_{1-x}N$ lower barrier layer.

Similarly to the $In_yGa_{1-y}N$ channel layer, $Al_zGa_{1-z}N$ ($0\le z\le 1$) composing the $Al_zGa_{1-z}N$ contact layer is formed by epitaxial growth to have the same lattice constant as the lattice constant a $(Al_xGa_{1-x}N)$ of the $Al_xGa_{1-x}N$ lower barrier layer. Accordingly, $Al_zGa_{1-z}N$ ($0\le z\le 1$) composing the $Al_zGa_{1-z}N$ contact layer has strain. When the lattice constant of $Al_zGa_{1-z}N$ composing the $Al_zGa_{1-z}N$ contact layer in the case without strain is designated as $a(Al_zGa_{1-z}N)$, then its strain $e_{ZZ}$ $(Al_zGa_{1-z}N/Al_xGa_{1-x}N)$ is expressed as $\{(a(Al_zGa_{1-z}N)-a(Al_xGa_{1-x}N))/a(Al_xGa_{1-x}N)\}$.

The film thickness $t_{contact}$ of this $Al_zGa_{1-z}N$ contact layer is selected to be equal to or less than the critical film thickness $t_{critical}$ $(Al_zGa_{1-z}N/Al_xGa_{1-x}N)$ at lattice mismatch $(a(Al_zGa_{1-z}N)-a(Al_xGa_{1-x}N))$.

For any combination of the Al composition x of the $Al_xGa_{1-x}N$ lower barrier layer and the Al composition z of the $Al_zGa_{1-z}N$ contact layer, the critical film thickness $t_{critical}$ $(Al_zGa_{1-z}N/Al_xGa_{1-x}N)$ will be equal to or larger than 5 nm. Also, when the condition $0.2\ge|z-x|\ge0$ is satisfied, the critical film thickness $t_{critical}$ $(Al_zGa_{1-z}N/Al_xGa_{1-x}N)$ will be equal to or larger than 50 nm.

When in the region where the $Al_zGa_{1-z}N$ contact layer exists, carriers (electrons) are accumulated in the $In_yGa_{1-y}N$ channel layer, forming the two-dimensional electron gas, carriers (electrons) are set to have been accumulated at least in the interface between the $Al_zGa_{1-z}N$ contact layer and the $In_yGa_{1-y}N$ channel layer. In such a case, as a barrier to accumulate carriers (electrons), a heterojunction interface between the $Al_zGa_{1-z}N$ contact layer and the $In_yGa_{1-y}N$ channel layer is used. This barrier arises from band discontinuity $\Delta Ec$ $(Al_zGa_{1-z}N/In_yGa_{1-y}N)$ due to a conduction band energy difference between $Al_zGa_{1-z}N$ contact layer and $In_yGa_{1-y}N$ channel layer. At the room temperature (T=300 K), for effective functioning of the barrier, the band discontinuity $\Delta Ec$ $(Al_zGa_{1-z}N/In_yGa_{1-y}N)$ has to be equal to or larger than 2 kT (k is the Boltzmann constant, and T expresses temperature).

On the one hand, in a heterojunction interface between the $In_yGa_{1-y}N$ channel layer and the $Al_xGa_{1-x}N$ lower barrier layer, band discontinuity $\Delta Ec$ $(Al_xGa_{1-x}N/In_yGa_{1-y}N)$ exists due to a conduction band energy difference between $Al_zGa_{1-z}N$ and $In_yGa_{1-y}N$. This band discontinuity $\Delta Ec$ $(Al_zGa_{1-z}N/In_yGa_{1-y}N)$ is also set to be at least equal to or larger than 2 kT.

When $\Delta Ec$ $(Al_zGa_{1-z}N/In_yGa_{1-y}N)>\Delta Ec$ $(Al_xGa_{1-x}N/In_yGa_{1-y}N)\ge 2$ kT is set, the Al composition (z) of $Al_zGa_{1-z}N$ is set to be larger than the Al composition (x) of $Al_xGa_{1-x}N$. In such a case, in the interface between the $Al_xGa_{1-x}N$ lower barrier layer and the $In_yGa_{1-y}N$ channel layer, negative interfacial charges $\sigma(In_yGa_{1-y}N/Al_xGa_{1-x}N)$ are produced due to polarization effect. Also, in the interface between the $Al_zGa_{1-z}N$ contact layer and the $In_yGa_{1-y}N$ channel layer, positive interfacial charges $\sigma(Al_zGa_{1-z}N/In_yGa_{1-y}N)$ are produced due to polarization effect.

When the Al composition (z) of $Al_zGa_{1-z}N$ is larger than the Al composition (x) of $Al_xGa_{1-x}N$ ($z\ge x$), the sum of the negative interfacial charges $\sigma(In_yGa_{1-y}N/Al_xGa_{1-x}N)$ and the positive interfacial charges $\sigma(Al_zGa_{1-z}N/In_yGa_{1-y}N)$ is $\{\sigma(In_yGa_{1-y}N/Al_xGa_{1-x}N)+\sigma(Al_zGa_{1-z}N/In_yGa_{1-y}N)\}\ge 0$. In such a case, carriers (electrons) due to polarization effect are supplied to the $In_yGa_{1-y}N$ channel layer. When the amount of the carriers (electrons) due (o this polarization is designated as sheet density $N_p$, the condition $(-q-N_P)+\{\sigma(In_yGa_{1-y}N/Al_xGa_{1-x}N)+\sigma(Al_zGa_{1-z}N/In_yGa_{1-y}N)\}=0$ is satisfied.

In such a case, even if each of the $Al_zGa_{1-z}N$ contact layer, the $In_yGa_{1-y}N$ channel layer and the $Al_xGa_{1-x}N$ lower barrier layer is undoped, carriers (electrons) at least due to the polarization effect are accumulated in the $In_yGa_{1-y}N$ channel layer. Because of $\Delta Ec$ $(Al_zGa_{1-z}N/In_yGa_{1-y}N)>\Delta Ec$ $(Al_xGa_{1-x}N/In_yGa_{1-y}N)\ge 2$ kT, carriers (electrons) can be accumulated in the interface between the $Al_zGa_{1-z}N$ contact layer and the $In_yGa_{1-y}N$ channel layer, forming the two-dimensional electron gas.

When $\Delta Ec$ $(Al_zGa_{1-z}N/In_yGa_{1-y}N)=\Delta Ec$ $(Al_xGa_{1-x}N/In_yGa_{1-y}N)\ge 2$ kT is set, the Al composition (z) of $Al_zGa_{1-z}N$ is set equal to the Al composition (x) of $Al_xGa_{1-x}N$. Also in such a case, in the interface between the $Al_xGa_{1-x}N$ lower barrier layer and the $In_yGa_{1-y}N$ channel layer, negative interfacial charges $\sigma(In_yGa_{1-y}N/Al_xGa_{1-x}N)$ are produced due to polarization effect. Also, in the interface between the $Al_zGa_{1-z}N$ contact layer and the $In_yGa_{1-y}N$ channel layer, positive interfacial charges $\sigma(Al_zGa_{1-z}N/In_yGa_{1-y}N)$ are produced due to polarization effect.

When the Al composition (z) of $Al_zGa_{1-z}N$ is equal to the Al composition (x) of $Al_xGa_{1-x}N$ ($z=x$), the sum of the negative interfacial charges $\sigma(In_yGa_{1-y}N/Al_xGa_{1-x}N)$ and the positive interfacial charges $\sigma(Al_zGa_{1-z}N/In_yGa_{1-y}N)$ is $\{\sigma(In_yGa_{1-y}N/Al_xGa_{1-x}N)+\sigma(Al_zGa_{1-z}N/In_yGa_{1-y}N)\}=0$. Accordingly, carriers (electrons) due to polarization effect are not supplied to the $In_yGa_{1-y}N$ channel layer.

In such a case, each of the $In_yGa_{1-y}N$ channel layer and the $Al_xGa_{1-x}N$ lower barrier layer is undoped, and the $Al_zGa_{1-z}N$ contact layer is doped with the shallow n-type impurity (donor). In such a case, a part of carriers (electrons) produced due to ionization of the shallow n-type impurity (donor) present in the $Al_zGa_{1-z}N$ contact layer are supplied to the $In_yGa_{1-y}N$ channel layer and accumulated therein. Because the $Al_zGa_{1-z}N$ contact layer is doped with the shallow n-type impurity (donor), while the $Al_xGa_{1-x}N$ lower barrier layer is undoped, then carriers (electrons) can be accumulated in the interface between the $Al_zGa_{1-z}N$ contact layer and the $In_yGa_{1-y}N$ channel layer, forming the two-dimensional electron gas.

Alternatively, the $In_yGa_{1-y}N$ channel layer may be undoped, but the $Al_zGa_{1-z}N$ contact layer and the $Al_xGa_{1-x}N$ lower barrier layer may be doped with the shallow n-type impurity (donor). In such a case, a part of carriers (electrons) produced due to ionization of the shallow n-type impurity (donor) present in the $Al_zGa_{1-z}N$ contact layer and carriers (electrons) produced due to ionization of the shallow n-type impurity (donor) present in the $Al_xGa_{1-x}N$ lower barrier layer are supplied to the $In_yGa_{1-y}N$ channel layer and accumulated therein. Accordingly, carriers (electrons) do not exist in the $Al_xGa_{1-x}N$ lower barrier layer, and thus, it is depleted, and in the $Al_zGa_{1-z}N$ contact layer, the reform in the vicinity of the interface with the $In_yGa_{1-y}N$ channel layer is depleted. Therefore, in the case of ΔEc $(Al_zGa_{1-z}N/In_yGa_{1-y}N)$=ΔEc $(Al_zGa_{1-z}N/In_yGa_{1-y}N)$, a most part of the carriers (electrons) being supplied to the $In_yGa_{1-y}N$ channel layer are accumulated in the interface between the $Al_zGa_{1-z}N$ contact layer and the $In_yGa_{1-y}N$ channel layer, forming the two-dimensional electron gas.

Further, when the total amount of carriers (electrons) supplied to the $In_yGa_{1-y}N$ channel layer is large, in addition to accumulation in the interface between the $Al_zGa_{1-z}N$ contact layer and the $In_yGa_{1-y}N$ channel layer, a part of carriers (electrons) are accumulated in the interface between the $In_yGa_{1-y}N$ channel layer and the $Al_xGa_{1-x}N$ lower barrier layer, depending on circumstances.

In the semiconductor device according to the present invention, carriers (electrons) travelling in the $In_yGa_{1-y}N$ channel layer are set to exhibit a high mobility in the form of the two-dimensional electron gas. For the purpose, preferably, the $In_yGa_{1-y}N$ channel layer is undoped, thereby concentration of the ionized, shallow n-type impurity (donor) is decreased, so that effect by scattering of the ionized impurity is lowered.

For example, when the semiconductor device according to the present invention is set to be at the "normally ON" state to construct a field effect transistor of the depletion mode type with $V_T$<0 V, in the channel region directly beneath the gate electrode, carriers (electrons) are set to exist in the interface between the $Al_xGa_{1-x}N$ lower barrier layer and the $In_yGa_{1-y}N$ channel layer. In such a case, it is also possible to select a structure in which any part or the whole of the $In_yGa_{1-y}N$ channel layer is doped with the shallow n-type impurity (donor), while suppressing the concentration $N_{SD-barrier}$ of the shallow n-type impurity (donor) with which the $Al_xGa_{1-x}N$ lower barrier layer is doped.

Note that when the $Al_xGa_{1-x}N$ lower barrier layer is doped with the shallow n-type impurity (donor), it is also possible to insert an undoped spacer layer, instead of the structure in which the whole of the $Al_xGa_{1-x}N$ lower barrier layer is uniformly doped with the shallow n-type impurity (donor) with the concentration $N_{SD-barrier}$. For example, the $Al_xGa_{1-x}N$ lower barrier layer is formed in the form of undoped $Al_xGa_{1-x}N$/N-type $Al_xGa_{1-x}N$/undoped $Al_xGa_{1-x}N$, and undoped $Al_xGa_{1-x}N$ is set to exist in the interface between the $Al_xGa_{1-x}N$ lower barrier layer and the $In_yGa_{1-y}N$ channel layer, as well as in the interface between the $Al_xGa_{1-x}N$ lower barrier layer and the buffer layer. In such a case, by setting a film thickness $t_{barrier-Mod}$ of the N-type $Al_xGa_{1-x}N$ portion and concentration $N_{SD-barrier-Mod}$ of the Shallow n-type impurity (donor) to be $\{t_{barrier-Mod} \cdot N_{SD-barrier} \cdot N_{SD-barrier-Mod}\} \approx \{t_{barrier} \cdot N_{SD-barrier}\}$, an equivalent effect can be attained.

Also, when the $Al_zGa_{1-z}N$ contact layer is doped with the shallow n-type impurity (donor), it is also possible to insert an undoped spacer layer, instead of the structure in which the whole of the $Al_zGa_{1-z}N$ contact layer is uniformly doped with the shallow n-type impurity (donor) with the concentration $N_{SD-contact}$. For example, the $Al_zGa_{1-z}N$ contact layer is formed in the form of undoped $Al_zGa_{1-z}N$/N-type $Al_zGa_{1-z}N$, and undoped $Al_zGa_{1-z}N$ is set to exist in the interface between the $Al_zGa_{1-z}N$ contact layer and the $In_yGa_{1-y}N$ channel layer. In such a case, a film thickness $t_{contact-undoped}$ of the undoped $Al_zGa_{1-z}N$ portion is selected within the range of 10 nm≥$t_{contact-undoped}$. On the one hand, by setting the film thickness $t_{contact-Mod}$ of the N-type $Al_zGa_{1-z}N$ portion and the concentration $N_{SD-contact-Mod}$ of the shallow n-type impurity (donor) to be $\{t_{contact-Mod} \cdot N_{SD-contact-Mod}\} \approx \{t_{contact} \cdot N_{SD-contact}\}$, an equivalent effect can be attained.

Further, if in the region where the contact layer exists with the exception of the region where the recessed portion is formed, at any of the "ON state" and the "OFF state", carriers (electrons) are set to be accumulated in the channel layer, forming the two-dimensional electron gas in the heterojunction interface between the contact layer and the channel layer, then, an equivalent effect to that of the present invention can be brought out.

For example, even if the following structures are used, instead of the structure in which the $Al_zGa_{1-z}N$ contact layer is doped with the shallow n-type impurity (donor), and carriers (electrons) are supplied to the $In_yGa_{1-y}N$ channel layer, an equivalent effect can be brought out.

For example, a contact layer composed of InAlGaN is employed, and the band discontinuity ΔEc(InAlGaN/$In_yGa_{1-y}N$) which is a difference in conduction band edge energy between the $In_yGa_{1-y}N$ channel layer and the InAlGaN contact layer is set at ΔEc (InAlGaN/$In_yGa_{1-y}N$)=ΔEc ($Al_zGa_{1-z}N$/$In_yGa_{1-y}N$). Further, in the interface between the InAlGaN contact layer and the $In_yGa_{1-y}N$ channel layer, positive interfacial charges σ(InGaAlN/$In_yGa_{1-y}N$) are set to be produced due to polarization effect. In such a case, the InAlGaN contact layer is set to be doped with the shallow n-type impurity (donor), thereby carriers (electrons) are supplied to the $In_yGa_{1-y}N$ channel layer.

As a result, carriers (electrons) supplied to the $In_yGa_{1-y}N$ channel layer are accumulated in the interface between the InAlGaN contact layer and the $In_yGa_{1-y}N$ channel layer, producing the two-dimensional electron gas. Also, as the InAlGaN contact layer is doped with the shallow n-type impurity (donor), contact resistance of the ohmic electrodes used for the source electrode and the drain electrode can be lowered similarly to the case using the $Al_zGa_{1-z}N$ contact layer doped with the shallow n-type impurity (donor).

As explained above, as long as the following three requirements are satisfied, equivalent effects can be achieved by employing such a contact layer composed of another group III nitride-based semiconductor, instead of $Al_zGa_{1-z}N$:

The band discontinuity ΔEc (contact/channel) in the heterojunction interface between the contact layer and the channel layer can allow carriers (electrons) to be accumulated in the interface between the contact layer and the channel layer, producing the two-dimensional electron gas, in similar to the case of ΔEc ($Al_zGa_{1-z}N$/$In_yGa_{1-y}N$);

Positive interfacial charges a(contact/channel) are produced in the heterojunction interface between the contact layer and the channel layer due to polarization effect;

The lattice constant of the epitaxially grown layer composing the contact layer is set to be equal to the lattice constant $a(Al_xGa_{1-x}N)$ of the $Al_xGa_{1-x}N$ lower barrier layer.

For instance, a group III nitride-based semiconductor which satisfies said three requirements may be selected from the group consisting of GaN, InGaN, InAlN and InAlGaN to be use as the material for the contact layer.

Further, as long as the following three requirements are satisfied, the superlattice structure composed of combination of AlN/GaN may be used, instead of $Al_zGa_{1-z}N$:

The effective lattice constant is equal to the lattice constant $a(Al_zGa_{1-z}N)$ of $Al_zGa_{1-z}N$;

The effective conduction band edge energy $E_C$ allows the band discontinuity ΔEc (contact/channel) in the heterojunction interface between the contact layer and the channel layer to be comparable with ΔEc ($A_zGa_{1-z}N$/$In_yGa_{1-y}N$);

Positive interfacial charges a(contact/channel) are produced in the heterojunction interface between the contact layer and the channel layer due to polarization effect, which are comparable with $\sigma(Al_zGa_{1-z}N/In_yGa_{1-y}N)$.

For example, a superlattice structure composed of combination of AlN/GaN which satisfies said three requirements can be provided by selecting a film thickness ratio of each AlN/GaN pair to be such a low ratio as z: (1−z) and the film thickness sum (repetition period of superlattice) $d_{lattice}$ of each AlN/GaN pair to be within the range of 1 nm≤$d_{lattice}$≤10 nm. Further, when the superlattice structure composed of combination of AlN/GaN which satisfies the above requirements is doped with the shallow n-type impurity (donor), for example, an AlN film may be also selectively doped.

Also when a contact layer composed of another group III nitride-based semiconductor is employed, instead of the $Al_zGa_{1-z}N$ contact layer, for example, for InGaN, InAlN and InAlGaN, a superlattice structure composed of such combination as InN/GaN, InN/AlN and InN/AlGaN, which satisfies quite similar requirements corresponding to the aforementioned three requirements may be used.

Also regarding the $Al_xGa_{1-x}N$ lower barrier layer, even if the following structures are used, instead of the structure in which the $Al_xGa_{1-x}N$ lower barrier layer is doped with the shallow n-type impurity (donor) and carriers (electrons) are supplied to the $In_yGa_{1-y}N$ channel layer, an equivalent effect can be brought out.

For example, a lower barrier layer composed of InAlGaN having the same lattice constant as $Al_xGa_{1-x}N$ is employed, and band discontinuity ΔEc (InAlGaN/$In_yGa_{1-y}N$) which is a difference in conduction band edge energy between the $In_yGa_{1-y}N$ channel layer and the InAlGaN lower barrier layer is set at ΔEc (InAlGaN/$In_yGa_{1-y}N$)=ΔEc ($Al_zGa_{1-z}N/In_yGa_{1-y}N$). Further, in an interface between the InAlGaN lower barrier layer and the $In_yGa_{1-y}N$ channel layer, negative interfacial charges $\sigma(In_yGa_{1-y}N/InAlGaN)$ are set to be produced due to polarization effect. In such a case, the InAlGaN lower barrier layer may be doped with the shallow n-type impurity (donor), thereby carriers (electrons) are supplied to the $In_yGa_{1-y}N$ channel layer.

As a result, carriers (electrons) supplied to the $In_yGa_{1-y}N$ channel layer are accumulated in the interface between the $Al_zGa_{1-z}N$ contact layer and the $In_yGa_{1-y}N$ channel layer, producing the two-dimensional electron gas. Also, in the channel region directly beneath the gate electrode, carriers (electrons) can be set to be accumulated at the "ON state" in the interface between the InAlGaN lower barrier layer and the $In_yGa_{1-y}N$ channel layer, producing the two-dimensional electron gas.

As explained above, as long as the following three requirements are satisfied, equivalent effects can be achieved by employing such a lower barrier layer composed of another group III nitride-based semiconductor, instead of $Al_xGa_{1-x}N$:

The band discontinuity ΔEc (barrier/channel) in the heterojunction interface between the lower barrier layer and the channel layer can allow the two-dimensional electron gas to be produced when carriers (electrons) are accumulated in this interface between the lower barrier layer and the channel layer, similarly to ΔEc ($Al_xGa_{1-x}N/In_yGa_{1-y}N$);

Negative interfacial charges σ(channel/barrier) are produced in the heterojunction interface between the lower barrier layer and the channel layer due to polarization effect;

The lattice constant of the epitaxially grown layer composing the lower barrier layer is equal to the lattice constant $a(Al_xGa_{1-x}N)$ of $Al_xGa_{1-x}N$.

For example, a group III nitride-based semiconductor which satisfies said three requirements may be selected from the group consisting of GaN, InGaN, InAlN and InAlGaN to used as a material for the lower barrier layer.

Further, as long as the following three requirements are satisfied, the superlattice structure composed of combination of AlN/GaN may be used, instead of $Al_xGa_{1-x}N$:

The effective lattice constant is equal to the lattice constant $a(Al_xGa_{1-x}N)$ of $Al_xGa_{1-x}N$;

The effective conduction band edge energy $E_C$ can allow the band discontinuity ΔEc (barrier/channel) in the heterojunction interface between the lower barrier layer and the channel layer to be comparable with ΔEc ($Al_xGa_{1-x}N/In_yGa_{1-y}N$);

Negative interfacial charges a(channel/barrier) are produced in the heterojunction interface between the lower barrier layer and the channel layer due to polarization effect, which are comparable with $\sigma(In_yGa_{1-y}N/Al_xGa_{1-x}N)$.

For example, a superlattice structure composed of combination of AlN/GaN which satisfies the aforementioned three requirements can be provided by selecting a film thickness ratio of each AlN/GaN pair to be such a high ratio as x: (1−x) and the film thickness sum (repetition period of superlattice) $d_{lattice}$ of each AlN/GaN pair to be within the range of 1 nm≤$d_{lattice}$≤10 nm. Further, when the superlattice structure composed of combination of AlN/GaN which satisfies said three requirements is doped with the shallow n-type impurity (donor), for example, an AlN film may be also selectively doped.

Also when a lower barrier layer composed of another group III nitride-based semiconductor is employed, instead of the $Al_xGa_{1-x}N$ lower barrier layer, for example, for InGaN, InAlN and InAlGaN, a superlattice structure composed of such combination as InN/GaN, InN/AlN and InN/AlGaN, which satisfies quite similar requirements corresponding to the aforementioned three requirements may be used.

Also regarding the $In_yGa_{1-y}N$ channel layer, even if the following structures are used, instead of the structure in which the $In_yGa_{1-y}N$ channel layer is doped with the shallow n-type impurity (donor), and carriers (electrons) are accumulated in the $In_yGa_{1-y}N$ channel layer, an equivalent effect can be brought out.

For example, a channel layer composed of InAlGaN having the same lattice constant as $In_yGa_{1-y}N$ is employed, and band discontinuity ΔEc (InAlGaN/$Al_xGa_{1-x}N$) which is a difference in conduction band edge energy between the InAlGaN channel layer and the $Al_xGa_{1-x}N$ lower barrier layer is set at ΔEc (InAlGaN/$Al_xGa_{1-x}N$)=ΔEc ($In_yGa_{1-y}N/Al_xGa_{1-x}N$). Further, in an interface between the InAlGaN channel layer and the $Al_xGa_{1-x}N$ lower barrier layer, negative interfacial charges a(InAlGaN/$Al_xGa_{1-x}N$) are set to be produced due to polarization effect. In such a case, the InAlGaN channel layer is doped with a shallow n-type impurity (donor), thereby carriers (electrons) are accumulated in the InAlGaN channel layer.

As a result, carriers (electrons) accumulated in the InAlGaN channel layer are accumulated in the interface between the $Al_zGa_{1-z}N$ contact layer and the InAlGaN channel layer, producing the two-dimensional electron gas. Also, in the channel region directly beneath the gate electrode, carriers (electrons) can be set to be accumulated at the "ON state" in the interface between the InAlGaN channel layer and the $Al_xGa_{1-x}N$ lower barrier layer, producing the two-dimensional electron gas.

As explained above, as long as the following four requirements are satisfied, equivalent effects can be achieved by employing such a channel layer composed of another group III nitride-based semiconductor, instead of $In_yGa_{1-y}N$:

The band discontinuity ΔEc (barrier/channel) in the heterojunction interface between the lower barrier layer and the channel layer can allow the two-dimensional electron gas to be produced when carriers (electrons) are accumulated in this interface between the lower barrier layer and the channel layer, in similar to the case of ΔEc ($Al_xGa_{1-x}N/In_yGa_{1-y}N$);

Negative interfacial charges σ(channel/barrier) are produced in the heterojunction interface between the lower barrier layer and the channel layer due to polarization effect;

The lattice constant of the epitaxially grown layer composing the channel layer is set to be equal to the lattice constant $a(Al_xGa_{1-x}N)$ of $Al_xGa_{1-x}N$;

The channel layer is doped with the shallow n-type impurity (donor), so that carriers (electrons) are accumulated in the channel layer.

For example, a group III nitride-based semiconductor which satisfies the above four requirements is selected from the group consisting of InN, InGaN, AlGaN, InAlN and InAlGaN to use as a material for the channel layer.

Further, as long as the following three requirements are satisfied, the superlattice structure composed of combination of InN/GaN may be used, instead of $In_yGa_{1-y}N$:

The effective lattice constant is set to equal to the lattice constant $a(In_yGa_{1-y}N)$ of $In_yGa_{1-y}N$;

The effective conduction band edge energy $E_C$ can allow the band discontinuity ΔEc (barrier/channel) in the heterojunction interface between the lower barrier layer and the channel layer to be comparable with ΔEc ($Al_xGa_{1-x}N/In_yGa_{1-y}N$);

Negative interfacial charges σ(channel/barrier) are produced in the heterojunction interface between the lower barrier layer and the channel layer due to polarization effect, which are comparable with σ($In_yGa_{1-y}N/Al_xGa_{1-x}N$).

For example, a superlattice structure composed of combination of InN/GaN which satisfies said three requirements can be provided by selecting a Film thickness ratio of each InN/GaN pair to be such a low ratio as y: (1−y) and the film thickness sum (repetition period of superlattice) $d_{lattice}$ of each InN/GaN pair to be within the range of 1 nm≤$d_{lattice}$≤10 nm. Further, when the superlattice structure composed of combination of InN/GaN which satisfies the above three requirements is doped with a shallow n-type impurity (donor), for example, a GaN film may be also selectively doped.

Also when a channel layer composed of another group III nitride-based semiconductor is employed, instead of the $In_yGa_{1-y}N$ channel layer, for example, for InGaN, AlGaN, InAlGaN and InAlGaN, a superlattice structure composed of such combination as InN/GaN, AlN/GaN, InN/AlN and InN/AlGaN which satisfies similar requirements corresponding to the aforementioned three requirements may be used.

The semiconductor device according to the present invention will be described below in more detail with reference to specific examples. The specific examples shown herein are one example of best modes for carrying out the invention, and the present invention is not limited to structures as shown in these specific examples.

The specific examples described below relate to case examples in which the semiconductor device according to the present invention is constructed as a field effect transistor.

First Exemplary Embodiment

FIG. 1 is a cross-sectional view schematically showing one example of a structure of a semiconductor device according to the first exemplary embodiment.

In the semiconductor device illustrated in FIG. 1, a substrate 40 is a silicon carbide (SiC) substrate having a (0001) plane, a buffer layer 41 is a layer of a AlGaN having gradient composition with a film thickness $t_{buffer\ 4}$, a lower barrier layer 42 is a layer of undoped $Al_{x4}Ga_{1-x4}N$ having a film thickness $t_{barrier\ 4}$, a channel layer 43 is a layer of undoped GaN having a film thickness $t_{channel\ 4}$, and a contact layer 44 is a layer of $Al_{z4}Ga_{1-z4}N$ having a film thickness $t_{contact\ 4}$. Here, an Al composition $z_4$ of the $Al_{z4}Ga_{1-z4}N$ contact layer 44 is set larger than an Al composition $x_4$ of the $Al_{x4}Ga_{1-x4}N$ lower barrier layer 42: $x_4<z_4$. In the hetero interface between the GaN channel layer 43 and the $Al_{z4}Ga_{1-z4}N$ contact layer 44, there is band discontinuity ΔEc ($Al_{z4}Ga_{1-z4}N$/GaN)=Ec ($Al_{z4}Ga_{1-z4}N$)−Ec (GaN) arising from a difference between conduction band energy Ec (GaN) of GaN and conduction band energy Ec ($Al_{z4}Ga_{1-z4}N$) of $Al_{z4}Ga_{1-z4}N$. As a result, in the vicinity of the hetero interface between the GaN channel layer 43 and the $Al_{z4}Ga_{1-z4}N$ contact layer 44, electrons are accumulated, producing a two-dimensional electron gas 47.

On the one hand, in the hetero interface between the GaN channel layer 43 and the $Al_{x4}Ga_{1-x4}N$ lower barrier layer 42, there is band discontinuity ΔEc ($Al_{x4}Ga_{1-x4}N$/GaN)=Ec ($Al_{x4}Ga_{1-x4}N$)−Ec (GaN) arising from a difference between the conduction band energy Ec (GaN) of GaN and conduction band energy Ec ($Al_{x4}Ga_{1-x4}N$) of $Al_{x4}Ga_{1-x4}N$. This band discontinuity ΔEc ($Al_{x4}Ga_{1-x4}N$/GaN) functions as a lower barrier against electrons present in the GaN channel layer 43.

On the $Al_{z4}Ga_{1-z4}N$ contact layer 44, a source electrode 4S and a drain electrode 4D are formed. The source electrode 4S and the drain electrode 4D are in ohmic contact with the $Al_{z4}Ga_{1-z4}N$ contact layer 44. In a region located between the source electrode 4S and the drain electrode 4D, a gate electrode 4G is provided, and thereby a field effect transistor is constructed. In the region located between the source electrode 4S and the drain electrode 4D, a part of the $Al_{z4}Ga_{1-z4}N$ contact layer 44 is etched away to form a recessed portion. On this recessed portion, an insulating film 45 composed of SiN is laminated to cover an exposed front surface of the GaN channel layer 43. In this recessed portion, the gate electrode 4G is formed on an upper surface of the $Al_{z4}Ga_{1-z4}N$ contact layer 44 to be embedded with intervention of the insulating film 45 composed of SiN. An under surface of the gate electrode 4G is set to form schottky contact (MIS junction) with an upper surface of the GaN channel layer 43 via the insulating film 45 composed of SiN.

The semiconductor device having the structure as illustrated in FIG. 1 is fabricated according to the process described below. On the (0001) plane of the SiC substrate 40, respective group 111 nitride-based semiconductor layers described above are grown in sequence with film thicknesses shown in Table 4 below, for example, by Metalorganic Chemical Vapor Deposition (MOCVD) method. Note that the respective group III nitride-based semiconductor layers are C-axis grown on the (0001) plane of the SiC substrate 40.

TABLE 4

| respective group III nitride-based semiconductor layers | film thickness |
| --- | --- |
| undoped AlGaN buffer layer with gradient composition 41 | 1 μm |
| undoped $Al_{x4}Ga_{1-x4}N$ lower barrier layer 42 | 40 nm |
| undoped GaN channel layer 43 | 30 nm |
| undoped $Al_{z4}Ga_{1-z4}N$ contact layer 44 | 40 nm |

In such a case, when the Al composition $x_4$ of the $Al_{x4}Ga_{1-x4}N$ lower barrier layer 42 is set, for example, at $x_4$=0.1, setting the Al composition z4 of the $Al_{z4}Ga_{1-z4}N$ contact layer 44, for example, at $z_4$=0.25 can provide a structure that satisfies the above condition: $x_4<z_4$. On the one hand, an Al composition $x_{4B}$ ($t_{4B}$) of the buffer layer 41 composed of AlGaN having gradient composition is gradually decreased from the substrate 40 ($t_{4B}=0$) toward a front surface of the buffer layer 41 ($t_{4B}=1$ μm). For example, the Al composition $x_{4B}$ ($t_{4B}=0$) of the AlGaN buffer layer with gradient composition 41 is decreased from $x_{4B}$ ($t_{4B}=0$)=1 to $x_{4B}$ ($t_{4B}=1$ μm)=0.1 according to a ratio of $dx_{4B}(t_{4B})/dt_{4B}=-0.9$ μm$^{-1}$.

When $x_4=0.1$ and $z_4=0.25$, then mobility of the two-dimensional electron gas 47 produced in the vicinity of the hetero interface between the GaN channel layer 43 and the $Al_{z4}Ga_{1-z4}N$ contact layer 44 is about 1500 cm$^2$/V$_s$ (20° C.). This mobility of the two-dimensional electron gas 47 is a good value. Also, density $N_{2d-gas\ 4-1}$ of the two-dimensional electron gas 47 accumulated is $N_{2d-gas\ 4.1}=0.9\times10^{13}$ cm$^{-2}$ (20° C.).

The GaN channel layer 43 is undoped and has a low density of an ionized impurity, so that scattering of the ionized impurity is suppressed. Also, the hetero interface between the GaN channel layer 43 and the $Al_{z4}Ga_{1-z4}N$ contact layer 44 is flat in the atomic level, so that interface scattering is also suppressed. Due to this suppression of ionized impurity scattering and interface scattering, the mobility of the two-dimensional electron gas 47 produced in the vicinity of the hetero interface exhibits the good value described above.

In the step of forming the source electrode 4S and the drain electrode 4D, first, on the $Al_{z4}Ga_{1-z4}N$ contact layer 44, for example, metal, such as titanium (Ti), aluminum (Al), nickel (Ni) and gold (Au), is deposited and patterned. Next, ohmic contact is formed, for example, by alloy processing at the temperature of 850° C. for 30 sec in the atomosphere of nitrogen gas.

Next, using a Cl$_2$-based gas, a part of the $Al_{z4}Ga_{1-z4}N$ contact layer 44 is etched away to form the recessed portion. In this recessed portion, a front surface of the GaN channel layer 43 is exposed. After the etching step of the recessed portion, the film thickness $t_{channel\ 4-G}$ of the GaN channel layer 43 in the recessed portion is 25 nm. When a width: $W_{S-D4}$ of the region located between the source electrode 4S and the drain electrode 4D is, for example, $W_{S-D4}=5$ μm, a width: $W_{recess\ 4}$ of this recessed portion is set, for example, at $W_{recess\ 4}=2$ μm. In such a case, a depth $d_{recess\ 4}$ of the recessed portion is set at $d_{recess\ 4}=45$ nm.

Subsequently, an insulating film 45 composed of SiN is formed, for example, by using Plasma-Enhanced Chemical Vapor Deposition (PECVD) method. In such a case, a film thickness of SiN to be formed is selected within the range of $t_{SiN4}=5$ nm-200 nm on a flat region. On the one hand, a film thickness $t_{SiN4-well}$ of SiN to be formed on a surface of a side wall of the recessed portion is usually equal to or less than $t_{SiN4}$.

The semiconductor device illustrated in FIG. 1 is an exemplary embodiment where an angle of tilt of the surface of the side wall of the recessed portion is set 90 degrees, but the angle of tilt may be decreased less than 90 degrees to improve coatability of the surface of the side wall of the recessed portion.

After the insulating film 45 composed of SiN is deposited, metal, such as Ti, platinum (Pt) and Au, is deposited, and the gate electrode 4G is formed by liftoff. The gate electrode 4G formed by liftoff is formed to embed the recessed portion coated with the insulating film 45. An effective gate length $L_{4G-effect}$ of the gate electrode 4G on the bottom of the recessed portion is $L_{4G-effect} \approx W_{recess\ 4}-2\times t_{SiN4-well}$. On the bottom of the recessed portion, the gate electrode 4G is formed on the GaN channel layer 43 with intervention of the insulating film 45 composed of SiN, thereby schottky contact (MIS junction) is constructed. A ratio $L_{4G-effect}/t_{SiN4}$ of the effective gate length $L_{4G-effect}$ of the gate electrode 4G and the film thickness $t_{SiN4}$ of the insulating film directly beneath this gate electrode 4G falls within the range of 400-8 when the film thickness $t_{SiN4}$ is selected within the range of $t_{SiN4}=5$ nm-200 nm.

For example, when $t_{SiN4} \geq 45$ nm, then $d_{recess\ 4}=45$ nm, thereby the recessed portion is embedded by the insulating film 45 composed of SiN. In such a case, on an upper surface of the insulating film 45 composed of SiN, a concave portion having a width corresponding to ($W_{recess\ 4}-2\times t_{SiN4}$) is formed, and the gate electrode 4G is formed to embed this concave portion. In such a case, the effective gate length $L_{4G-effect}$ of the gate electrode 4G corresponds to ($W_{recess\ 4}-2\times t_{SiN4}$).

On the one hand, when $t_{SiN4}=5$ nm, then $d_{recess\ 4}=45$ nm and the amount of overetching ($d_{recess\ 4}-t_{contact\ 4}$)=5 nm are provided, and the amount of overetching ($d_{recess\ 4}-t_{contact\ 4}$) becomes equal to the film thickness $t_{SiN4}$ of the insulating film. Note that particularly, decreasing the film thickness $t_{SiN4}$ of the insulating film less than the amount of overetching ($d_{recess\ 4}-t_{contact\ 4}$) does not cause any problem.

Electron affinity $e_\chi$(SiN) eV of the SiN film used for the insulating film 45, a work function $e\phi$(Ti) eV of Ti and electron affinity $e_\chi$(GaN) eV of GaN used for the channel layer 43 are estimated as $e_\chi$(SiN) eV=1.4 eV, $e\phi$(Ti) eV=4.3 eV and $e_\chi$(GaN) eV=3.9 eV, respectively. Accordingly, due to a difference in the work function, a barrier of $\{e_\chi(SiN)-c\phi(Ti)\}$eV≈2.9 eV is formed in an interface between the SiN insulating film 45 and Ti of the gate electrode 4G, and a barrier (contact potential difference) of $\{e_\chi(SiN)-e_\chi(GaN)\}$eV≈2.5 eV is formed in an interface between the SiN insulating film 45 and the GaN channel layer 43, respectively. Note that in the hetero interface between the GaN channel layer 43 and the $Al_{x4}Ga_{1-x4}N$ lower barrier layer 42, a barrier (contact potential difference) is formed due to the band discontinuity $\Delta E_C$ ($Al_{x4}Ga_{1-x4}N$/GaN). Also, ($e_\chi$(GaN)–c$\phi$(Ti)) eV≈0.4 eV is provided.

Figure 2:
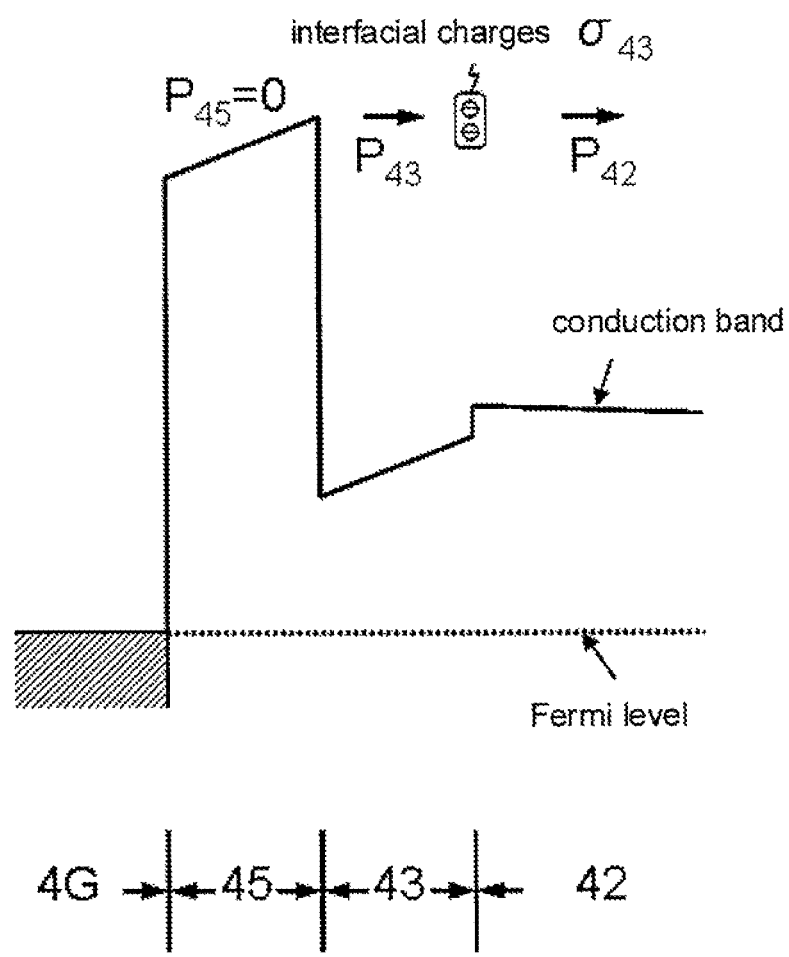
FIG. 2 is a drawing schematically illustrating band diagram of a conduction band for the region directly beneath a gate electrode 4G formed in a recessed portion, in the structure of the semiconductor device according to the first exemplary embodiment illustrated in FIG. 1.

FIG. 2 schematically shows the band diagram of the conduction band in the region directly beneath the gate electrode 4G formed in the recessed portion, in the structure of the semiconductor device according to the first exemplary embodiment shown in FIG. 1. The band diagram of the conduction band shown in FIG. 2 illustrates a state when a gate bias: $V_{G4}$ applied to the gate electrode 4G is set at $V_{G4}=0$ V. Accordingly, potential of Ti of the gate electrode 4G is identical with the Fermi level $E_f$.

The $Al_{x4}Ga_{1-x4}N$ lower barrier layer 42 grown on the (0001) plane becomes lattice-relaxed by providing the AlGaN buffer layer with gradient composition 41 as its underlying layer. A lattice constant a($Al_{x4}Ga_{1-x4}N$) of $Al_{x4}Ga_{1-x4}N$ of this lower barrier layer 42 is approximately expressed as a ($Al_{x4}Ga_{1-x4}N$)≈$x_4$·a(AlN)+(1−$x_4$)·a(GaN) by using a lattice constant a(AlN) of AlN and a lattice constant a(GaN) of GaN.

On the one hand, for both of the GaN channel layer 43 and the $Al_{z4}Ga_{1-z4}N$ contact layer 44 formed on the $Al_{x4}Ga_{1-x4}N$ lower barrier layer 42, their lattice constants a become substantially identical with the lattice constant a($Al_{x4}Ga_{1-x4}N$) of $Al_{x4}Ga_{1-x4}N$ of the lower barrier layer 42 because of their thin film thickness. That is, in the GaN channel layer 43, compressive strain arises in which the original lattice constant a(GaN) changes to the lattice constant a($Al_{x4}Ga_{1-x4}N$). Also, in the $Al_{z4}Ga_{1-z4}N$ contact layer 44, tensile strain arises in which the original lattice constant a($Al_{z4}Ga_{1-z4}N$) changes to the lattice constant a($Al_{x4}Ga_{1-x4}N$).

Because strain $e_{ZZ}$ to lattice strain does not substantially exist in the $Al_{x4}Ga_{1-x4}N$ lower barrier layer 42, piezo polarization: $P_{pe}(Al_{x4}Ga_{1-x4}N)$ does not arise therein. However, spontaneous polarization: $P_{sp}(Al_{x4}Ga_{1-x4}N)$ exists in the $Al_{x4}Ga_{1-x4}N$ lower barrier layer 42. In the case of C-axis growth, the direction of this spontaneous polarization: $P_{sp}(Al_{x4}Ga_{1-x4}N)$ is oriented from the front surface toward the substrate. Accordingly, polarization $P_{42}$ present in the $Al_{x4}Ga_{1-x4}N$ lower barrier layer 42 is generally the sum of the piezo polarization: $P_{pe}(Al_{x4}Ga_{1-x4}N)$ and the spontaneous polarization: $P_{sp}(Al_{x4}Ga_{1-x4}N)$, that is, $P_{42}=P_{sp}(Al_{x4}Ga_{1-x4}N)+P_{pe}(Al_{x4}Ga_{1-x4}N)$. In such a case, because of $P_{pe}(Al_{x4}Ga_{1-x4}N)\approx 0$, the polarization $P_{42}$ present in the $Al_{x4}Ga_{1-x4}N$ lower barrier layer 42 is approximated by $P_{42}\approx P_{sp}(Al_{x4}Ga_{1-x4}N)$.

On the one hand, compressive strain $e_{ZZ}(GaN)\approx\{a(Al_{x4}Ga_{1-x4}N)-a(GaN)\}/a(GaN)$ exists in the GaN channel layer 43 arising from lattice strain, and piezo polarization: $P_{pe}(GaN)$ arises. This piezo polarization: $P_{pe}(GaN)$ is approximately expressed by $P_{pe}(GaN)\approx 2e_{ZZ}(GaN)[e_{31}(GaN)-e_{33}(GaN)\cdot\{C_{31}(GaN)/C_{33}(GaN)\}]$ by using piezoelectric constants $e_{31}(GaN)$ and $e_{33}(GaN)$, and elastic constants $C_{13}(GaN)$ and $C_{33}(GaN)$ of GaN. Further, spontaneous polarization: $P_{sp}(GaN)$ also exists. In the case of C-axis growth, the direction of the spontaneous polarization: $P_{sp}(GaN)$ is oriented from the front surface toward the substrate. The piezo polarization: $P_{pe}(GaN)$ arising from the compressive strain $e_{ZZ}$ has the direction in which the spontaneous polarization: $P_{sp}(GaN)$ is set off. Accordingly, polarization $P_{43}$ present in the GaN channel layer 43 is generally the sum of the piezo polarization: $P_{pe}(GaN)$ and the spontaneous polarization: $P_{sp}(GaN)$, that is, $P_{43}=P_{sp}(GaN)+P_{pe}(GaN)<P_{sp}(GaN)$.

The SiN insulating film 45 is a polycrystalline or amorphous film. Therefore, the SiN insulating film 45 does not exhibit anisotropy as a whole and create polarization. That is, polarization $P_{45}$ in the SiN insulating film 45 is $P_{45}=0$.

Generally, if there is a distribution of polarization P, polarization charges $\sigma(P)$ produced due to the distribution of polarization P is expressed as follows.

$\sigma(P)=-\nabla\cdot P$ ($\nabla$: nabla operator)

The polarization P exhibits discontinuous change from $P_{43}$ to $P_{42}$ in the interface between the GaN channel layer 43 and the $Al_{x4}Ga_{1-x4}N$ lower barrier layer 42. Accordingly, in this interface, sheet-like polarization charges $\sigma_{43}$ arise. Interfacial charge density $\sigma_{43}/q$ produced in the interface is $\sigma_{43}/q=(P_{43}-P_{42})/q$, (where, q is the charge amount of electron (unit charge)).

The polarization P exhibits discontinuous change from $P_{45}$ to $P_{43}$ also in the interface between the SiN insulating film 45 and the GaN channel layer 43. Accordingly, in this interface, sheet-like polarization charges $\sigma_{45}$ arise. Interfacial charge density $\sigma_{45}/q$ produced in the interface is $\sigma_{45}/q=(P_{45}-P_{43})/q$. On the one hand, in the interface between the SiN insulating film 45 and the GaN channel layer 43, an interface state is generated with a considerable sheet density. Therefore, interfacial charges produced in the interface are compensated by such an interface state, and in the interface between the SiN insulating film 45 and the GaN channel layer 43, effective accumulation of the interfacial charges produced is not observed.

The polarization $P_{42}$ present in the $Al_{x4}Ga_{1-x4}N$ lower barrier layer 42 and the polarization $P_{43}$ present in the GaN channel layer 43 depend on the Al composition $(x_4)$ of $Al_{x4}Ga_{1-x4}N$ composing the lower barrier layer 42. For example, when $x_4=0.1$, computation provides $P_{42}/q=2.13\times 10^{13}$ cm$^{-3}$ and $P_{43}/q=1.61\times 10^{13}$ cm$^{-2}$. In such a case, the interfacial charge density $\sigma_{43}/q$ produced in the interface between the GaN channel layer 43 and the $Al_{x4}Ga_{1-x4}N$ lower barrier layer 42 is estimated as $\sigma_{43}/q=(P_{43}-P_{42})/q=-5.28\times 10^{12}$ cm$^{-2}$.

When the gate bias $V_{G4}$ is set at $V_{G4}=0$ V, electrons arising from ionization of the n-type impurity are not supplied if both of the $Al_{x4}Ga_{1-x4}N$ lower barrier layer 42 and the GaN channel layer 43 are undoped, and therefore, only an electric field exists that is produced in the interface between the GaN channel layer 43 and the $Al_{x4}Ga_{1-x4}N$ lower barrier layer 42, arising from the interfacial charges $\sigma_{43}$. Consequently, as shown in FIG. 2, a conduction band edge $E_C(43)$ in the GaN channel layer 43 is energetically located higher than the Fermi level $E_f$. In other words, in the GaN channel layer 43, carriers (electrons) become absent. Accordingly, a field effect transistor having the MIS-type gate structure is at the "normally OFF state". By applying a positive voltage $(V_{G4}>0)$ to the gate electrode 4G, electrons are accumulated in the interface between the SiN insulating film 45 and the GaN channel layer 43, producing the two-dimensional electron gas, resulting in being at the "ON state". A threshold voltage $V_T$ of the gate bias: $V_{G4}$ for switching the "OFF state" to the "ON state" is a positive voltage, and the semiconductor device functions as a field effect transistor of the enhancement mode type.

At the "ON state", electrons accumulated in the vicinity of the interface between the SiN insulating film 45 and the GaN channel layer 43 travel directly beneath the gate electrode 4G. Mobility of the electrons is affected by ionized impurity scattering of an ionized impurity present in the GaN channel layer 43, as well as interface scattering due to disturbance of the interface between the SiN insulating film 45 and the GaN channel layer 43. Because the GaN channel layer 43 is undoped, the ionized impurity scattering is suppressed not to affect mobility of the two-dimensional electron gas produced in the vicinity of the interface between the SiN insulating film 45 and the GaN channel layer 43, resulting in an improved electron mobility.

Figure 3:
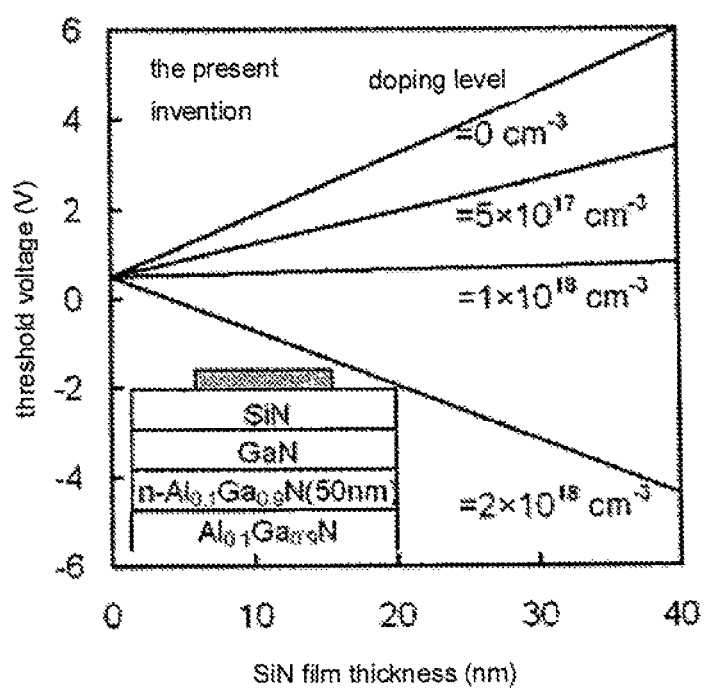
FIG. 3 is a graph showing dependency of a threshold voltage $V_T$(V), which is corresponding to a gate voltage applied to a gate electrode to turn on the field effect transistor, on a film thickness of a gate insulating film in the structure of the semiconductor device according to the first exemplary embodiment illustrated in FIG. 1.

FIG. 3 shows dependency of the threshold voltage $V_T$ on the film thickness of the SiN insulating film 45, which is estimated by solving the Poisson equation for the field effect transistor having the MIS-type gate structure illustrated in FIG. 1.

In this exemplary embodiment, when undoped $Al_{x4}Ga_{1-x4}N$ is employed for the $Al_{x4}Ga_{1-x4}N$ lower barrier layer 42, and undoped GaN is employed for the GaN channel layer 43, then both concentrations $N_{SD42}$ and $N_{SD43}$ of their n-type impurity (donor) are ideally 0 cm$^{-3}$. When $N_{SD42}=0$ cm$^{-3}$ and $N_{SD43}=0$ cm$^{-3}$, then from FIG. 3, the threshold voltage $V_T$ becomes a positive voltage, regardless of the film thickness $t_{SiN4}$ of the SiN insulating film 45, and the semiconductor device functions as a transistor of the enhancement mode type. Actually, undoped AlGaN and undoped GaN contain a certain quantity of residual n-type impurity. Even in such a case, $N_{SD43}=0$ cm$^{-3}$ is provided, and in the range where the concentration $N_{SD42}$ of the shallow n-type impurity (donor) in the $Al_{x4}Ga_{1-x4}N$ lower barrier layer 42 is equal to or less than $1\times 10^{18}$ cm$^{-3}$, the threshold voltage $V_T$ becomes a positive voltage, regardless of the film thickness $t_{SiN4}$ of the SiN insulating film 45. However, when the concentration $N_{SD42}$ of the shallow n-type impurity (donor) exceeds $1\times 10^{18}$ cm$^{-3}$, then the threshold voltage $V_T$ may become a negative voltage, dependent on the film thickness $t_{SiN4}$ of the SiN insulating film 45.

As described above, in this exemplary embodiment, in the hetero interface between the GaN channel layer 43 and the $Al_{x4}Ga_{1-x4}N$ lower barrier layer 42, negative polarization interfacial charges $\sigma_{43}$ arise. Accordingly, when $N_{SD43}=0$ cm$^{-3}$, and sheet density $(N_{SD42}\cdot t_{barrier\ 4})$ of the n-type impurity is smaller than polarization charge sheet density $|\sigma_{43}|/q$, then the GaN channel layer 43 becomes depleted in the thermal equilibrium state of $V_G=0$ V, resulting in $V_T>0$ V. On the one hand, the sheet density $(N_{SD42} \cdot t_{barrier\ 4})$ of the n-type impurity is larger than the polarization charge sheet density $|\sigma_{43}|/q$, then the two-dimensional electron is produced at $V_G=0$ V, resulting in $V_T<0$ V. In the calculation shown in FIG. 3, it is supposed that the thickness $t_{barrier\ 4}$ of the $Al_{x4}Ga_{1-x4}N$ lower barrier layer 42 is 50 nm, and the condition $N_{SD42}=1\times 10^{18}$ cm$^{-3}$ turns into the condition $N_{SD42} \cdot t_{barrier\ 4}=5\times 10^{12}$ cm$^{-2}$, thereby $N_{SD42} \cdot t_{barrier\ 4}$ becomes equal to $|\sigma_{43}|/q$ ($=5.28\times 10^{12}$ cm$^{-2}$), so that the condition is satisfied.

Therefore, in this exemplary embodiment, it has been found that $N_{SD45}=0$ cm$^{-3}$ is set, and the sheet density $(N_{SD42} \cdot t_{barrier\ 4})$ of the concentration of the shallow n-type impurity (donor) in the $Al_{x4}Ga_{1-x4}N$ lower barrier layer 42 is set within the range of sufficiently smaller than the polarization charge sheet density $|\sigma_{43}|/q$, thereby the threshold voltage $V_T$ can be set to become a positive voltage, regardless of the film thickness $t_{SiN4}$ of the SiN insulating film 45. In the case of $N_{SD43}=0$ cm$^{-3}$, even if the Al composition $x_4$ of the $Al_{x4}Ga_{1-x4}N$ lower barrier layer 42, the film thickness $t_{barrier\ 4}$, and the residual impurity concentration $N_{SD42}$ and the like are slightly varied, then the threshold voltage can be kept within the range of $V_T>0$ V, which can allow a field effect transistor of the enhancement mode type to be stably fabricated.

For example, in the case of $N_{SD42}=0$ cm$^{-3}$ and $N_{SD43}=0$ cm$^{-3}$, in the band diagram of the conduction band in the region directly beneath the gate electrode 4G in the thermal equilibrium state of $V_G=0$ V shown in FIG. 2, the conduction band energy $E_C(43)$ of the GaN channel layer 43 in the hetero interface between the GaN channel layer 43 and the $Al_{x4}Ga_{1-x4}N$ lower barrier layer 42 is located higher than the Fermi level $E_f$. A difference $\{E_C(43)-E_f\}$ between the conduction band energy $E_C(43)$ of the GaN channel layer 43 and the Fermi level $E_f$ in the hetero interface depends on the film thickness $t_{SiN4}$ of the SiN insulating film 45.

As shown in FIG. 3, when undoped GaN is employed for the GaN channel layer 43 and $N_{SD43}=0$ cm$^{-3}$, then dependency of the threshold voltage $V_T$ on the film thickness $t_{SiN4}$ of the SiN insulating film 45 varies dependent on the concentration $N_{SD42}$ of the shallow n-type impurity (donor) in the $Al_{x4}Ga_{1-x4}N$ lower barrier layer 42. For example, even in the case of $N_{SD42}=0$ cm$^{-3}$, the amount of change $\Delta V_T$ of the threshold voltage $V_T$ is as relatively small as about 0.14 V when the film thickness $t_{SiN4}$ of the SiN insulating film 45 varies by 1 nm. Accordingly, uniformity and reproducibility of the threshold voltage $V_T$ are good against change in the film thickness $t_{SiN4}$ of the insulating film 45.

A contact potential difference $\{e_\chi(SiN)-e\phi(Ti)\}$ eV due to a difference between electron affinity $e_\chi(SiN)$ eV of the SiN film composing the insulating film 45 and a work function $e\phi(Ti)$ eV of Ti of the gate electrode 4G in contact with this SiN film is as large as about 2.9 eV. Accordingly, when a gate having the MIS structure of Ti/SiN/GaN is employed, a barrier height $\Phi_{barrier}$ of schottky junction (MIS junction) is increased higher than that of schottky junction of usual MES-type. Accordingly, in the field effect transistor having the MIS-type gate structure illustrated in FIG. 1, forward gate breakdown voltage is also good when the schottky junction (MIS junction) of gate is forward biased.

The small dependency of the threshold voltage $V_T$ on the film thickness of the insulating film when undoped GaN is employed for the GaN channel layer 43 and $N_{SD43}=0$ cm$^{-3}$ means that an internal electric field applied to the insulating film 45 is small when the schottky junction (MIS junction) of gate is reverse biased. Accordingly, a tunnel current component is suppressed at the reverse bias, and a reverse leakage current is also decreased.

Figure 4:
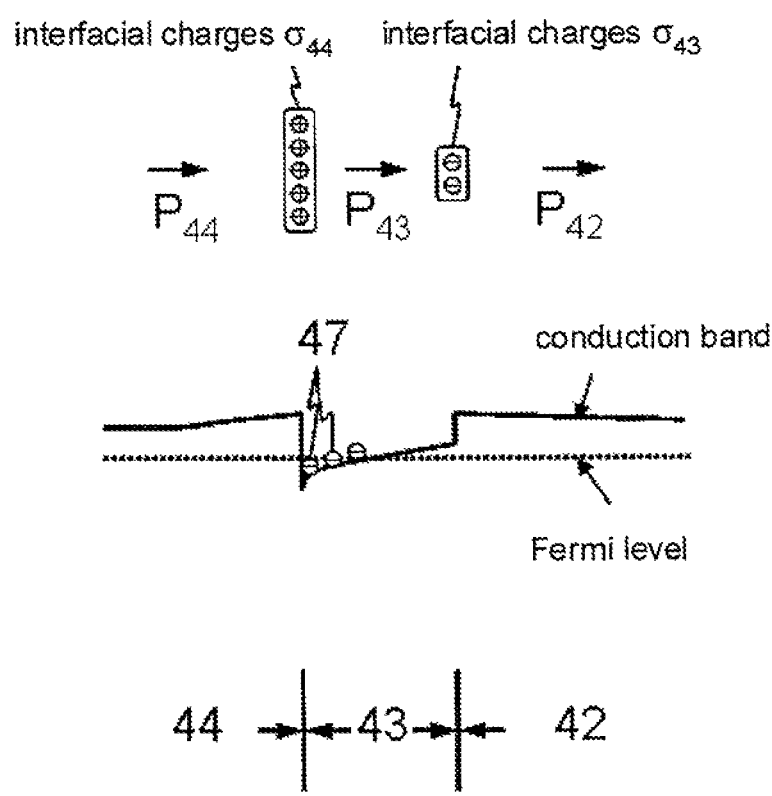
FIG. 4 is a drawing schematically illustrating band diagram of a conduction band for the region directly beneath an undoped $Al_{z4}Ga_{1-z4}N$ contact layer 44, in the structure of the semiconductor device according to the first exemplary embodiment illustrated in FIG. 1.

FIG. 4 schematically shows the band diagram of the conduction band for the region where the $Al_{z4}Ga_{1-z4}N$ contact layer 44 exists with the exception of the recessed portion, in the structure of the semiconductor device according to the first exemplary embodiment illustrated in FIG. 1.

The $Al_{x4}Ga_{1-x4}N$ lower barrier layer 42 grown on the (0001) plane is lattice-relaxed by providing the AlGaN buffer layer with gradient composition 41 as its underlying layer. A lattice constant $a(Al_{x4}Ga_{1-x4}N)$ of $Al_{x4}Ga_{1-x4}N$ of this lower barrier layer 42 is approximately expressed as $a(Al_{x4}Ga_{1-x4}N)\approx x_4 \cdot a(AlN)+(1-x_4)\cdot a(GaN)$ by using a lattice constant $a(AlN)$ of AlN and a lattice constant $a(GaN)$ of GaN.

On the one hand, for both of the GaN channel layer 43 and the $Al_{z4}Ga_{1-z4}N$ contact layer 44 formed on the $Al_{x4}Ga_{1-x4}N$ lower barrier layer 42, their lattice constants a become substantially identical with the lattice constant $a(Al_{x4}Ga_{1-x4}N)$ of $Al_{x4}Ga_{1-x4}N$ of the lower barrier layer 42 because of their thin film thickness. That is, in the GaN channel layer 43, compressive strain arises in which the original lattice constant $a(GaN)$ changes to the lattice constant $a(Al_{x4}Ga_{1-x4}N)$. Also, in the $Al_{z4}Ga_{1-z4}N$ contact layer 44, tensile strain arises in which the original lattice constant $a(Al_{z4}Ga_{1-z4}N)$ changes to the lattice constant $a(Al_{x4}Ga_{1-x4}N)$.

Also in such a case, because of $P_{pe}(Al_{x4}Ga_{1-x4}N)\approx 0$, polarization $P_{42}$ present in the $Al_{x4}Ga_{1-x4}N$ lower barrier layer 42 is approximated by $P_{42}\approx P_{sp}(Al_{x4}Ga_{1-x4}N)$.

On the one hand, compressive strain $e_{ZZ}(GaN)\approx\{a(Al_{x4}Ga_{1-x4}N)-a(GaN)\}/a(GaN)$ exists in the GaN channel layer 43, arising from lattice strain, and piezo polarization: $P_{pe}(GaN)$ arises. This piezo polarization: $P_{pe}(GaN)$ is approximately expressed by $P_{pe}(GaN)\approx 2e_{ZZ}(GaN)[e_{31}(GaN)-e_{33}(GaN)\cdot\{C_{31}(GaN)/C_{33}(GaN)\}]$ by using piezoelectric constants $e_{31}(GaN)$ and $e_{33}(GaN)$, and elastic constants $C_{13}(GaN)$ and $C_{33}(GaN)$ of GaN. Further, spontaneous polarization: $P_{sp}(GaN)$ also exists. In the case of C-axis growth, the direction of the spontaneous polarization: $P_{sp}(GaN)$ is oriented from the front surface toward the substrate. The piezo polarization: $P_{pe}(GaN)$ arising from the compressive strain $e_{ZZ}$ has the direction in which the spontaneous polarization: $P_{sp}(GaN)$ is set off. Accordingly, polarization $P_{43}$ present in the GaN channel layer 43 is generally the sum of the piezo polarization: $P_{pe}(GaN)$ and the spontaneous polarization: $P_{sp}(GaN)$, that is, $P_{43}=P_{sp}(GaN)+P_{pe}(GaN)<P_{sp}(GaN)$.

Further, tensile strain $e_{ZZ}(Al_{z4}Ga_{1-z4}N)\approx\{a(Al_{x4}Ga_{1-x4}N)-a(Al_{z4}Ga_{1-z4}N)\}/a(Al_{z4}Ga_{1-z4}N)$ exists in the $Al_{z4}Ga_{1-z4}N$ contact layer 44, arising from lattice strain, and piezo polarization: $P_{pe}(Al_{z4}Ga_{1-z4}N)$ arises. The piezo polarization: $P_{pe}(Al_{z4}Ga_{1-z4}N)$ is approximately expressed by $P_{pe}(Al_{z4}Ga_{1-z4}N)\approx 2e_{ZZ}(Al_{z4}Ga_{1-z4}N)[e_{31}(Al_{z4}Ga_{1-z4}N)-e_{33}(Al_{z4}Ga_{1-z4}N)\cdot\{C_{31}(Al_{z4}Ga_{1-z4}N)/C_{33}(Al_{z4}Ga_{1-z4}N)\}]$ by using piezoelectric constants $e_{31}(Al_{z4}Ga_{1-z4}N)$ and $e_{33}(Al_{z4}Ga_{1-z4}N)$, and elastic constants $C_{13}(Al_{z4}Ga_{1-z4}N)$ and $C_{33}(Al_{z4}Ga_{1-z4}N)$ of $Al_{z4}Ga_{1-z4}N$. Further, spontaneous polarization: $P_{sp}(Al_{z4}Ga_{1-z4}N)$ also exists. In the case of C-axis growth, the direction of the spontaneous polarization: $P_{sp}(Al_{z4}Ga_{1-z4}N)$ is oriented from the front surface toward the substrate. The piezo polarization: $P_{pe}(Al_{z4}Ga_{1-z4}N)$ arising from the tensile strain $e_{ZZ}$ has the same direction as the spontaneous polarization: $P_{sp}(Al_{z4}Ga_{1-z4}N)$. Accordingly, polarization $P_{44}$ present in the $Al_{z4}Ga_{1-z4}N$ contact layer 44 is generally the sum of the piezo polarization: $P_{pe}(Al_{z4}Ga_{1-z4}N)$ and the spontaneous polarization: $P_{sp}(Al_{z4}Ga_{1-z4}N)$, that is, $P_{44}=P_{sp}(Al_{z4}Ga_{1-z4}N)+P_{pe}(Al_{z4}Ga_{1-z4}N)>P_{sp}(Al_{z4}Ga_{1-z4}N)$.

Polarization P exhibits discontinuous change from $P_{43}$ to $P_{42}$ in the interface between the GaN channel layer 43 and the $Al_{x4}Ga_{1-x4}N$ lower barrier layer 42. Accordingly, in this interface, sheet-like polarization charges $\sigma_{43}$ arise. Interfacial charge density $\sigma_{43}/q$ produced in this interface is $\sigma_{43}/q=(P_{43}-P_{42})/q$, (where, q is the charge amount of electron (unit charge)). Further, also in the interface between the $Al_{z4}Ga_{1-z4}N$ contact layer 44 and the GaN channel layer 43, the polarization P exhibits discontinuous change from $P_{44}$ to $P_{43}$. Accordingly, sheet-like polarization charges $\sigma_{44}$ are produced in this interface. Interfacial charge density $\sigma_{44}/q$ produced in the interface is $\sigma_{44}/q=(P_{44}-P_{43})/q$.

The polarization $P_{42}$ present in the $Al_{x4}Ga_{1-x4}N$ lower barrier layer 42, the polarization $P_{43}$ present in the GaN channel layer 43 and the polarization $P_{44}$ present in the $Al_{z4}Ga_{1-z4}N$ contact layer 44 depend on the Al composition ($x_4$) of $Al_{x4}Ga_{1-x4}N$ composing the lower barrier layer 42 and the Al composition ($z_4$) of $Al_{z4}Ga_{1-z4}N$ composing the contact layer 44. For example, when $x_4=0.1$ and $z_4=0.25$, then computation provides $P_{42}/q=2.13\times10^{13}$ cm$^{-2}$, $P_{43}/q=1.61\times10^{13}$ cm$^{-2}$ and $P_{44}=2.97\times10^{13}$ cm$^{-2}$. In such a case, interfacial charge density $\sigma_{43}/q$ produced in the interface between the GaN channel layer 43 and the $Al_{x4}Ga_{1-x4}N$ lower barrier layer 42 is estimated as $\sigma_{43}/q=(P_{43}-P_{42})/q=-5.28\times10^{12}$ cm$^{-2}$. Interfacial charge density $\sigma_{44}/q$ produced in the interface between the $Al_{z4}Ga_{1-z4}N$ contact layer 44 and the GaN channel layer 43 is estimated as $\sigma_{44}/q=(P_{44}-P_{43})/q=+1.36\times10^{13}$ cm$^{-2}$.

In the hetero interface between the GaN channel layer 43 and the $Al_{x4}Ga_{1-x4}N$ lower barrier layer 42, there is formed a barrier (contact potential difference) arising from band discontinuity $\Delta E_C(Al_{x4}Ga_{1-x4}N/GaN)$. In the hetero interface between the $Al_{z4}Ga_{1-z4}N$ contact layer 44 and the GaN channel layer 43, there is formed a barrier (contact potential difference) arising from band discontinuity $\Delta E_C(Al_{z4}Ga_{1-z4}N/GaN)$. In such a case, the Al composition (x4) of $Al_{x4}Ga_{1-x4}N$ composing the lower barrier layer 42 and the Al composition ($z_4$) of $Al_{z4}Ga_{1-z4}N$ composing the contact layer 44 are set to be $z_4>x_4$, resulting in $\Delta E_C(Al_{z4}Ga_{1-z4}N/GaN)>\Delta E_C(Al_{x4}Ga_{1-x4}N/GaN)$.

In the case of $z_4=0.25$ and $x_4=0.1$, in the interface between the GaN channel layer 43 and the $Al_{x4}Ga_{1-x4}N$ lower barrier layer 42, negative interfacial charges ($\sigma_{43}$) arise, and in the interface between the $Al_{z4}Ga_{1-z4}N$ contact layer 44 and the GaN channel layer 43, positive interfacial charges ($\sigma_{44}$) arise, and the total sum ($\sigma_{44}+\sigma_{43}$) is ($\sigma_{44}+\sigma_{43}$)>0.

As a result, a conduction band edge $E_C(43)$ of the GaN channel layer 43 becomes lower than the Fermi level $E_f$ in the vicinity of the interface between the $Al_{z4}Ga_{1-z4}N$ contact layer 44 and the GaN channel layer 43. That is, electrons are accumulated in the vicinity of the interface between the $Al_{z4}Ga_{1-z4}N$ contact layer 44 and the GaN channel layer 43, forming the two-dimensional electron gas 47. When any of the $Al_{z4}Ga_{1-z4}N$ contact layer 44, the GaN channel layer 43 and the $Al_{x4}Ga_{1-x4}N$ lower barrier layer 42 is undoped, sheet-carrier density $N_{2d\text{-}gas\,4\text{-}1}$ of the two-dimensional electron gas 47 to be accumulated is estimated as $N_{2d\text{-}gas\,4\text{-}1}\approx(\sigma_{44}+\sigma_{43})/q$.

A conventional semiconductor device of the enhancement mode type has such a problem that carriers present between the source and the gate, and between the gate and the drain become depleted, so that access resistance is increased. In contrast, the semiconductor device according to the first exemplary embodiment has the two-dimensional electron gas 47 present in the interface of the channel layer 43 with the contact layer 44, regardless of being the field effect transistor of the enhancement mode type. Accordingly, channel resistance between the source and the gate, and between the gate and the drain is decreased, and parasitic resistance is lowered.

Second Exemplary Embodiment

Figure 5:
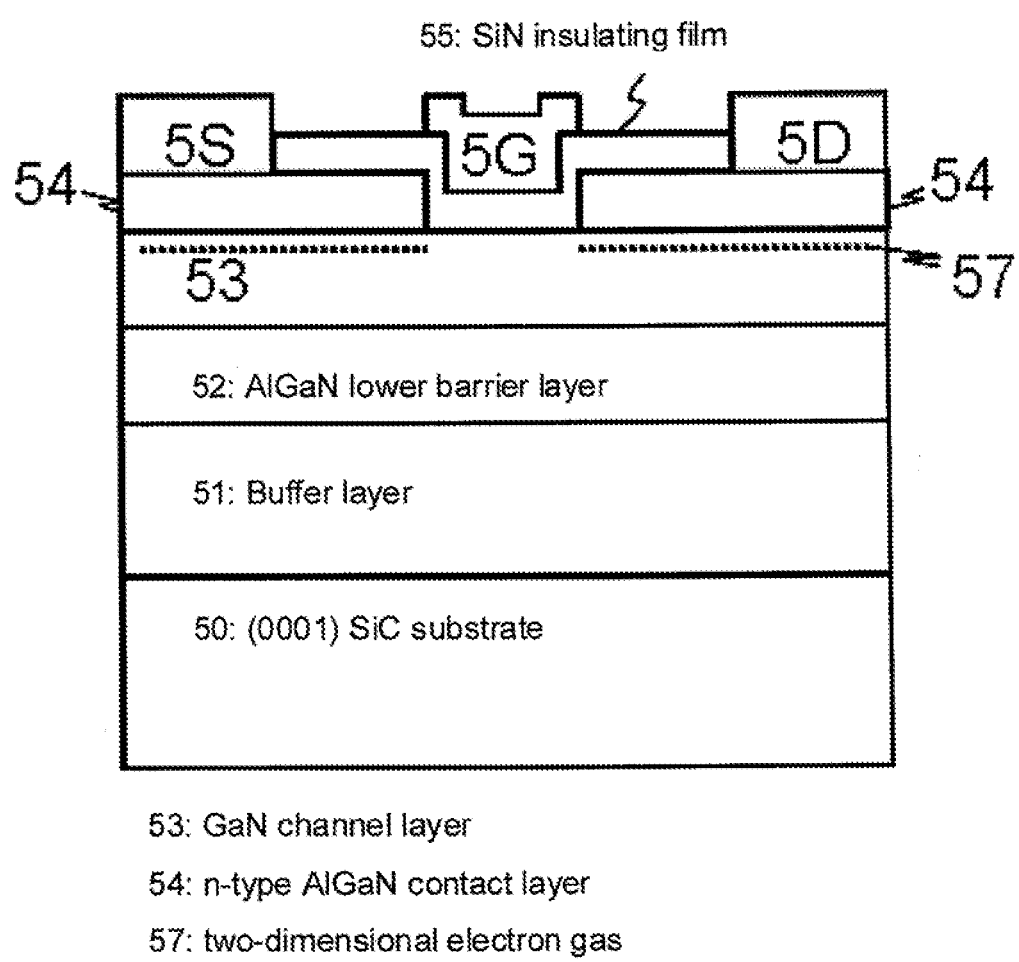
FIG. 5 is a cross-sectional view schematically showing a structure of a semiconductor device according to the second exemplary embodiment.

FIG. 5 is a cross-sectional view schematically showing one example of a structure of a semiconductor device according to the second exemplary embodiment.

In the semiconductor device illustrated in FIG. 5, a substrate 50 is a silicon carbide (SiC) substrate having a (0001) plane, a buffer layer 51 is a layer of a AlGaN with gradient composition having a film thickness $t_{buffer\,5}$, a lower barrier layer 52 is a layer of undoped $Al_{x5}Ga_{1-x5}N$ having a film thickness $t_{barrier\,5}$, a channel layer 53 is a layer of undoped GaN having a film thickness $t_{channel\,5}$, and a contact layer 54 is a layer of N-type $Al_{z5}Ga_{1-z5}N$ having a film thickness $t_{contact\,5}$. Here, an Al composition $z_5$ of the $Al_{z5}Ga_{1-z5}N$ contact layer 54 is set equal to an Al composition $x_5$ of the $Al_{x5}Ga_{1-x5}N$ lower barrier layer 52. For example, they are set at $x_5=z_5=0.1$. The N-type $Al_{z5}Ga_{1-z5}N$ layer composing the contact layer 54 is doped with a shallow n-type impurity for forming a shallow donor level. For example, as the shallow n-type impurity for forming a shallow donor level, silicon (Si) is used. Concentration $N_{SD54}$ of the shallow n-type impurity doped in the N-type $Al_{z5}Ga_{1-z5}N$ layer composing the contact layer 54 is set, for example, at $5\times10^{18}$ cm$^{-3}$.

In the hetero interface between the GaN channel layer 53 and the $Al_{z5}Ga_{1-z5}N$ contact layer 54, there is band discontinuity $\Delta E_C(Al_{z5}Ga_{1-z5}N/GaN)=E_C(Al_{z5}Ga_{1-z5}N)-E_C(GaN)$ arising from a difference between conduction band energy $E_C(GaN)$ of GaN and conduction band energy $E_C(Al_{z5}Ga_{1-z5}N)$ of $Al_{z5}Ga_{1-z5}$. As a result, in the vicinity of the hetero interface between the GaN channel layer 53 and the $Al_{z5}Ga_{1-z5}N$ contact layer 54, electrons are accumulated, producing a two-dimensional electron gas 57.

On the one hand, in the hetero interface between the GaN channel layer 53 and the $Al_{x5}Ga_{1-x5}N$ lower barrier layer 52, there is band discontinuity $\Delta E_C(Al_{x5}Ga_{1-x5}N/GaN)=E_C(Al_{x5}Ga_{1-x5}N)-E_C(GaN)$ arising from a difference between the conduction band energy $E_C(GaN)$ of GaN and conduction band energy $E_C(Al_{x5}Ga_{1-x5}N)$ of $Al_{x5}Ga_{1-x5}N$. This band discontinuity $\Delta E_C(Al_{x5}Ga_{1-x5}N/GaN)$ functions as a lower barrier against electrons present in the GaN channel layer 53.

On the $Al_{z5}Ga_{1-z5}N$ contact layer 54, a source electrode 5S and a drain electrode 5D are formed. The source electrode 5S and the drain electrode 5D are in ohmic contact with the $Al_{z5}Ga_{1-z5}N$ contact layer 54. In a region located between the source electrode 5S and the drain electrode 5D, a gate electrode 5G is provided, and thereby, a field effect transistor is constructed. In the region located between the source electrode 5S and the drain electrode 5D, a part of the $Al_{z5}Ga_{1-z5}N$ contact layer 54 is etched away to form a recessed portion. On this recessed portion, an insulating film 55 composed of SiN is laminated to cover an exposed front surface of the GaN channel layer 53. In the recessed portion, the gate electrode 5G is formed on an upper surface of the $Al_{z5}Ga_{1-z5}N$ contact layer 54 to be embedded with intervention of the insulating film 55 composed of the SiN. An under surface of the gate electrode 5G is set to be form schottky contact (MIS junction) with an upper surface of the GaN channel layer 53 via the insulating film 55 composed of the SiN.

The semiconductor device having the structure as illustrated in FIG. 5 is fabricated according to the process described below. On the (0001) plane of the SiC substrate 50, respective group III nitride-based semiconductor layers described above are grown in sequence with film thicknesses shown in Table 5, for example, by MOCVD method. Note that the respective group III nitride-based semiconductor layers are C-axis grown on the (0001) plane of the SiC substrate 50.

TABLE 5

| respective group III nitride-based semiconductor layers | film thickness |
|---|---|
| undoped AlGaN buffer layer with gradient composition 51 | 1 μm |
| undoped $Al_{x5}Ga_{1-x5}N$ lower barrier layer 52 | 50 nm |
| undoped GaN channel layer 53 | 30 nm |
| N-type $Al_{z5}Ga_{1-z5}N$ contact layer 54 | 40 nm |

In such a case, when the Al composition $x_5$ of the $Al_{x5}Ga_{1-x5}N$ lower barrier layer 52 is set, for example, at $x_5=0.1$, setting the Al composition $z_5$ of the $Al_{x5}Ga_{1-x5}N$ contact layer 54, for example, at $z_5=0.1$ can provide a structure which satisfies the above condition: $x_5=z_5$. On the one hand, an Al composition $x_{5B}(t_{5B})$ of the AlGaN buffer layer 51 is gradually decreased from the substrate 50 ($t_{5B}=0$) toward a front surface of the buffer layer 51 ($t_{5B}=1$ μm). For example, the Al composition $x_{5B}(t_{5B})$ of the AlGaN buffer layer with gradient composition 51 is decreased from $x_{5B}(t_{5B}=0)=1$ to $x_{5B}(t_{5B}=1$ μm$)=0.1$ according to a ratio of $dx_{5B}(t_{5B})/dt_{5B}=-0.9$ μm$^{-1}$.

In the case of $x_5=0.1$ and $z_5=0.1$, mobility of the two-dimensional electron gas 57 produced in the vicinity of the hetero interface between the GaN channel layer 53 and the $Al_{z5}Ga_{1-z5}N$ contact layer 54 is about 1500 cm$^2$/V$_s$ (20° C.). This mobility of the two-dimensional electron gas 57 is a good value. Also, density $N_{2d\text{-}gas\ 5\text{-}1}$ of the two-dimensional electron gas 57 to be accumulated is $N_{2d\text{-}gas\ 5\text{-}1}=0.9\times10^{13}$ cm$^{-2}$ (20° C.).

The GaN channel layer 53 is undoped and has a low density of an ionized impurity, so that scattering of the ionized impurity is suppressed. Also, the hetero interface between the GaN channel layer 53 and the $Al_{z5}Ga_{1-z5}N$ contact layer 54 is flat in the atomic level, so that interface scattering is also suppressed. Due to the suppression of ionized impurity scattering and interface scattering, the mobility of the two-dimensional electron gas 57 produced in the vicinity of the hetero interface exhibits the good value described above.

In the step of forming the source electrode 5S and the drain electrode 5D, first, on the N-type $Al_{z5}Ga_{1-z5}N$ contact layer 54, for example, metal, such as Ti, Al, Ni and Au, is deposited and pattered. Next, ohmic contact is formed, for example, by alloy processing at the temperature of 850° C. for 30 sec in the atomosphere of nitrogen gas.

Next, using a $Cl_2$-based gas, a part of the $Al_{z5}Ga_{1-z5}N$ contact layer 54 is etched away to form the recessed portion. In this recessed portion, a front surface of the GaN channel layer 53 is exposed. After the etching step of the recessed portion, the film thickness $t_{channel\ 5\text{-}G}$ of the GaN channel layer 53 in the recessed portion is 25 nm. When a width: $W_{S\text{-}D5}$ of the region located between the source electrode 5S and the drain electrode 5D is set, for example, at $W_{S\text{-}D5}=5$ μm, a width: $W_{recess\ 5}$ of the recessed portion is set, for example, at $W_{recess\ 5}=2$ μm. In such a case, a depth $d_{recess\ 4}$ of the recessed portion is set at $d_{recess\ 5}=45$ nm.

Subsequently, the insulating film 55 composed of SiN is formed, for example, by using PECVD method. In such a case, a film thickness of SiN to be formed is selected within the range of $t_{SiN5}=5$ nm-200 nm on a flat region. On the one hand, a film thickness $t_{SiN5\text{-}well}$ of SiN to be formed on a surface of a side wall of the recessed portion becomes usually equal to or less than $t_{SiN5}$.

The semiconductor device illustrated in FIG. 5 is an exemplary embodiment where an angle of tilt of the surface of the side wall of the recessed portion is set 90 degrees, but the angle of tilt may be decreased less than 90 degrees to improve coatability of the surface of the side wall of the recessed portion.

After the insulating film 55 composed of SiN is deposited, metal, such as Ti, Pt and Au, is deposited, and the gate electrode 5G is formed by liftoff. The gate electrode 5G formed by liftoff is formed to embed the recessed portion coated with the insulating film 55. An effective gate length $L_{5G\text{-}effect}$ of the gate electrode 5G on the bottom of the recessed portion is $L_{5G\text{-}effect} \approx W_{recess\ 5} - 2\times t_{SiN5\text{-}well}$. On the bottom of the recessed portion, the gate electrode 5G is formed on the GaN channel layer 53 with intervention of the insulating film 55 composed of SiN, thereby schottky contact (MIS junction) is constructed. A ratio $L_{5G\text{-}effect}/t_{SiN5}$ of the effective gate length $L_{G\text{-}effect}$ of the gate electrode 5G and the film thickness $t_{SiN5}$ of the insulating film directly beneath this gate electrode 5G falls within the range of 400-8 when $t_{SiN5}$ is selected within the range of $t_{SiN5}=5$ nm-200 nm.

For example, in the case of $t_{SiN5} \geq 45$ nm, $d_{recess\ 5}=45$ nm is provided, thereby the recessed portion is embedded by the insulating film 55 composed of SiN. In such a case, on an upper surface of the insulating film 55 composed of SiN, a concave portion having a width corresponding to ($W_{recess\ 5} - 2\times t_{SiN5}$) is formed, and the gate electrode 5G is formed to embed this concave portion. In such a case, the effective gate length $L_{5G\text{-}effect}$ of the gate electrode 5G corresponds to ($W_{recess\ 5} - 2\times t_{SiN5}$)

On the one hand, when $t_{SiN5}=5$ nm, then $d_{recess\ 5}=45$ nm and the amount of overetching ($d_{recess\ 4} - t_{contact\ 5}$)=5 nm are provided, and the amount of overetching ($d_{recess\ 5} - t_{contact\ 5}$) is equal to the film thickness $t_{SiN5}$ of the insulating film. Note that particularly, decreasing the film thickness $t_{SiN5}$ of the insulating film less than the amount of overetching ($d_{recess\ 5} - t_{contact\ 5}$) does not cause any problem.

Electron affinity $e_\chi$(SiN) eV of the SiN film used for the insulating film 55, a work function $c\phi$(Ti) eV of Ti and electron affinity $e_\chi$(GaN) eV of GaN of the channel layer 53 are estimated as $c\phi$(SiN) eV=1.4 eV, $c\phi$(Ti) eV=4.3 eV and $c\phi$(GaN) eV=3.9 eV, respectively. Accordingly, a barrier of $\{e_\chi(SiN) - c\phi(Ti)\}$ eV≈2.9 eV is formed in an interface between the SiN insulating film 55 and Ti of the gate electrode 5G, and a barrier (contact potential difference) of $\{e_\chi(SiN) - e_\chi(GaN)\} \approx 2.5$ eV is formed in the interface between the SiN insulating film 55 and the GaN channel layer 53, respectively, due to a difference in the work function. Note that in the hetero interface between the GaN channel layer 53 and the $Al_{x5}Ga_{1-x5}N$ lower barrier layer 52, a barrier (contact potential difference) is formed due to the band discontinuity $\Delta E_C$ ($Al_{x5}Ga_{1-x5}N$/GaN). Also, ($e_\chi$(GaN)−$c\phi$(Ti)) eV≈0.4 eV is provided.

Therefore, in the structure of the semiconductor device according to the second exemplary embodiment illustrated in FIG. 5, the band diagram of the conduction band in the region directly beneath the gate electrode 5G formed in the recessed portion is quite similar to the band diagram of the conduction band illustrated schematically in FIG. 2.

The $Al_{x5}Ga_{1-x5}N$ lower barrier layer 52 grown on the (0001) plane becomes lattice-relaxed by providing the AlGaN buffer layer with gradient composition 51 as its underlying layer. A lattice constant a($Al_{x5}Ga_{1-x5}N$) of $Al_{x5}Ga_{1-x5}N$ of this lower barrier layer 52 is approximately expressed as a($Al_{x5}Ga_{1-x5}N$)≈$x_5 \cdot$a(AlN)+$(1-x_5) \cdot$a(GaN) by using a lattice constant a(AlN) of AlN and a lattice constant a(GaN) of GaN.

On the one hand, for both of the GaN channel layer 53 and the $Al_{z5}Ga_{1-z5}N$ contact layer 54 formed on the $Al_{x5}Ga_{1-x5}N$ lower barrier layer 52, their lattice constants a become substantially identical with the lattice constant a($Al_{x5}Ga_{1-x5}N$) of $Al_{x5}Ga_{1-x5}N$ of the lower barrier layer 52 because of their thin film thickness. That is, in the GaN channel layer 53, compressive strain arises in which the original lattice constant a(GaN) changes to the lattice constant a($Al_{x5}Ga_{1-x5}N$). Also, because the Al composition $z_5$ of the $Al_{z5}Ga_{1-z5}N$ contact layer 54 is equal to the Al composition $x_5$ of the $Al_{x5}Ga_{1-x5}N$ lower barrier layer 52, lattice strain does not arise.

Because strain $C_{ZZ}$ due to lattice strain does not substantially exist in the $Al_{x5}Ga_{1-x5}N$ lower barrier layer 52, piezo polarization: $P_{pe}(Al_{x5}Ga_{1-x5}N)$ does not arise. However, spontaneous polarization: $P_{sp}(Al_{x5}Ga_{1-x5}N)$ exists in the $Al_{x5}Ga_{1-x5}N$ lower barrier layer 52. In the case of C-axis growth, the direction of this spontaneous polarization: $P_{sp}(Al_{x5}Ga_{1-x5}N)$ is oriented from the front surface toward the substrate. Accordingly, polarization $P_{52}$ present in the $Al_{x5}Ga_{1-x5}N$ lower barrier layer 52 is generally the sum of the piezo polarization: $P_{pe}(Al_{x5}Ga_{1-x5}N)$ and the spontaneous polarization: $P_{sp}(Al_{x5}Ga_{1-x5}N)$, that is, $P_{52}=P_{sp}(Al_{x5}Ga_{1-x5}N)+P_{pe}(Al_{x5}Ga_{1-x5})$. In such a case, because of $P_{pe}(Al_{x5}Ga_{1-x5}N)\approx 0$, the polarization $P_{52}$ present in the $Al_{x5}Ga_{1-x5}N$ lower barrier layer 52 is approximated by $P_{52}\approx P_{sp}(Al_{x5}Ga_{1-x5}N)$.

Similarly, because strain $e_{ZZ}$ due to lattice strain does not substantially exist in the $Al_{z5}Ga_{1-z5}N$ contact layer 54, piezo polarization: $P_{pe}(Al_{z5}Ga_{1-z5}N)$ does not arise. In such a case, because of $P_{pe}(Al_{z5}Ga_{1-z5}N)\approx 0$, polarization $P_{54}$ present in the $Al_{z5}Ga_{1-z5}N$ contact layer 54 is approximated by $P_{54}\approx P_{sp}(Al_{z5}Ga_{1-z5}N)$.

On the one hand, compressive strain $e_{ZZ}(GaN)\approx\{a(Al_{x5}Ga_{1-x5}N)-a(GaN)\}/a(GaN)$ exists in the GaN channel layer 53, arising from lattice strain, and piezo polarization: $P_{pe}(GaN)$ arises. This piezo polarization: $P_{pe}(GaN)$ is approximately expressed by $P_{pe}(GaN)\approx 2e_{ZZ}(GaN)[e_{31}(GaN)-e_{33}(GaN)\cdot\{C_{31}(GaN)/C_{33}(GaN)\}]$ by using piezoelectric constants $e_{31}(GaN)$ and $e_{33}(GaN)$, and elastic constants $C_{13}(GaN)$ and $C_{33}(GaN)$ of GaN. Further, spontaneous polarization: $P_{sp}(GaN)$ also exists. In the case of C-axis growth, the direction of the spontaneous polarization: $P_{sp}(GaN)$ is oriented from the front surface toward the substrate. The piezo polarization. $P_{pe}(GaN)$ arising from the compressive strain $e_{ZZ}$ has the direction in which the spontaneous polarization: $P_{sp}(GaN)$ is set off. Accordingly, polarization $P_{43}$ present in the GaN channel layer 53 is generally the sum of the piezo polarization: $P_{pe}(GaN)$ and the spontaneous polarization: $P_{sp}(GaN)$, that is, $P_{53}=P_{sp}(GaN)+P_{pe}(GaN)<P_{sp}(GaN)$.

The SiN insulating film 55 is a polycrystalline or amorphous film. Therefore, the SiN insulating film 55 does not exhibit anisotropy as a whole and create polarization. That is, polarization $P_{55}$ in the SiN insulating film 55 is $P_{55}=0$.

Polarization P exhibits discontinuous change from $P_{53}$ to $P_{52}$ in the interface between the GaN channel layer 53 and the $Al_{x5}Ga_{1-x5}N$ lower barrier layer 52. Accordingly, in this interface, sheet-like polarization charges $\sigma_{53}$ arise. Interfacial charge density $\sigma_{53}/q$ produced in this interface is $\sigma_{53}/q=(P_{53}-P_{52})/q$, (where, q is the charge amount of electron (unit charge)).

Further, the polarization P exhibits discontinuous change from $P_{55}$ to $P_{53}$ also in the interface between the SiN insulating film 55 and the GaN channel layer 53. Accordingly, in this interface, sheet-like polarization charges $\sigma_{55}$ arise. Interfacial charge density $\sigma_{55}/q$ produced in this interface is $\sigma_{55}/q=(P_{55}-P_{53})/q$. On the one hand, in the interface between the SiN insulating film 55 and the GaN channel layer 53, an interface state is generated with a considerable sheet density. Therefore, interfacial charges produced in the interface are compensated by such an interface state, and in the interface between the SiN insulating film 55 and the GaN channel layer 53, effective accumulation of the interfacial charges produced is not observed.

The polarization $P_{52}$ present in the $Al_{x5}Ga_{1-x5}N$ lower barrier layer 52 and the polarization $P_{53}$ present in the GaN channel layer 53 depend on the Al composition ($x_5$) of $Al_{x5}Ga_{1-x5}N$ composing the lower barrier layer 52. For example, when x5=0.1, computation provides $P_{52}/q=2.13\times 10^{13}$ cm$^{-2}$ and $P_{53}/q=1.61\times 10^{13}$ cm$^{-2}$. Also, when the Al composition $z_5$ of the $Al_{z5}Ga_{1-z5}N$ contact layer 54 is equal to the Al composition ($x_5$) of the $Al_{x5}Ga_{1-x5}N$ lower barrier layer 52, and $z_5=x_5=0.1$, then computation provides $P_{54}/q=2.13\times 10^{13}$ cm$^{-2}$.

In such a case, interfacial charge density $\sigma_{53}/q$ produced in the interface between the GaN channel layer 53 and the $Al_{x5}Ga_{1-x5}N$ lower barrier layer 52 is estimated as $\sigma_{53}/q=(P_{53}-P_{52})/q=-5.28\times 10^{12}$ cm$^{-2}$. Also, interfacial charge density $\sigma_{54}/q$ produced in the interface between the $Al_{z5}Ga_{1-z5}N$ contact layer 54 and the GaN channel layer 53 is estimated as $\sigma_{54}/q=(P_{54}-P_{53})/q=+5.28\times 10^{12}$ cm$^{-2}$.

Also in this exemplary embodiment, when undoped $Al_{x5}Ga_{1-x5}N$ is employed for the $Al_{x5}Ga_{1-x5}N$ lower barrier layer 52, and undoped GaN is employed for the GaN channel layer 53, then both of their concentrations $N_{SD52}$ and $N_{SD53}$ of their shallow n-type impurity (donor) are ideally 0 cm$^{-3}$.

When a gate bias $V_{G5}$ is set at $V_{G5}=0$ V, in the region directly beneath the gate electrode 5G formed in the recessed portion, electrons arising from ionization of the n-type impurity are not supplied if both of the $Al_{x5}Ga_{1-x5}N$ lower barrier layer 52 and the GaN channel layer 53 are undoped, and $N_{SD52}=0$ cm$^{-3}$ and $N_{SD53}=0$ cm$^{-3}$. Therefore, only an electric field exists that is produced in the interface between the GaN channel layer 53 and the $Al_{x5}Ga_{1-x5}N$ lower barrier layer 52, arising from the interfacial charges $\sigma_{53}$. Consequently, similarly to the band diagram shown in FIG. 2, the conduction band edge $E_C(53)$ in the GaN channel layer 53 is energetically located higher than the Fermi level $E_f$. In other words, in the GaN channel layer 53, carriers (electrons) become absent. Accordingly, a field effect transistor having this MIS-type gate structure is at the "normally OFF state". By applying a positive voltage ($V_{G5}>0$) to the gate electrode 5G, electrons are accumulated in the interface between the SiN insulating film 55 and the GaN channel layer 53, producing a two-dimensional electron gas, resulting in being at the "ON state". A threshold voltage $V_T$ of the gate bias: $V_{G5}$ for switching the "OFF state" to the "ON state" becomes a positive voltage, and the semiconductor device functions as a field effect transistor of the enhancement mode type.

At the "ON state", electrons accumulated in the vicinity of the interface between the SiN insulating film 55 and the GaN channel layer 53 travel directly beneath the gate electrode 5G. Mobility of the electrons is affected by ionized impurity scattering of an ionized impurity present in the GaN channel layer 53, as well as interface scattering due to disturbance of the interface between the SiN insulating film 55 and the GaN channel layer 53. Because the GaN channel layer 53 is undoped, the ionized impurity scattering is suppressed not to affect mobility of the two-dimensional electron gas produced in the vicinity of the interface between the SiN insulating film 55 and the GaN channel layer 53, resulting in an improved electron mobility.

Dependency of the threshold voltage $V_T$ on the film thickness of the SiN insulating film 55, which is estimated for the field effect transistor having the MIS-type gate structure illustrated in FIG. 5, is similar to the estimated result for the field effect transistor having the MIS-type gate structure illustrated in FIG. 1, as shown in FIG. 3. In the case of $N_{SD53}=0$ cm$^{-3}$, if the concentration $N_{SD52}$ of the shallow n-type impurity (donor) in the $Al_{x5}Ga_{1-x5}N$ lower barrier layer 52 is increased, a difference $\{E_C(52)-E_f\}$ between the conduction band edge $E_C(52)$ and the Fermi level $E_f$ in the $Al_{x5}Ga_{1-x5}N$ lower barrier layer 52 is decreased. As a result, the conduction band edge $E_C(53)$ in the GaN channel layer 53 is also lowered. When the concentration $N_{SD52}$ of the shallow n-type impurity (donor) in the $Al_{x5}Ga_{1-x5}N$ lower barrier layer 52 reaches the range that satisfies the condition $N_{SD52} \cdot t_{barrier\ 5} > \sigma_{53}/q$, then carriers (electrons) are brought into existence in the GaN channel layer 53 as the film thickness $t_{SiN5}$ of the SiN insulating film 55 increases even if $V_{G5}$ is set at $V_{G5}=0$ V. With reference to the result from the estimate calculation shown in FIG. 3, it is shown that when $N_{SD53}=0$ cm$^{-3}$, and the concentration $N_{SD52}$ of the shallow n-type impurity (donor) in the $Al_{x5}Ga_{1-x5}N$ lower barrier layer 52 lies within the range of equal to or less than $1 \times 10^{18}$ cm$^{-3}$, then the threshold voltage $V_T$ becomes a positive voltage, regardless of the film thickness $t_{SiN5}$ of the SiN insulating film 55. On the one hand, when the concentration $N_{SD52}$ of the shallow n-type impurity (donor) in the $Al_{x5}Ga_{1-x5}N$ lower barrier layer 52 reaches $2 \times 10^{18}$ cm$^{-3}$, then the threshold voltage $V_T$ becomes a negative voltage within the range where the film thickness $t_{SiN5}$ of the SiN insulating film 55 exceeds 3 nm.

When at least $N_{SD53}=0$ cm$^{-3}$, and the concentration $N_{SD52}$ of the shallow n-type impurity (donor) in the $Al_{x5}Ga_{1-x5}N$ lower barrier layer 52 lies within the range that satisfies the condition $N_{SD52} \cdot t_{barrier\ 5} \leq |\sigma_{53}|/q$, then the threshold voltage $V_T$ becomes a positive voltage, regardless of the film thickness $t_{SiN5}$ of the SiN insulating film 55. Therefore, a field effect transistor having the MIS-type gate structure that satisfies this condition is at the "normally OFF state". When $N_{SD53}=0$ cm$^{-3}$, the threshold voltage $V_T$ can be kept within the range of $V_T>0$ V by selecting the concentration $N_{SD52}$ of the shallow n-type impurity (donor) in the $Al_{x5}Ga_{1-x5}N$ lower barrier layer 52 within the range that satisfies the condition $N_{SD52} \cdot t_{barrier\ 5} < |\sigma_{53}|/q$, even if the film thickness $t_{barrier\ 5}$ is slightly varied. Accordingly, a field effect transistor of the enhancement mode type can be stably fabricated within the range that satisfies the above condition.

For example, in the case of $N_{SD52}=0$ cm$^{-3}$ and $N_{SD53}=0$ cm$^{-3}$, in the band diagram of the conduction band in the region directly beneath the gate electrode 5G in the thermal equilibrium state of $V_G=0$ V, the conduction band energy $E_C(53)$ of the GaN channel layer 53 in the hetero interface between the GaN channel layer 53 and the $Al_{x5}Ga_{1-x5}N$ lower barrier layer 52 is energetically located higher than the Fermi level $E_f$. A difference $\{E_C(53)-E_f\}$ between the conduction band energy $E_C(53)$ of the GaN channel layer 53 and the Fermi level $E_f$ in this hetero interface depends on the film thickness $t_{SiN5}$ of the SiN insulating film 55.

Referring to the result of FIG. 3, when $N_{SD53}=0$ cm$^{-3}$, then the dependency of the threshold voltage $V_T$ on the film thickness $t_{SiN5}$ of the SiN insulating film 55 varies dependent on the concentration $N_{SD52}$ of the shallow n-type impurity (donor) in the $Al_{x5}Ga_{1-x5}N$ lower barrier layer 52. For example, even in the case of $N_{SD53}=0$ cm$^{-3}$ and $N_{SD52}=0$ cm$^{-3}$, the amount of change $\Delta V_T$ of the threshold voltage $V_T$ is as relatively small as about 0.14 V when the film thickness $t_{SiN5}$ of the SiN insulating film 55 varies by 1 nm. Accordingly, uniformity and reproducibility of the threshold voltage $V_T$ are good against change in the film thickness $t_{SiN5}$ of the SiN insulating film 55.

A contact potential difference $\{e_\chi(SiN)-c\phi(Ti)\}$ eV due to a difference between electron affinity $e_\chi(SiN)$ eV of the SiN film composing the SiN insulating film 55 and a work function $c\phi(Ti)$ eV of Ti of the gate electrode 5G in contact with this SiN film is as large as about 2.9 eV. Accordingly, when a gate having the MIS structure of Ti/SiN/GaN is employed, the barrier height $\Phi_{barrier}$ of schottky junction (MIS junction) is increased higher than that of schottky junction of usual MES-type. Accordingly, in the field effect transistor having the MIS-type gate structure illustrated in FIG. 5, forward gate breakdown voltage is also good when the schottky junction (MIS junction) of gate is forward biased.

The small dependency of the threshold voltage $V_T$ on the film thickness of the insulating film, as shown in FIG. 3, when undoped GaN is employed for the GaN channel layer 53 and $N_{SD53}=0$ cm$^{-3}$ means that an internal electric field applied to the insulating film 55 is small when the schottky junction (MIS junction) of gate is reverse biased. Accordingly, a tunnel current component is suppressed at the reverse bias, and a reverse leakage current is also decreased.

Figure 6:
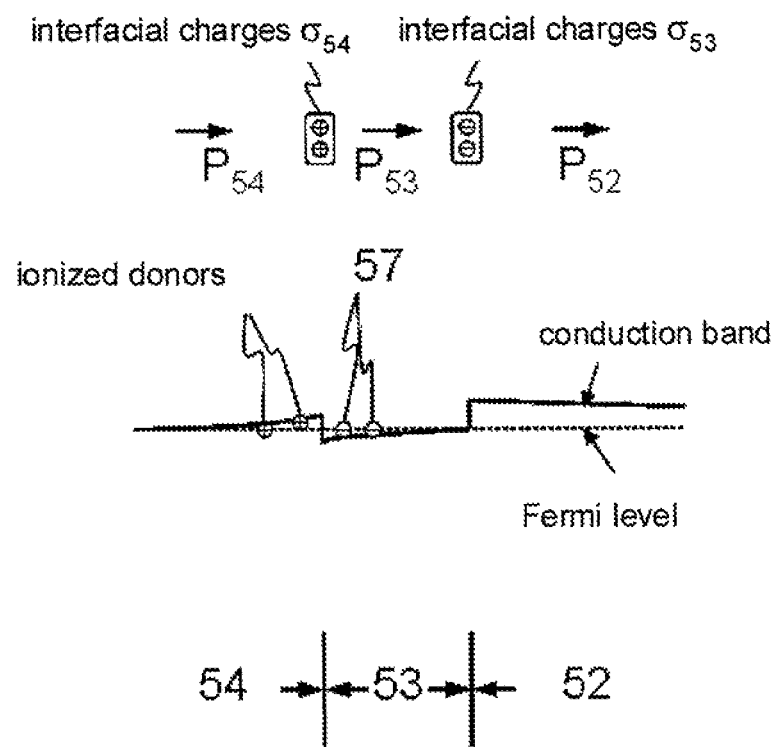
FIG. 6 is a drawing schematically illustrating band diagram of a conduction band for the region directly beneath an N-type $Al_{z4}Ga_{1-z4}N$ contact layer 54, in the structure of the semiconductor device according to the second exemplary embodiment illustrated in FIG. 5.

FIG. 6 schematically shows the band diagram of the conduction band in the region where the N-type $Al_{z5}Ga_{1-z5}N$ contact layer 54 exists except the recessed portion, in the structure of the semiconductor device according to the second exemplary embodiment illustrated in FIG. 5.

Polarization P exhibits discontinuous change from $P_{53}$ to $P_{52}$ in the interface between the GaN channel layer 53 and the $Al_{x5}Ga_{1-x5}N$ lower barrier layer 52. Accordingly, in this interface, sheet-like polarization charges $\sigma_{53}$ arise. Interfacial charge density $\sigma_{53}/q$ produced in this interface is $\sigma_{53}/q=(P_{53}-P_{52})/q$, (where, q is the charge amount of electron (unit charge)). Also in the interface between the N-type $Al_{z5}Ga_{1-z5}N$ contact layer 54 and the GaN channel layer 53, the polarization P exhibits discontinuous change from $P_{54}$ to $P_{53}$. Therefore, in this interface, sheet-like polarization charges $\sigma_{54}$ arise. Interfacial charge density $\sigma_{54}/q$ produced in the interface is $\sigma_{54}/q=(P_{54}-P_{53})/q$.

The polarization $P_{52}$ present in the $Al_{x5}Ga_{1-x5}N$ lower barrier layer 52, the polarization $P_{53}$ present in the GaN channel layer 53 and the polarization $P_{54}$ present in the N-type $Al_{z5}Ga_{1-z5}N$ contact layer 54 depend on the Al composition $(x_5)$ of $Al_{x5}Ga_{1-x5}N$ composing the lower barrier layer 52 and the Al composition $(z_5)$ of $Al_{z5}Ga_{1-z5}N$ composing the contact layer 54. For example, when $x_5=0.1$ and $z_5=0.1$, computation provides $P_{52}/q=2.13 \times 10^{13}$ cm$^{-2}$, $P_{53}/q=1.61 \times 10^{13}$ cm$^{-2}$ and $P_{54}/q=2.13 \times 10^{13}$ cm$^{-2}$. In such a case, the interfacial charge density $\sigma_{53}/q$ produced in the interface between the GaN channel layer 53 and the $Al_{x5}Ga_{1-x5}N$ lower barrier layer 52 is estimated as $\sigma_{53}/q=(P_{53}-P_{52})/q=-5.28 \times 10^{12}$ cm$^{-2}$. The interfacial charge density $\sigma_{54}/q$ produced in the interface between the N-type $Al_{z5}Ga_{1-z5}N$ contact layer 54 and the GaN channel layer 53 is estimated as $\sigma_{54}/q=(P_{54}-P_{53})/q=+5.28 \times 10^{12}$ cm$^{-2}$.

In the case of $z_5=0.1$ and $x_5=0.1$, in the interface between the GaN channel layer 53 and the $Al_{x5}Ga_{1-x5}N$ lower barrier layer 52, negative interfacial charges ($\sigma_{53}$) are generated, and in the interface between the $Al_{z5}Ga_{1-z5}N$ contact layer 54 and the GaN channel layer 53, positive interfacial charges ($\sigma_{54}$) are generated, and the total sum ($\sigma_{54}+\sigma_{53}$) of them is ($\sigma_{54}+\sigma_{53}$)=0.

In the hetero interface between the GaN channel layer 53 and the $Al_{x5}Ga_{1-x5}N$ lower barrier layer 52, there is formed a barrier (contact potential difference) arising from band discontinuity $\Delta E_C(Al_{x5}Ga_{1-x5}N/GaN)$. In the hetero interface between the N-type $Al_{z5}Ga_{1-z5}N$ contact layer 54 and the GaN channel layer 53, there is formed a barrier (contact potential difference) arising from band discontinuity $\Delta E_C(Al_{z5}Ga_{1-z5}N/GaN)$. In such a case, when the Al composition $(x_5)$ of $Al_{x5}Ga_{1-x5}N$ composing the lower barrier layer 52 and the Al composition $(z_5)$ of $Al_{z5}Ga_{1-z5}N$ composing the contact layer 54 are set to be $z_5=x_5$, then $\Delta E_C(Al_{z5}Ga_{1-z5}N/GaN)=\Delta_c(Al_{x5}Ga_{1-x5}N/GaN)$ is provided.

In the case of $(\sigma_{54}+\sigma_{53})=0$, carriers due to polarization effect are not produced. On the one hand, as shown in FIG. 6, a portion of the N-type $Al_{z5}Ga_{1-z5}N$ contact layer 54 near the interface with the GaN channel layer 53 forms a depleted region. Carriers are supplied from the N-type $Al_{z5}Ga_{1-z5}N$ contact layer 54 to the GaN channel layer 53 in association with this depleted region being formed, producing a two-dimensional electron gas 57. Therefore, density $N_{2d\text{-}gas\,5.1}$ of the two-dimensional electron gas 57 to be accumulated falls within the range of $N_{2d\text{-}gas\,5\text{-}1} > N_{SD54} \cdot t_{contact\,5}$.

A conventional semiconductor device of the enhancement mode type has such a problem that carriers present between the source and the gate, and between the gate and the drain become depleted, thereby access resistance is increased. In contrast, the semiconductor device according to the second exemplary embodiment has the two-dimensional electron gas 57 present in the interface of the channel layer 53 with the contact layer 54, regardless of being the field effect transistor of the enhancement mode type. Accordingly, access resistance between the source and the gate, and between the gate and the drain is decreased. Of course, because the ohmic electrodes are formed on the N-type $Al_{z5}Ga_{1-z5}N$ contact layer 54, contact resistance between the drain electrode 5D and the source electrode 5S is also decreased. That is, channel resistance between the source and the gate, and between the gate and the drain is decreased. Parasitic resistance is largely improved by these contributions.

Note that in the second exemplary embodiment, the Al composition $(z_5)$ of the N-type $Al_{z5}Ga_{1-z5}N$ contact layer 54 is set equal to the Al composition $(x_5)$ of the $Al_{x5}Ga_{1-x5}N$ lower barrier layer 52 in the specific example described above. Of course, even if $z_5$ is set larger than $x_5$, electrons are accumulated in the vicinity of the interface between the N-type $Al_{z5}Ga_{1-z5}N$ contact layer 54 and the GaN channel layer 53, producing the two-dimensional electron gas 57. In the case of $z_5 > x_5$, because the sum $(\sigma_{53}+\sigma_{54})$ of interfacial charges arising from polarization effect becomes positive, the two-dimensional electron gas 57 is formed if the concentration $N_{SD54}$ of the shallow n-type impurity (donor) in the N-type $Al_{z5}Ga_{1-z5}N$ contact layer 54 is lowered. In such a case, the density $N_{2d\text{-}gas\,5\text{-}1}$ of the two-dimensional electron gas 57 to be accumulated falls within the range of $(\sigma_{53}+\sigma_{54})$ $q < N_{2d\text{-}gas\,5\text{-}1} < (N_{SD54} \cdot t_{contact\,5})+(\sigma_{53}+\sigma_{54})/q$.

Further, $z_5$ may be also set smaller than $x_5$ within the range where a barrier is formed that is necessary to accumulate the two-dimensional electron gas in the interface between the N-type $Al_{z5}Ga_{1-z5}N$ contact layer 54 and the GaN channel layer 53. If $z_5$ is set at $z_5 < x_5$, the amount of carriers (electrons) supplied from the N-type $Al_{z5}Ga_{1-z5}N$ contact layer 54 to the GaN channel layer 53 has to be set larger than $|\sigma_{53}+\sigma_{54}|$ because the sum $(\sigma_{53}+\sigma_{54})$ of interfacial charges arising from polarization effect becomes negative. In such a case, the density $N_{2d\text{-}gas\,5\text{-}1}$ of the two-dimensional electron gas 57 to be accumulated falls within the range of $N_{2d\text{-}gas\,5\text{-}1} < (N_{SD54} \cdot t_{contact\,5})+(\sigma_{53}+\sigma_{54})/q < (N_{SD54} \cdot t_{contact\,5})$.

Third Exemplary Embodiment

The semiconductor device according to the first exemplary embodiment or the second exemplary embodiment described above is the mode in which the present invention is applied to a field effect transistor of the enhancement mode type.

On the one hand, a semiconductor device according to the third exemplary embodiment described below is a mode in which the present invention is applied to a field effect transistor of the depletion mode type. In particular, the semiconductor device according to the third exemplary embodiment is an example of a device structure for achieving decrease in access resistance by applying the present invention in a field effect transistor of the depletion mode type.

Figure 7:
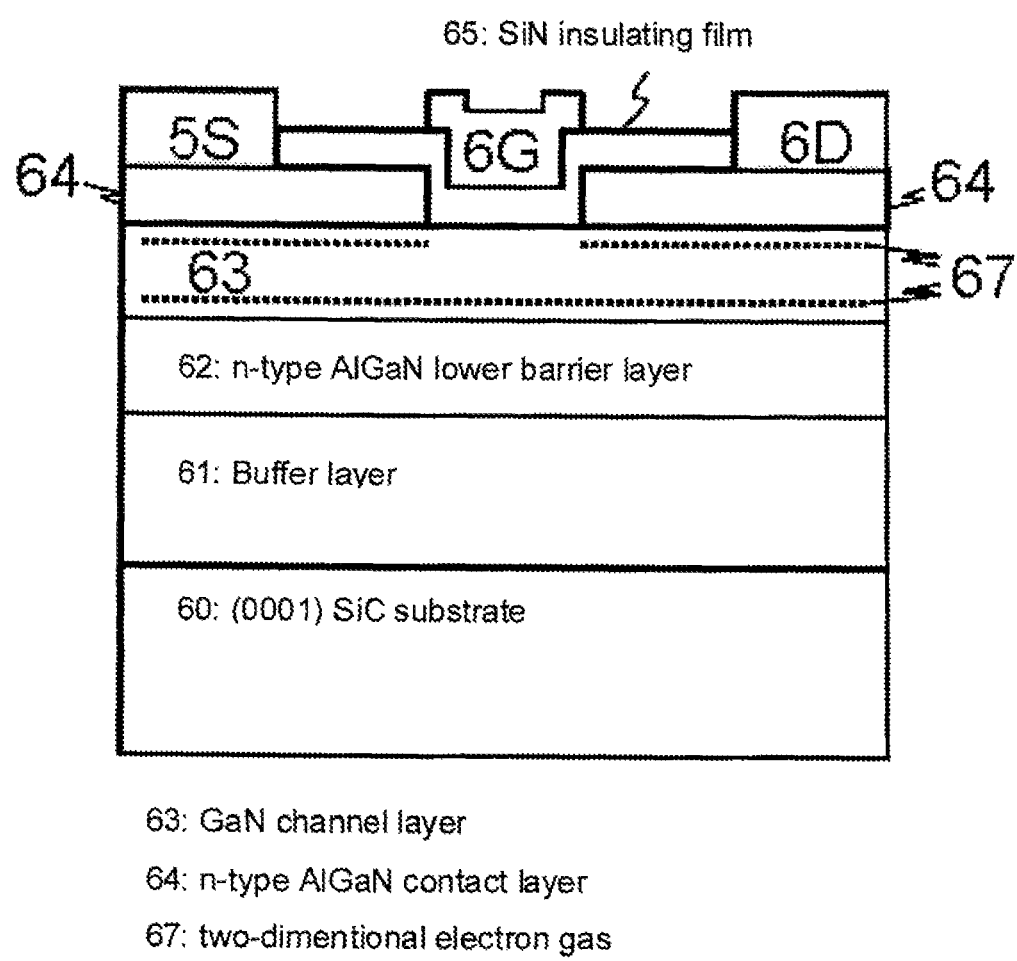
FIG. 7 is a cross-sectional view schematically showing a structure of a semiconductor device according to the third exemplary embodiment.

FIG. 7 is a cross-sectional view schematically showing a structure of the semiconductor device according to the third exemplary embodiment.

In the semiconductor device illustrated in FIG. 5, a substrate 60 is a silicon carbide (SiC) substrate having a (0001) plane, a buffer layer 61 is a layer of AlGaN with gradient composition having a film thickness $t_{buffer\,6}$, a lower barrier layer 62 is a layer of N-type $Al_{x6}Ga_{1-x6}N$ having a film thickness $t_{barrier\,6}$, a channel layer 63 is a layer of undoped GaN having a film thickness $t_{channel\,6}$, and a contact layer 64 is a layer of N-type $Al_{z6}Ga_{1-z6}N$ having a film thickness $t_{contact\,6}$. Here, an Al composition $z_6$ of the $Al_{z6}Ga_{1-z6}N$ contact layer 64 is set equal to an Al composition of the $Al_{x6}Ga_{1-x6}N$ lower barrier layer 62. For example, they are set at $x_6=z_6=0.1$. The N-type $Al_{x6}Ga_{1-x6}N$ layer composing the lower barrier layer 62 and the N-type $Al_{z6}Ga_{1-z6}N$ layer composing the contact layer 64 are doped with an n-type impurity for forming a shallow donor level. As this n-type impurity for forming a shallow donor level, for example, silicon (Si) is used. Concentration $N_{SD62}$ of the shallow n-type impurity (donor) in the N-type $Al_{x6}Ga_{1-x6}N$ layer composing the lower barrier layer 62 is set, for example, at $2\times10^{18}\,\text{cm}^{-3}$. Concentration $N_{SD64}$ of the shallow n-type impurity (donor) in the N-type $Al_{z6}Ga_{1-z6}N$ layer composing the contact layer 64 is set, for example, at $5\times10^{18}\,\text{cm}^{-3}$.

In the hetero interface between the GaN channel layer 63 and the $Al_{z6}Ga_{1-z6}N$ contact layer 64, there is band discontinuity $\Delta Ec(Al_{z6}Ga_{1-z6}N/GaN)=Ec(Al_{z6}Ga_{1-z6}N)-Ec(GaN)$ arising from a difference between conduction band energy $Ec(GaN)$ of GaN and conduction band energy $Ec(Al_{z6}Ga_{1-z6}N)$ of $Al_{z6}Ga_{1-z6}N$. As a result, in the vicinity of the hetero interface between the GaN channel layer 63 and the $Al_{z6}Ga_{1-z6}N$ contact layer 64, electrons are accumulated, producing a two-dimensional electron gas 67.

On the one hand, in the hetero interface between the GaN channel layer 63 and the $Al_{x6}Ga_{1-x6}N$ lower barrier layer 62, there is band discontinuity $\Delta Ec(Al_{x6}Ga_{1-x6}N/GaN)=Ec(Al_{x6}Ga_{1-x6}N)-Ec(GaN)$ arising from a difference between the conduction band energy $Ec(GaN)$ of GaN and conduction band energy $Ec(Al_{x6}Ga_{1-x6}N)$ of $Al_{x6}Ga_{1-x6}N$. This band discontinuity $\Delta Ec(Al_{x6}Ga_{1-x6}N/GaN)$ functions as a lower barrier against electrons present in the GaN channel layer 63. Consequently, a structure is provided in which electrons can be partially accumulated also in the vicinity of the hetero interface between the GaN channel layer 63 and the $Al_{x6}Ga_{1-x6}N$ lower barrier layer 62.

On the $Al_{z6}Ga_{1-z6}N$ contact layer 64, a source electrode 6S and a drain electrode 6D are formed. The source electrode 6S and the drain electrode 6D are in ohmic contact with the $Al_{z6}Ga_{1-z6}N$ contact layer 54. In a region located between the source electrode 6S and the drain electrode 6D, a gate electrode 6G is provided, and thereby, a field effect transistor is constructed. In the region located between the source electrode 6S and the drain electrode 6D, a part of the $Al_{z6}Ga_{1-z6}N$ contact layer 64 is etched away to form a recessed portion. On this recessed portion, an insulating film 65 composed of SiN is laminated to cover an exposed front surface of the GaN channel layer 63. In this recessed portion, the gate electrode 6G is formed on an upper surface of the $Al_{z6}Ga_{1-z6}N$ contact layer 64 to be embedded with intervention of the insulating film 65 composed of the SiN. An under surface of the gate electrode 6G is set to form schottky contact (MIS junction)

with an upper surface of the GaN channel layer 63 via the insulating film 65 composed of the SiN.

The semiconductor device having the structure as illustrated in FIG. 7 is fabricated according to the process described below. On the (0001) plane of the SiC substrate 60, respective group III nitride-based semiconductor layers described above are grown in sequence with film thicknesses shown in Table 6, for example, by MOCVD method. Note that the respective group III nitride-based semiconductor layers are C-axis grown on the (0001) plane of the SiC substrate 60.

TABLE 6

| respective group III nitride-based semiconductor layers | film thickness |
|---|---|
| undoped AlGaN buffer layer with gradient composition 61 | 1 μm |
| N-type $Al_{x6}Ga_{1-x6}N$ lower barrier layer 62 | 50 nm |
| undoped GaN channel layer 63 | 30 nm |
| N-type $Al_{z6}Ga_{1-z6}N$ contact layer 64 | 40 nm |

In such a case, when the Al composition $x_6$ of the $Al_{x6}Ga_{1-x6}N$ lower barrier layer 62 is set, for example, at $x_5$=0.1, setting the Al composition $z_6$ of the $Al_{z6}Ga_{1-z6}N$ contact layer 64, for example, at $z_5$=0.1 can provide a structure which satisfies the above condition: $x_6$=$z_6$. On the one hand, an Al composition $x_{6B}(t_{6B})$ of the buffer layer 61 composed of AlGaN with gradient composition is gradually decreased from the substrate 60 ($t_{6B}$=0) toward a front surface of the buffer layer 61 ($t_{6B}$=1 μm). For example, the Al composition $x_{6B}(t_{5B})$ of the AlGaN buffer layer with gradient composition 61 is linearly decreased from $x_{5B}$ ($t_{6B}$=0)=1 to $x_{6B}$ ($t_{6B}$=1 μm)=0.1.

In the case of $x_6$=0.1 and $z_6$=0.1, mobility of a two-dimensional electron gas 67 produced in the vicinity of the hetero interface between the GaN channel layer 63 and the $Al_{z6}Ga_{1-z6}N$ contact layer 64 is about 1500 cm$^2$/V$_s$ (20° C.). This mobility of the two-dimensional electron gas 67 is a good value. Also, density $N_{2d\text{-}gas\ 6\text{-}1}$ of the two-dimensional electron gas 67 to be accumulated is $N_{2d\text{-}gas\ 6.1}$=1.2×10$^{13}$ cm$^{-2}$ (20° C.).

The GaN channel layer 63 is undoped and has a low density of an ionized impurity, so that scattering of the ionized impurity is suppressed. Also, the hetero interface between the GaN channel layer 63 and the $Al_{z6}Ga_{1-z6}N$ contact layer 64 is flat in the atomic level, so that interface scattering is also suppressed. Due to the suppression of ionized impurity scattering and interface scattering, the mobility of the two-dimensional electron gas 67 produced in the vicinity of the hetero interface exhibits the good value described above.

In the step of forming the source electrode 6S and the drain electrode 6D, first, on the N-type $Al_{z6}Ga_{1-z6}N$ contact layer 64, for example, metal, such as Ti, Al, Ni and Au, is deposited and pattered. Next, ohmic contact is formed, for example, by alloy processing at the temperature of 850° C. for 30 sec in the atomosphere of nitrogen gas.

Next, using a Cl$_2$-based gas, a part of the $Al_{z6}Ga_{1-z6}N$ contact layer 64 is etched away to form the recessed portion. In this recessed portion, a front surface of the GaN channel layer 63 is exposed. After the etching step of the recessed portion, the film thickness $t_{channel\ 6\text{-}G}$ of the GaN channel layer 63 in the recessed portion is 25 nm. When a width: $W_{S\text{-}D6}$ of the region located between the source electrode 6S and the drain electrode 6D is set, for example, at $W_{S\text{-}D6}$=5 μm, a width: $W_{recess\ 6}$ of this recessed portion is set, for example, at $W_{recess\ 6}$=2 μm. In such a case, a depth $d_{recess\ 6}$ of the recessed portion is set at $d_{recess\ 6}$=45 nm.

Subsequently, an insulating film 56 composed of SiN is formed, for example, by using PECVD method. In such a case, a film thickness of SiN to be formed is selected within the range of $t_{SiN6}$=5 nm-200 nm on a flat region. On the one hand, a film thickness $t_{SiN6\text{-}well}$ of SiN to be formed on a surface of a side wall of the recessed portion becomes usually equal to or less than $t_{SiN6}$.

The semiconductor device illustrated in FIG. 7 is an exemplary embodiment where an angle of tilt of the surface of the side wall of the recessed portion is set 90 degrees, but the angle of tilt may be decreased less than 90 degrees to improve coatability of the surface of the side wall of the recessed portion.

After the insulating film 56 composed of SiN is deposited, metal, such as Ti, Pt and Au, is deposited, and the gate electrode 6G is formed by liftoff. The gate electrode 6G formed by liftoff is formed to embed the recessed portion coated with the insulating film 65. An effective gate length $L_{6G\text{-}effect}$ of the gate electrode 6G on the bottom of the recessed portion is $L_{6G\text{-}effect} \approx W_{recess\ 6} - 2 \times t_{SiN6\text{-}well}$. On the bottom of the recessed portion, the gate electrode 6G is formed on the GaN channel layer 63 with intervention of the insulating film 65 composed of SiN, thereby schottky contact (MIS junction) is constructed. A ratio $L_{5G\text{-}effect}/t_{SiN6}$ of the effective gate length $L_{6G\text{-}effect}$ of the gate electrode 6G and the film thickness $t_{SiN6}$ of the insulating film directly beneath this gate electrode 6G falls within the range of 400-8 when the film thickness $t_{SiN6}$ is selected within the range of $t_{SiN6}$=5 nm-200 nm.

For example, in the case of $t_{SiN6} \geq 45$ nm, $d_{recess\ 6}$=45 nm is provided, thereby the recessed portion is embedded by the insulating film 65 composed of SiN. In such a case, on an upper surface of the insulating film 65 composed of SiN, a concave portion having a width corresponding to ($W_{recess\ 6} - 2 \times t_{SiN6}$) is formed, and the gate electrode 6G is formed to embed this concave portion. In such a case, the effective gate length $L_{6G\text{-}effect}$ of the gate electrode 6G corresponds to ($W_{recess\ 6} - 2 \times t_{SiN6}$).

On the one hand, when $t_{SiN6}$=5 nm, then $d_{recess\ 6}$=45 nm and the amount of overetching ($d_{recess\ 6} - t_{contact\ 6}$)=5 nm are provided, and the amount of overetching ($d_{recess\ 6} - t_{contact\ 6}$) is equal to the film thickness $t_{SiN6}$ of the insulating film. Note that particularly, decreasing the film thickness $t_{SiN6}$ of the insulating film less than the amount of overetching ($d_{recess\ 6} - t_{contact\ 6}$) does not cause any problem.

Electron affinity $e_\chi$(SiN) eV of the SiN film used for the insulating film 65, a work function $c\phi$(Ti) eV of Ti and electron affinity $e_\chi$(GaN) eV of GaN of the channel layer 63 are estimated as $e_\chi$(SiN) eV=1.4 eV, $e\phi$(Ti) eV=4.3 eV and $c\phi$(GaN) eV=3.9 eV, respectively. Accordingly, a barrier of $\{e_\chi(SiN) - e\phi(Ti)\}eV \approx 2.9$ eV is formed in an interface between the SiN insulating film 65 and Ti of the gate electrode 6G, and a barrier (contact potential difference) of $\{e_\chi(SiN) - e_\chi(GaN)\} \approx 2.5$ eV is formed in an interface between the SiN insulating film 65 and the GaN channel layer 63, respectively, due to a difference in the work function. Note that in the hetero interface between the GaN channel layer 63 and the $Al_{x5}Ga_{1-x5}N$ lower barrier layer 62, a barrier (contact potential difference) is formed due to the band discontinuity $\Delta E_C$ ($Al_{x6}Ga_{1-x6}N$/GaN). Also, $(e_\chi(GaN) - c\phi(Ti))eV \approx 0.4$ eV is provided.

Figure 8:
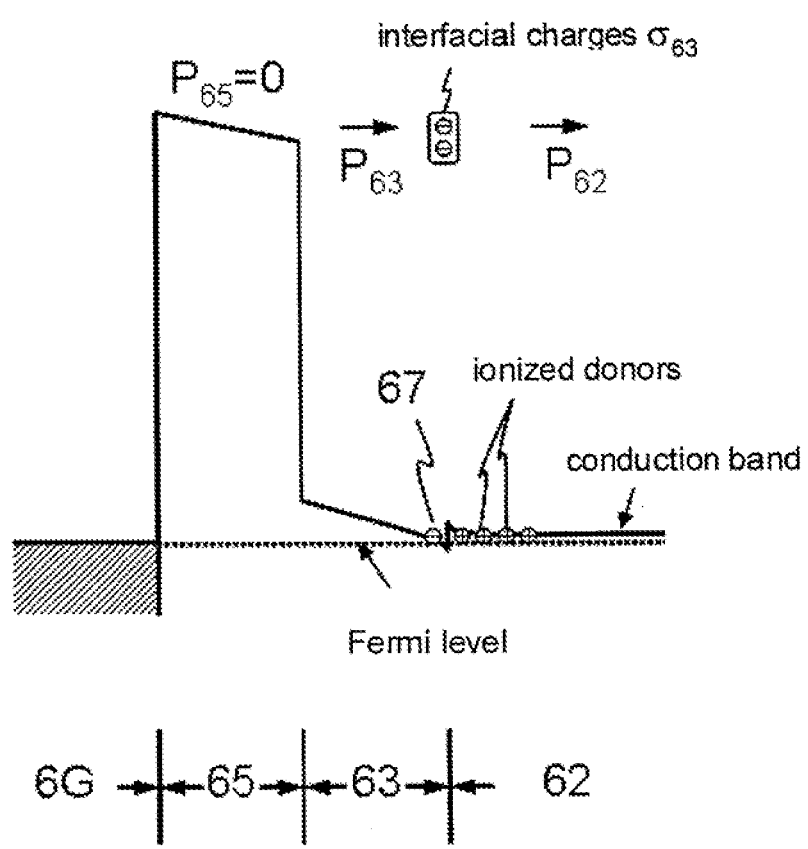
FIG. 8 is a drawing schematically illustrating band diagram of a conduction band for the region directly beneath a gate electrode 6G formed in a recessed portion, in the structure of the semiconductor device according to the third exemplary embodiment illustrated in FIG. 7.

FIG. 8 schematically shows the band diagram of the conduction band in the region directly beneath the gate electrode 6G formed in the recessed portion, in the structure of the semiconductor device according to the third exemplary embodiment illustrated in FIG. 7. The band diagram of the conduction band shown in FIG. 8 illustrates such a state in which a gate bias: $V_{G6}$ applied to the gate electrode 6G is set at $V_{G6}=0$ V. Therefore, electric potential of Ti of the gate electrode 6G is identical with the Fermi level $E_f$.

Figure 9:
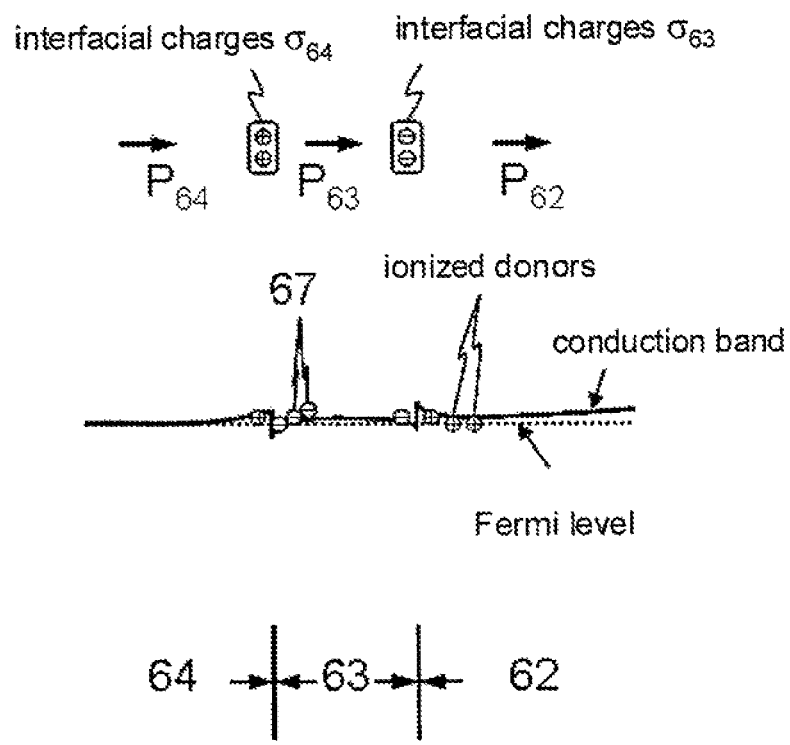
FIG. 9 is a drawing schematically illustrating band diagram of a conduction band for the region directly beneath an N-type $Al_{z4}Ga_{1-z4}N$ contact layer 64, in the structure of the semiconductor device according to the third exemplary embodiment illustrated in FIG. 7.
Figure 10:
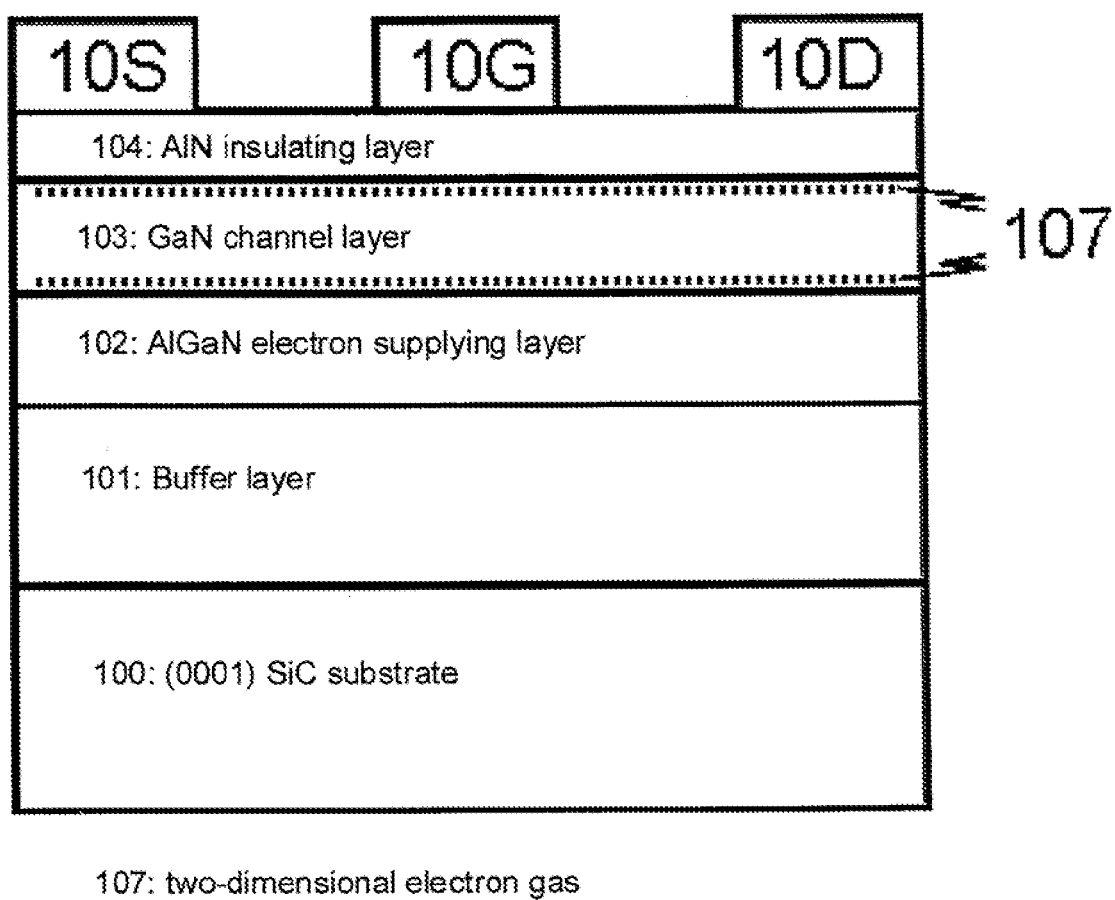
FIG. 10 is a cross-sectional view schematically showing a structure of a conventional semiconductor device which uses an AlN insulating layer 104 as an electron supply layer.
Figure 11:
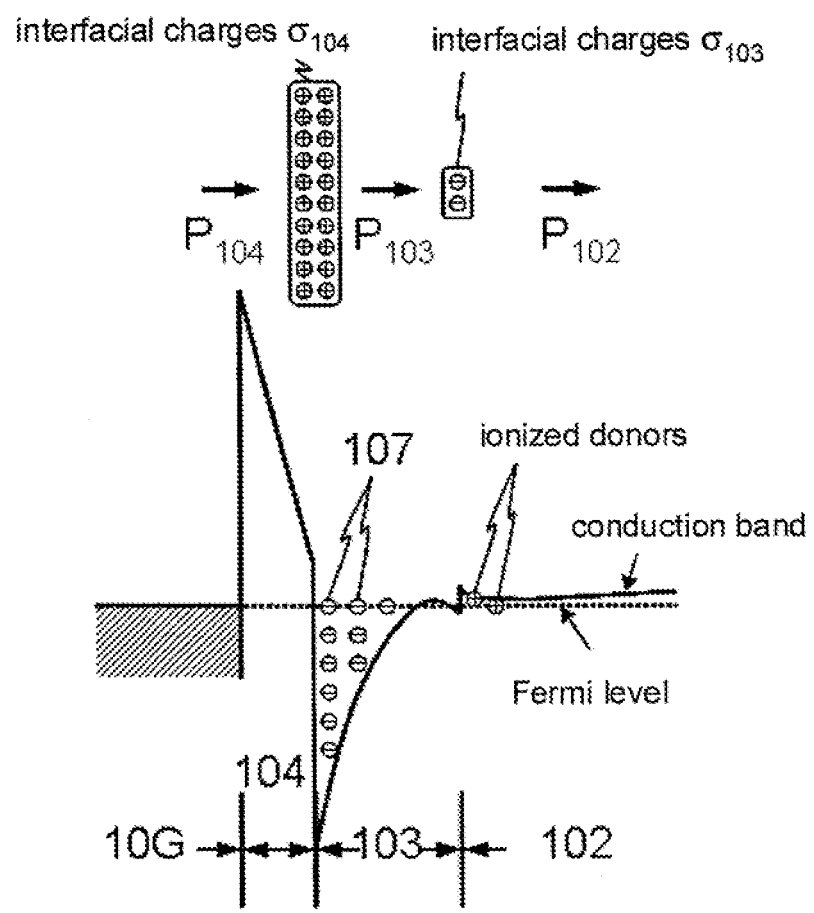
FIG. 11 is a drawing schematically illustrating band diagram of a conduction band for the region directly beneath a gate electrode 10G formed on the AlN insulating layer 104, in the structure of the conventional semiconductor device illustrated in FIG. 10.
Figure 12:
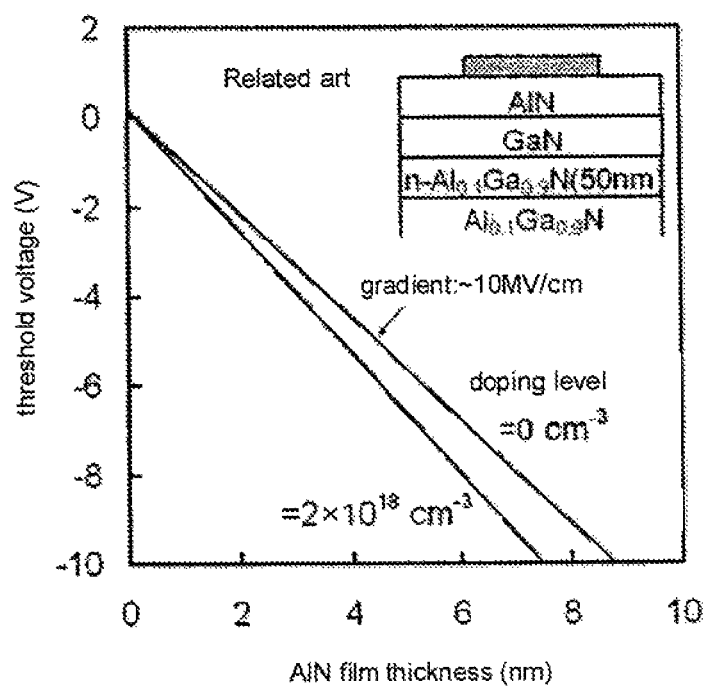
FIG. 12 is a graph showing dependency of a threshold voltage $V_T(V)$, which is corresponding to a gate voltage applied to a gate electrode to turn on the field effect transistor, on a film thickness of an AlN insulating film in the structure of the conventional semiconductor device illustrated in FIG. 10.
Figure 13:
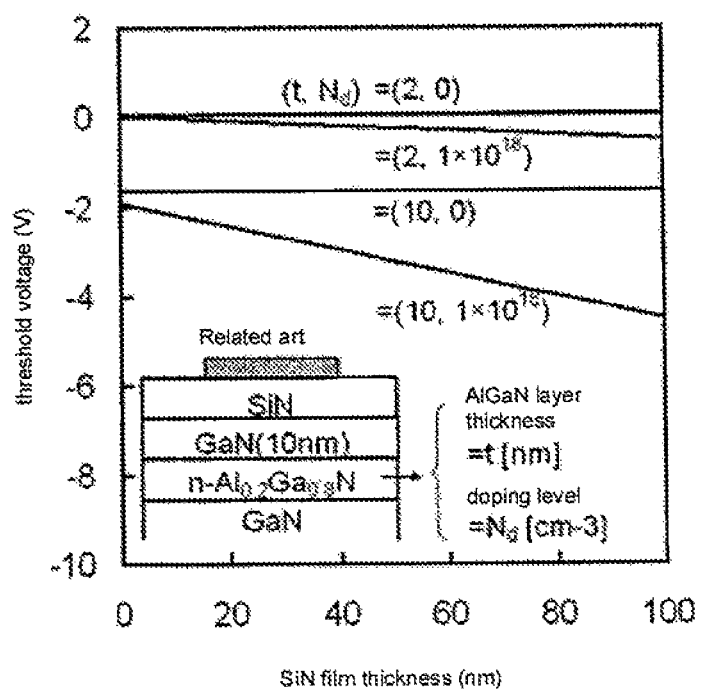
FIG. 13 is a graph showing dependency of a threshold voltage $V_T(V)$, which is corresponding to a gate voltage applied to a gate electrode to turn on the field effect transistor, on a film thickness of an SiN insulating film in a structure of a conventional semiconductor device which uses an AlGaN lower barrier layer formed on a GaN buffer layer.

Further, FIG. 9 schematically shows the band diagram of the conduction band in a region where the N-type $Al_{z5}Ga_{1-z5}$N contact layer 64 exists except the recessed portion, in the structure of the semiconductor device according to the third exemplary embodiment illustrated in FIG. 7.

The $Al_{x6}Ga_{1-x6}$N lower barrier layer 62 grown on the (0001) plane is lattice-relaxed by providing the AlGaN buffer layer with gradient composition 61 as its underlying layer. A lattice constant $a(Al_{x6}Ga_{1-x6}N)$ of $Al_{x6}Ga_{1-x6}$N of this lower barrier layer 62 is approximately expressed as $a(Al_{x6}Ga_{1-x6}N) \approx x_6 \cdot a(AlN)+(1-x_6) \cdot a(GaN)$ by using a lattice constant $a(AlN)$ of AlN and a lattice constant $a(GaN)$ of GaN.

On the one hand, for both of the GaN channel layer 63 and the $Al_{z6}Ga_{1-z6}$ contact layer 64 formed on the $Al_{x6}Ga_{1-x6}$N lower barrier layer 62, their lattice constants a become substantially identical with the lattice constant $a(Al_{x6}Ga_{1-x6}N)$ of $Al_{x6}Ga_{1-x6}$N of the lower barrier layer 62 because of their thin film thickness. That is, in the GaN channel layer 63, compressive strain arises in which the original lattice constant $a(GaN)$ changes to the lattice constant $a(Al_{x6}Ga_{1-x6}N)$. Also, because the Al composition $z_6$ of the $Al_{z6}Ga_{1-z6}$N contact layer 64 is equal to the Al composition $x_6$ of the $Al_{x6}Ga_{1-x6}$N lower barrier layer 62, lattice strain does not arise.

Because strain $e_{ZZ}$ due to lattice strain does not substantially exist in the $Al_{x6}Ga_{1-x6}$N lower barrier layer 62, piezo polarization: $P_{pe}(Al_{x6}Ga_{1-x6}N)$ does not arise. However, spontaneous polarization: $P_{sp}(Al_{x6}Ga_{1-x6}N)$ exists in the $Al_{x6}Ga_{1-x6}$N lower barrier layer 62. In the case of C-axis growth, the direction of this spontaneous polarization: $P_{sp}(Al_{x6}Ga_{1-x6}N)$ is oriented from the front surface toward the substrate. Accordingly, polarization $P_{62}$ present in the $Al_{x6}Ga_{1-x6}$N lower barrier layer 62 is generally the sum of the piezo polarization: $P_{pe}(Al_{x6}Ga_{1-x6}N)$ and the spontaneous polarization: $P_{sp}(Al_{x6}Ga_{1-x6}N)$, that is, $P_{62}=P_{sp}(Al_{x6}Ga_{1-x6}N)+P_{pe}(Al_{x6}Ga_{1-x6}N)$. In such a case, because of $P_{pe}(Al_{x6}Ga_{1-x6}N) \approx 0$, the polarization $P_{62}$ present in the $Al_{x6}Ga_{1-x6}$N lower barrier layer 62 is approximated by $P_{62} \approx P_{sp}(Al_{x6}Ga_{1-x6}N)$.

Similarly, because strain $e_{ZZ}$ due to lattice strain does not substantially exist in the $Al_{z6}Ga_{1-z6}$N contact layer 64, piezo polarization: $P_{pe}(Al_{z6}Ga_{1-z6}N)$ does not arise. In such a case, because of $P_{pe}(Al_{z6}Ga_{1-z6}N) \approx 0$, polarization $P_{64}$ present in the $Al_{z6}Ga_{1-z6}$N contact layer 64 is approximated by $P_{64} \approx P_{sp}(Al_{z6}Ga_{1-z6}N)$.

On the one hand, compressive strain $e_{ZZ}(GaN) \approx \{a(Al_{x6}Ga_{1-x6}N)-a(GaN)\}/a(GaN)$ exists in the GaN channel layer 63 arising from lattice strain, and piezo polarization: $P_{pe}(GaN)$ arises. This piezo polarization: $P_{pe}(GaN)$ is approximately expressed by $P_{pe}(GaN) \approx 2e_{ZZ}(GaN)[e_{31}(GaN)-e_{33}(GaN) \cdot \{C_{31}(GaN)/C_{33}(GaN)\}]$ by using piezoelectric constants $e_{31}(GaN)$ and $e_{33}(GaN)$, and elastic constants $C_{13}(GaN)$ and $C_{33}(GaN)$ of GaN. Further, spontaneous polarization: $P_{sp}(GaN)$ also exists. In the case of C-axis growth, the direction of the spontaneous polarization: $P_{sp}(GaN)$ is oriented from the front surface toward the substrate. The piezo polarization: $P_{pe}(GaN)$ arising from the compressive strain $e_{ZZ}$ has the direction in which the spontaneous polarization: $P_{sp}(GaN)$ is set off. Accordingly, polarization $P_{43}$ present in the GaN channel layer 53 is generally the sum of the piezo polarization: $P_{pe}(GaN)$ and the spontaneous polarization: $P_{sp}(GaN)$, that is, $P_{63}=P_{sp}(GaN)+P_{pe}(GaN)<P_{sp}(GaN)$.

The SiN insulating film 65 is a polycrystalline or amorphous film. Therefore, the SiN insulating film 65 does not exhibit anisotropy as a whole and create polarization. That is, polarization $P_{65}$ in the SiN insulating film 65 is $P_{65} 320$.

Polarization P exhibits discontinuous change from $P_{63}$ to $P_{62}$ in the interface between the GaN channel layer 63 and the $Al_{x6}Ga_{1-x6}$N lower barrier layer 62. Accordingly, in this interface, sheet-like polarization charges $\sigma_{63}$ arise. Interfacial charge density $\sigma_{63}/q$ produced in this interface is $\sigma_{63}/q=(P_{63}-P_{62})/q$, (where, q is the charge amount of electron (unit charge)).

Further, the polarization P exhibits discontinuous change from $P_{65}$ to $P_{63}$ also in the interface between the SiN insulating film 65 and the GaN channel layer 63. Accordingly, in this interface, sheet-like polarization charges $\sigma_{65}$ arise. Interfacial charge density $\sigma_{65}/q$ produced in this interface is $\sigma_{65}/q=(P_{65}-P_{63})/q$. On the one hand, in the interface between the SiN insulating film 65 and the GaN channel layer 63, an interface state is generated with a considerable sheet density. Therefore, the interfacial charges produced in this interface are compensated by such an interface state, and in the interface between the SiN insulating film 65 and the GaN channel layer 63, effective accumulation of the interfacial charges produced is not observed.

The polarization $P_{62}$ present in the $Al_{x6}Ga_{1-x6}$N lower barrier layer 62 and the polarization $P_{63}$ present in the GaN channel layer 63 depend on the Al composition $(x_6)$ of $Al_{x6}Ga_{1-x6}$N composing the lower barrier layer 62. For example, when $x_6=0.1$, computation provides $P_{62}/q=2.13 \times 10^{13}$ cm$^{-2}$ and $P_{63}/q=1.61 \times 10^{13}$ cm$^{-2}$. Also, when the Al composition of the $Al_{z6}Ga_{1-z6}$N contact layer 64 is equal to the Al composition $x_6$ of the $Al_{x6}Ga_{1-x6}$N lower barrier layer 62, that is, $z_6=x_6=0.1$, then computation provides $P_{64}/q=2.13 \times 10^{13}$ cm$^{-2}$.

In such a case, the interfacial charge density $\sigma_{65}/q$ produced in the interface between the GaN channel layer 63 and the $Al_{x6}Ga_{1-x6}$N lower barrier layer 62 is estimated as $\sigma_{63}/q=(P_{63}-P_{62})/q=-5.28 \times 10^{12}$ cm$^{-2}$. Also, the interfacial charge density $\sigma_{65}/q$ produced in the interface between the $Al_{z6}Ga_{1-z6}$N contact layer 54 and the GaN channel layer 53 is estimated as $\sigma_{64}/q=(P_{64}-P_{63})/q=+5.28 \times 10^{12}$ cm$^{-2}$.

A barrier (contact potential difference) is formed due to the band discontinuity $\Delta E_C(Al_{x6}Ga_{1-x6}N/GaN)$ in the hetero interface between the GaN channel layer 63 and the $Al_{x6}Ga_{1-x6}$N lower barrier layer 62. A barrier (contact potential difference) is formed due to the band discontinuity $\Delta E_C(Al_{z6}Ga_{1-z6}N/GaN)$ in the hetero interface between the N-type $Al_{z6}Ga_{1-z6}$N contact layer 64 and the GaN channel layer 63. In such a case, when the Al composition $(x_6)$ of $Al_{x6}Ga_{1-x6}$N composing the lower barrier layer 62 and the Al composition $(z_6)$ of $Al_{z6}Ga_{1-z6}$N composing the contact layer 64 are set at $z_6=x_6$, then $\Delta E_C(Al_{z6}Ga_{1-z6}N/GaN)=\Delta E_C(Al_{x6}Ga_{1-x6}N/GaN)$ is provided.

In such a case, as shown in FIG. 9, when $z_6=x_6=0.1$, then, in the region where the N-type $Al_{z5}Ga_{1-z5}$N contact layer 64 exists, the sum $(\sigma_{63}+\sigma_{64})$ of the interfacial charges $\sigma_{63}$ produced in the interface between the GaN channel layer 63 and the $Al_{x6}Ga_{1-x6}$N lower barrier layer 62, and the interfacial charges $\sigma_{64}$ produced in the interface between the $A_{z6}Ga_{1-z6}$N contact layer 54 and the GaN channel layer 53 is $(\sigma_{63}+\sigma_{64})=0$. In the case of $(\sigma_{63}+\sigma_{64})=0$, carriers due to polarization effect are not produced.

On the one hand, in the case of $\Delta E_C(Al_{x6}Ga_{1-x6}N/GaN)>2$ kT, a depleted region is formed in the N-type $Al_{x6}Ga_{1-x6}$N lower barrier layer 62 in the vicinity of the hetero interface with the GaN channel layer 63. Further, in the case of $\Delta E_C(Al_{z6}Ga_{1-z6}N/GaN)>2$ kT, a depleted region is formed in the N-type $Al_{z6}Ga_{1-z6}$N contact layer 64 in the vicinity of the hetero interface with the GaN channel layer 63. Carriers (electrons) are supplied from the N-type $Al_{x6}Ga_{1-x6}N$ lower barrier layer 62 and the N-type $Al_{z6}Ga_{1-z6}N$ contact layer 64 to the GaN channel layer 63 in association with the depleted regions being formed.

In such a case, density $N_{2d\text{-}gas, 6\text{-}1}$ of the two-dimensional electron gas 67 to be accumulated in the GaN channel layer 63 falls within the range $N_{2d\text{-}gas, 6\text{-}1} < (N_{SD64} \cdot t_{contact\ 6}) + (N_{SD64} \cdot t_{barrier\ 6})$.

Also in this exemplary embodiment, when undoped GaN is employed for the GaN channel layer 63, its concentration $N_{SD63}$ of the n-type impurity (donor) is ideally 0 cm$^{-3}$.

Referring to FIG. 3, in the case of $N_{SD53}=0$ cm$^{-3}$ and $x_6=0.1$, when the concentration $N_{SD62}$ of the shallow n-type impurity (donor) in the N-type $Al_{x6}Ga_{1-x6}N$ lower barrier layer 62 is set, for example, at $N_{SD62}=2 \times 10^{18}$ cm$^{-3}$ and the film thickness $t_{barrier\ 6}$ is set at 50 nm, then the threshold voltage $V_T$ becomes a negative voltage within the range where the film thickness $t_{SiN6}$ of the SiN insulating film 65 exceeds 3 nm. That is, within the range where the film thickness $t_{SiN6}$ of the SiN insulating film 65 exceeds 3 nm, carriers (electrons) stay in the GaN channel layer 63 when $V_{G6}$ is set at $V_{G6}=0$ V.

In that situation, the band diagram of the conduction band in the region directly beneath the gate electrode 6G in the thermal equilibrium state of $V_G=0$ V is as shown in FIG. 8. That is, the carriers (electrons) staying in the GaN channel layer 63 are accumulated in the vicinity of the interface between the GaN channel layer 63 and the $Al_{x6}Ga_{1-x6}N$ lower barrier layer 62.

For example, in the case of $N_{SD62}=2 \times 10^{18}$ cm$^{-3}$ and $N_{SD63}=0$ cm$^{-3}$, taking into consideration the band diagram of the conduction band in the region directly beneath the gate electrode 6G in the thermal equilibrium state of $V_G=0$ V, as the film thickness $t_{SiN6}$ of the SiN insulating film 65 is increased, change occurs as described below. For example, the conduction band energy $E_C(63)$ of the GaN channel layer 63 in the hetero interface between the GaN channel layer 63 and the $Al_{x6}Ga_{1-x6}N$ lower barrier layer 62 is energetically located higher than the Fermi level $E_f$ in the range where the film thickness $t_{SiN6}$ of the SiN insulating film 65 is equal to or less than 3 nm. In the range where the film thickness $t_{SiN6}$ of the SiN insulating film 65 exceeds 3 nm, the conduction band energy $E_C(63)$ of the GaN channel layer 63 in this hetero interface is energetically located lower than the Fermi level $E_f$. In such a manner, the difference $\{E_C(63)-E_f\}$ between the conduction band energy $E_C(63)$ of the GaN channel layer 63 and the Fermi level $E_f$ in this hetero interface depends on the film thickness $t_{SiN6}$ of the SiN insulating film 65.

At least in the range where the concentration $N_{SD62}$ of the shallow n-type impurity (donor) in the N-type $Al_{x6}Ga_{1-6x}N$ lower barrier layer 62 satisfies the condition $N_{SD62} \cdot t_{barrier\ 6} > \sigma_{63}|/q$, increasing the film thickness $t_{SiN6}$ of the SiN insulating film 65 can allow the threshold voltage $V_T$ to become a negative voltage. Therefore, a field effect transistor having the MIS-type gate structure that satisfies this condition is at the "normally ON state". Accordingly, in the range where the condition described above is met, a field effect transistor of the depletion mode type can be fabricated.

Referring to the result of FIG. 3, for example, when the concentration $N_{SD62}$ of the shallow n-type impurity (donor) in the N-type $Al_{x5}Ga_{1-x5}N$ lower barrier layer 62 is set at $N_{SD62}=2 \times 10^{18}$ cm$^{-3}$, and the film thickness $t_{barrier\ 6}$ is set at $t_{barrier\ 6}=50$ nm, then the amount of change $\Delta V_T$ of the threshold voltage $V_T$ is as relatively small as about 0.12 V when the film thickness $t_{SiN6}$ of the SiN insulating film 65 varies by 1 nm. Accordingly, uniformity and reproducibility of the threshold voltage $V_T$ are good against change in the film thickness $t_{SiN6}$ of the SiN insulating film 65.

The contact potential difference $\{e_\chi(SiN)-c\phi(Ti)\}$eV due to the difference between the electron affinity $e_\chi(SiN)$ eV of the SiN film composing the insulating film 65 and the work function $c\phi(Ti)$ eV of Ti of the gate electrode 5G in contact with this SiN film is as large as about 2.9 eV. Accordingly, when a gate having the MIS structure of Ti/SiN/GaN is employed, a barrier height $\Phi_{barrier}$ of schottky junction (MIS junction) is increased higher than that of schottky junction of usual MES-type. Accordingly, in the field effect transistor having the MIS-type gate structure illustrated in FIG. 7, forward gate breakdown voltage is also good when the schottky junction (MIS junction) of gate is forward biased.

The small dependency of the threshold voltage $V_T$ on the film thickness of the insulating film shown in FIG. 3 when undoped GaN is employed for the GaN channel layer 53 and $N_{SD53}=0$ cm$^{-3}$ means that an internal electric field applied to the insulating film 55 is small when the schottky junction (MIS junction) of gate is reverse biased. Accordingly, a tunnel current component is suppressed at the reverse bias, and a reverse leakage current is also decreased.

In the semiconductor device according to the third exemplary embodiment, when a field effect transistor of the depletion mode type is constructed, electrons are accumulated in the interface of the channel layer 63 with the contact layer 64 and the interface of the channel layer 63 with the lower barrier layer 62, and the two-dimensional electron gas 67 is present. Accordingly, access resistance between the source and the gate, and between the gate and the drain is decreased. Of course, because of the ohmic electrodes formed on the N-type $Al_{z6}Ga_{1-z6}N$ contact layer 64, contact resistance of the drain electrode 6D and the source electrode 6S is also lowered. Parasitic resistance is largely improved because of these contributions.

Note that in the third exemplary embodiment, the Al composition ($z_6$) of the N-type $Al_{z6}Ga_{1-z6}N$ contact layer 64 is set equal to the Al composition ($x_6$) of the N-type $Al_{x6}Ga_{1-x6}N$ lower barrier layer 62 in the specific example described above. Of course, even if $z_6$ set larger than $x_6$, electrons are accumulated in the GaN channel layer 63 in the vicinity of the interface with the N-type $Al_{z6}Ga_{1-z6}N$ contact layer 64 and the interface with the N-type $Al_{x5}Ga_{1-x5}N$ lower barrier layer 62, producing the two-dimensional electron gas 67. In the case of $z_6 > x_6$, because the sum $(\sigma_{63}+\sigma_{64})$ of the interfacial charges arising from polarization effect becomes positive, the two-dimensional electron gas 67 is produced even if the concentration $N_{SD64}$ of the shallow n-type impurity (donor) in the N-type $Al_{z6}Ga_{1-z6}N$ contact layer 64 is lowered. In such a case, the density $N_{2d\text{-}gas\ 6\text{-}1}$ of the two-dimensional electron gas 67 to be accumulated falls within the range of $(\sigma_{63}+\sigma_{64})/q < N_{2d\text{-}gas\ 6\text{-}1} < (N_{SD64} \cdot t_{contact\ 6})+(N_{SD62} \cdot t_{barrier\ 6})+(\sigma_{63}+\sigma_{64})/q$.

Further, $z_6$ may be also set smaller than $x_6$ in the range where a barrier is formed that is necessary to accumulate the two-dimensional electron gas in the interface between the N-type $Al_{z6}Ga_{1-z6}N$ contact layer 64 and the GaN channel layer 63. If $z_6$ is set at $z_6 < x_6$, the amount of carriers (electrons) supplied from the N-type $Al_{x6}Ga_{1-x6}N$ lower barrier layer 62 and the N-type $Al_{z5}Ga_{1-z5}N$ contact layer 54 to the GaN channel layer 53 has to be set larger than $|\sigma_{63}+\sigma_{64}|$ because the sum $(\sigma_{63}+\sigma_{64})$ of the interfacial charges arising from polarization effect becomes negative. In such a case, the density $N_{2d\text{-}gas\ 6\text{-}1}$ of the two-dimensional electron gas 57 to be accumulated falls within the range of $N_{2d\text{-}gas\ 6\text{-}1} < (N_{SD64} \cdot t_{contact\ 6})+(N_{SD62} \cdot t_{barrier\ 6})+(\sigma_{63}+\sigma_{64})/q < (N_{SD64} \cdot t_{contact\ 6})+(N_{SD62} \cdot t_{barrier\ 6})$.

The principle of the present invention has been described above with reference to representative exemplary embodiments as an example, but the present invention is not limited only to the representative exemplary embodiments described above, and obviously includes various modes according to the principle of the present invention.

That is, in the exemplary embodiments described above, the principle of the present invention has been explained by using the typical example employing the laminated structure of $Al_zGa_{1-z}N$ contact layer/$In_yGa_{1-y}N$ channel layer/$Al_xGa_{1-x}N$ lower barrier layer.

When a semiconductor device is constructed in which the principle is applied to the present invention, $Al_xGa_{1-x}N$ is used as the material for forming the lower barrier layer in the exemplary embodiments described above, but another group III nitride-based semiconductor may be used. As the material for forming the lower barrier layer, for example, GaN, InGaN, InAlN and InAlGaN may be used. Further, the lower barrier layer may be a superlattice layer whose average composition corresponds to InGaN, AlGaN, InAlN and InAlGaN.

When a semiconductor device is constructed in which the principle is applied to the present invention, $In_yGa_{1-y}N$, particularly GaN, is used as the material for forming the channel layer in the exemplary embodiments described above, but another group III nitride-based semiconductor having a band gap smaller than the lower barrier layer may be used. As the material for forming the channel layer, for example, InN, InGaN, AlGaN, InAlN and InAlGaN may be used. Further, the channel layer may be a superlattice layer whose average composition corresponds to InGaN, AlGaN, InAlN and InAlGaN. The channel layer is undoped in the exemplary embodiment, but any part or the whole of the channel layer may be doped with an n-type impurity such as Si and the like.

When a semiconductor device is constructed in which the principle of the present invention is applied, $Al_zGa_{1-z}N$ is used as the material for forming the contact layer in the exemplary embodiments described above, but another group III nitride-based semiconductor having a band gap larger than the channel layer may be used. As the material for forming the contact layer, for example, GaN, InGaN, InAlN and InAlGaN may be used. Further, the contact layer may be a superlattice layer whose average composition corresponds to InGaN, AlGaN, InAlN and InAlGaN.

When a semiconductor device is constructed in which the principle of the present invention is applied, the structure has been employed in which the $Al_zGa_{1-z}N$ contact layer or the $Al_xGa_{1-x}N$ lower barrier layer is brought into contact with the GaN channel layer when the $Al_zGa_{1-z}N$ contact layer or the $Al_xGa_{1-x}N$ lower barrier layer is doped with the shallow n-type impurity (donor) to be formed as N-type AlGaN. A structure may be employed in which an undoped AlGaN spacer layer is inserted between the GaN channel layer and N-type AlGaN in the interface where the $Al_zGa_{1-z}N$ contact layer or the $Al_xGa_{1-x}N$ lower barrier layer is in contact with the GaN channel layer.

When a semiconductor device is constructed in which the principle of the present invention is applied, $Si_3N_4$ is used as the insulating material for forming the insulating film in the exemplary embodiments described above, but another insulating material may be used. As the insulating material for forming the insulating film, for example, $SiO_2$, $Si_{1-x-y}O_xN_y$, $Ga_2O_3$, aluminum oxide ($Al_2O_3$), zinc oxide (ZnO), magnesium oxide (MgO) and hafnium oxide ($HfO_2$) may be used. Alternatively, the insulating film may be made of a laminated film composed of a plurality of insulators selected from the group consisting of $Si_3N_4$, $SiO_2$, SiON, $Ga_2O_3$, $Al_2O_3$, ZnO, MgO and $HfO_2$.

Although, so far the present invention has been described with reference to exemplary embodiments (and examples thereof), the present invention will not be limited to the above described exemplary embodiments (and examples thereof). The constitutions and details of the present invention are subject to various modifications which can be understood by those skilled in the art, within the scope of the present invention.

INDUSTRIAL APPLICABILITY

The semiconductor device according to the present invention can be applied to production of the group III nitride-based field effect transistor, among a great variety of the group III nitride-based semiconductor devices, that has superior uniformity and reproducibility of the threshold voltage while maintaining a low gate leakage current and high electron mobility, and is also capable of operation in enhancement mode.

The invention claimed is:

1. A semiconductor device using a group III nitride-based semiconductor,
wherein
the semiconductor device comprises a double heterostructure which is constructed by sequentially laminating an $Al_xGa_{1-x}N$ lower barrier layer composed of lattice-relaxed $Al_xGa_{1-x}N$ (0<x<1), an $In_yGa_{1-y}N$ channel layer composed of $In_yGa_{1-y}N$ (0≤y≤1) with compressive strain and an $Al_zGa_{1-z}N$ contact layer composed of $Al_zGa_{1-z}N$ (0<z≤1),
wherein
the composition of the $Al_xGa_{1-x}N$ lower barrier layer is constant,
an Al composition (z) of the $Al_zGa_{1-z}N$ contact layer is selected in the range of 0.05≤z≤0.5,
the semiconductor device comprises a buffer layer made of $Al_uGa_{1-u}N$ (0≤u≤1), in which an Al composition (u) is matched to an Al composition (x) of the $Al_xGa_{1-x}N$ lower barrier layer at the interface with the $Al_xGa_{1-x}N$ lower barrier layer,
the Al composition (z) of the $Al_zGa_{1-z}N$ contact layer is larger than the Al composition (x) of the $Al_xGa_{1-x}N$ lower barrier layer (z>x),
a two-dimensional electron gas is produced in the vicinity of an interface of the $In_yGa_{1-y}N$ channel layer with the $Al_zGa_{1-z}N$ contact layer,
at least two ohmic electrodes are formed as a source electrode and a drain electrode on the $Al_zGa_{1-z}N$ contact layer,
a gate electrode is provided in a region located between the source electrode and the drain electrode, and thereby, the semiconductor device comprises a structure composed of the gate electrode, the source electrode and the drain electrode, which constitute a field effect transistor,
a recessed portion is provided in a region located between the source electrode and the drain electrode by removing a part of said $Al_zGa_{1-z}N$ contact layer by etching it away until said $In_yGa_{1-y}N$ channel layer is exposed,
said gate electrode is formed so as to be embedded in the recessed portion with intervention of an insulating film that is formed in the shape of single layer made of a polycrystalline or amorphous insulating substance, or in the shape of multiple layers, each layer of which is made of a polycrystalline or amorphous insulating substance, and
the semiconductor device is a metal-insulator-semiconductor (MIS)-type field effect transistor, in which electrons are accumulated in a channel region at the interface between the insulating film and the $In_yGa_{1-y}N$ channel layer at the ON state of the MIS-type field effect transistor.

2. The semiconductor device according to claim 1, wherein
said insulating film is a single layer film made of a polycrystalline or amorphous insulating material, which is selected from the group consisting of $Si_3N_4$, $SiO_2$, SiON, $Al_2O_3$, $Ga_2O_3$, ZnO, MgO and $HfO_2$, or a multilayer film comprising a laminated structure that is composed of a plurality of layers, each layer of which is made of a polycrystalline or amorphous insulating material selected from the group consisting of $Si_3N_4$, $SiO_2$, SiON, $Al_2O_3$, $Ga_2O_3$, ZnO, MgO and $HfO_2$.

3. The semiconductor device according to claim 1, wherein
said $Al_xGa_{1-x}N$ lower barrier layer is doped with a shallow n-type impurity, and
when said gate electrode, said source electrode and said drain electrode are set at an equal potential, then a two-dimensional electron gas is produced in the vicinity of an interface between said $In_yGa_{1-y}N$ channel layer and said $Al_xGa_{1-x}N$ lower barrier layer.

4. The semiconductor device according to claim 1, wherein
the Al composition (z) of said $Al_zGa_{1-z}N$ contact layer and the Al composition (x) of said $Al_xGa_{1-x}N$ lower barrier layer are selected so that a difference (z−x) between them satisfies the condition (z−x)>0.02.

5. The semiconductor device according to claim 1, wherein
said $Al_zGa_{1-z}N$ contact layer is doped with a shallow n-type impurity.

6. The semiconductor device according to claim 1, wherein
said $In_yGa_{1-y}N$ channel layer is made of $In_yGa_{1-y}N$ (0≤y≤1) which is undoped, or doped with a shallow n-type impurity.

7. The semiconductor device according to claim 1, wherein
each of said $Al_xGa_{1-x}N$ lower barrier layer, said $In_yGa_{1-y}N$ channel layer and said $Al_zGa_{1-z}N$ contact layer is an epitaxial film grown by C-axis growth.

8. The semiconductor device according to claim 1, wherein
band discontinuity ΔEc ($Al_zGa_{1-z}N/In_yGa_{1-y}N$) due to a conduction band energy difference between said $Al_zGa_{1-z}N$ and said $In_yGa_{1-y}N$ at a heterojunction interface between said $Al_zGa_{1-z}N$ contact layer and said $In_yGa_{1-y}N$ channel layer is selected within the range of equal to or larger than 50 meV.

9. The semiconductor device according to claim 1, wherein
band discontinuity ΔEc ($Al_xGa_{1-x}N/In_yGa_{1-y}N$) due to a conduction band energy difference between said $Al_xGa_{1-x}N$ and said $In_yGa_{1-y}N$ at a heterojunction interface between said $Al_xGa_{1-x}N$ lower barrier layer and said $In_yGa_{1-y}N$ channel layer is selected within the range of equal to or larger than 50 meV.

10. The semiconductor device according to claim 1, wherein
said $Al_xGa_{1-x}N$ lower barrier layer is formed on the buffer layer made of $Al_uGa_{1-u}N$ (0<u≤1) grown by C-axis growth, which is formed on a substrate.

11. The semiconductor device according to claim 1, wherein
a film thickness of said insulating film is selected within the range of 5 nm-500 nm.

12. The semiconductor device according to claim 1, wherein
said $Al_xGa_{1-x}N$ lower barrier layer is doped with a shallow n-type impurity at sheet density Nd,
negative polarization charges due to spontaneous polarization effect and piezo polarization effect are produced at sheet density Np at the interface between said $Al_xGa_{1-x}N$ lower barrier layer and said $In_yGa_{1-y}N$ channel layer, and
said sheet density Nd and said sheet density Np satisfy the following relational equation therebetween; Nd≤Np.

* * * * *